United States Patent
Seok et al.

(10) Patent No.: US 10,593,816 B2
(45) Date of Patent: Mar. 17, 2020

(54) METHOD FOR MANUFACTURING DEVICE COMPRISING INORGANIC/ORGANIC HYBRID PEROVSKITE COMPOUND FILM AND DEVICE COMPRISING INORGANIC/ORGANIC HYBRID PEROVSKITE COMPOUND FILM

(71) Applicant: Korea Research Institute of Chemical Technology, Daejeon (KR)

(72) Inventors: Sang-Il Seok, Daejeon (KR); Jun Hong Noh, Daejeon (KR); Jang Won Seo, Seoul (KR); Nam Joong Jeon, Gwangju (KR); Young Chan Kim, Daejeon (KR)

(73) Assignee: KOREA RESEARCH INSTITUTE OF CHEMICAL TECHNOLOGY, Daejeon (KR)

(*) Notice: Subject to any disclaimer, the term of this patent is extended or adjusted under 35 U.S.C. 154(b) by 154 days.

(21) Appl. No.: 15/541,797

(22) PCT Filed: Jan. 8, 2016

(86) PCT No.: PCT/KR2016/000176
§ 371 (c)(1),
(2) Date: Oct. 23, 2017

(87) PCT Pub. No.: WO2016/111576
PCT Pub. Date: Jul. 14, 2016

(65) Prior Publication Data
US 2018/0248052 A1   Aug. 30, 2018

(30) Foreign Application Priority Data

Jan. 8, 2015   (KR) ........................ 10-2015-0002536
Jan. 8, 2016   (KR) ........................ 10-2016-0002501

(51) Int. Cl.
*H01L 31/0264*   (2006.01)
*H01L 31/0224*   (2006.01)
(Continued)

(52) U.S. Cl.
CPC .. *H01L 31/0264* (2013.01); *H01L 31/022425* (2013.01); *H01L 31/04* (2013.01);
(Continued)

(58) Field of Classification Search
CPC .................................................. H01L 31/0264
See application file for complete search history.

(56) References Cited

U.S. PATENT DOCUMENTS

| 6,344,662 B1 * | 2/2002 | Dimitrakopoulos ........................ H01L 21/2007 257/40 |
| 6,395,194 B1 * | 5/2002 | Russell .................... C09G 1/02 252/79.1 |

(Continued)

FOREIGN PATENT DOCUMENTS

| JP | 2014-049596 A | 3/2014 |
| JP | 2014-056921 A | 3/2014 |

(Continued)

OTHER PUBLICATIONS

International Search Report dated May 26, 2016; PCT/KR2016/000176.

(Continued)

*Primary Examiner* — William A Harriston
(74) *Attorney, Agent, or Firm* — Ladas & Parry LLP

(57) ABSTRACT

A method for manufacturing a device comprising an inorganic/organic hybrid perovskite compound film, according to the present invention, comprises the steps of: a) laminating a first structure and a second structure to allow the first surface layer and the second surface layer to be in contact with each other, the first structure comprising a first surface layer containing at least one of materials i) to v) below, the second structure comprising a second surface layer containing, independently from the first surface layer, at least one of materials i) to v) below; and b) applying heat and physical
(Continued)

force to the laminate in which the first structure and the second structure are laminated: i) an inorganic/organic hybrid perovskite compound, ii) an organic halide, iii) a metal halide, iv) an inorganic/organic hybrid perovskite compound precursor, and v) a metal halide precursor.

20 Claims, 5 Drawing Sheets

(51) Int. Cl.
| | |
|---|---|
| *H01L 31/04* | (2014.01) |
| *H01L 31/18* | (2006.01) |
| *H01L 51/00* | (2006.01) |
| *H01L 51/42* | (2006.01) |
| *H01L 31/0256* | (2006.01) |

(52) U.S. Cl.
CPC .......... *H01L 31/18* (2013.01); *H01L 51/0003* (2013.01); *H01L 51/0024* (2013.01); *H01L 51/422* (2013.01); *H01L 2031/0344* (2013.01); *Y02E 10/549* (2013.01)

(56) References Cited

U.S. PATENT DOCUMENTS

| | | | | |
|---|---|---|---|---|
| 6,534,031 | B2* | 3/2003 | Bedard | B01J 39/10 |
| | | | | 423/593.1 |
| 8,716,165 | B2* | 5/2014 | Addiego | B01D 53/864 |
| | | | | 502/104 |
| 8,821,961 | B2* | 9/2014 | Bondoux | H01L 21/316 |
| | | | | 257/632 |
| 9,592,541 | B2* | 3/2017 | Bruck | B08B 7/0014 |
| 9,627,576 | B2* | 4/2017 | Guha | H01L 31/0322 |
| 9,793,056 | B1* | 10/2017 | Bag | H01G 9/2013 |
| 2012/0126216 | A1* | 5/2012 | DeHaven | H01L 51/0002 |
| | | | | 257/40 |
| 2016/0289554 | A1* | 10/2016 | Dohner | C09K 11/08 |
| 2016/0293872 | A1* | 10/2016 | Ko | H01L 51/4226 |
| 2017/0098514 | A1* | 4/2017 | Geohegan | H01L 51/0028 |

FOREIGN PATENT DOCUMENTS

| | | |
|---|---|---|
| KR | 20140007045 A | 1/2014 |
| KR | 20140035284 A | 3/2014 |
| KR | 20140035285 A | 3/2014 |
| KR | 20140035286 A | 3/2014 |
| KR | 20140091488 A | 7/2014 |
| WO | 2014/020499 A1 | 2/2014 |
| WO | 2014/097299 A1 | 6/2014 |

OTHER PUBLICATIONS

Chang-Wen Chen, et al; "Optical properties of organometal halide perovskite thin films and general device structure design rules for perovskite single and tandem solar cells", Journal of Materials Chemistry A; May 7, 2015; vol. 3, Issue 17, pp. 9152-9159.
The Extended European Search Report dated Aug. 1, 2018; Appln. No. 16735197.2.

* cited by examiner

METHOD FOR MANUFACTURING DEVICE COMPRISING INORGANIC/ORGANIC HYBRID PEROVSKITE COMPOUND FILM AND DEVICE COMPRISING INORGANIC/ORGANIC HYBRID PEROVSKITE COMPOUND FILM

TECHNICAL FIELD

The present invention relates to a method for manufacturing an inorganic/organic hybrid perovskite compound film, and a method for manufacturing a device including an inorganic/organic hybrid perovskite compound film. More specifically, the present invention relates to an inorganic/organic hybrid perovskite compound film capable of rapidly manufacturing a high-quality inorganic/organic hybrid perovskite compound film by a simple low-temperature process to thereby be suitable for mass production and large-area production, and a method for manufacturing a device including the same.

BACKGROUND ART

The inorganic/organic hybrid perovskite compound, which is referred to as an organic metal halide perovskite compound, is a material represented by Chemical Formula of $AMX_3$ including an organic cation (A), a metal cation (M), and a halogen anion (X), and having a perovskite structure. In detail, the inorganic/organic hybrid perovskite compound represented by Chemical Formula of $AMX_3$ has a form in which the organic cation (A) is positioned in the middle of a three-dimensional network including corner-shared $MX_6$ octahedron. The inorganic/organic hybrid perovskite compound has very low material cost, is capable of performing a low-temperature process and a low-cost solution process, and is excellent in commercialization, and thus, it has been actively studied in various fields such as light emitting devices, memory devices, sensors, photovoltaic devices, etc.

As described above, the inorganic/organic hybrid perovskite compound is self-assembled and crystallized, which is advantageous in a low-temperature solution process. However, due to fast crystallization and difficulty in controlling self-assembly properties, it is difficult to actually manufacture a thin film having a dense and flat surface.

The present applicant has proposed a novel solar cell having a remarkably high power generation efficiency through Korean Patent Laid-Open Publication No. 10-2014-0035284, and further has proposed a method for manufacturing an inorganic/organic hybrid perovskite compound film having a flat surface by using a solution coating method.

However, in order to commercialize an inorganic/organic hybrid perovskite compound-based device, it is required to develop a simple and easily controllable manufacturing process technology in which a high-quality dense film is manufactured, a large-area process is possibly performed, reproducibility is high, and the use of a volatile organic solvent is minimized.

The present applicant developed a technology of manufacturing a high-quality inorganic/organic hybrid perovskite compound film which has high density, is formed of coarse crystal grains, and is suitable for practical commercialization with a low-cost, quick, and simple process, and filed the present invention.

DISCLOSURE

Technical Problem

An object of the present invention is to provide a high-quality inorganic/organic hybrid perovskite compound film by a low-cost, fast and simple process, and a method for manufacturing an inorganic/organic hybrid perovskite compound film having excellent reproducibility and process stability and being suitable for large-area treatment.

Another object of the present invention is to provide a method for manufacturing a device including the inorganic/organic hybrid perovskite compound film.

Still another object of the present invention is to provide a binding method for binding two structures via the inorganic/organic hybrid perovskite compound film.

Still another object of the present invention is to provide a method for manufacturing a solar cell including an inorganic/organic hybrid perovskite compound as a light absorber.

Still another object of the present invention is to provide a laminate for manufacturing a solar cell which manufactures a solar cell including an inorganic/organic hybrid perovskite compound as a light absorber.

Still another object of the present invention is to provide a solar cell including an inorganic/organic hybrid perovskite compound as a light absorber.

Technical Solution

In one general aspect, a method for manufacturing a device including an inorganic/organic hybrid perovskite compound film includes: a) stacking a first structure including a first surface layer containing at least one of materials i) to v) below, and a second structure including a second surface layer containing, independently from the first surface layer, at least one of the materials i) to v) below so that the first surface layer and the second surface layer are in contact with each other, and b) applying heat and physical force to a laminate in which the first structure and the second structure are stacked, i) an inorganic/organic hybrid perovskite compound,
ii) an organic halide,
iii) a metal halide,
iv) an inorganic/organic hybrid perovskite compound precursor, and
v) a metal halide precursor.

The first surface layer and the second surface layer may be converted into a single inorganic/organic hybrid perovskite compound film by applying heat and physical force in b).

A pair of the material contained in the first surface layer and the material contained in the second surface layer may be one of 1) to 5) below:

1) inorganic/organic hybrid perovskite compound-inorganic/organic hybrid perovskite compound,
2) inorganic/organic hybrid perovskite compound-inorganic/organic hybrid perovskite compound precursor,
3) inorganic/organic hybrid perovskite compound precursor-inorganic/organic hybrid perovskite compound precursor,
4) metal halide precursor-organic halide, and
5) metal halide-organic halide.

The first surface layer and the second surface layer may be each independently formed of a coating film on which a particulate of at least one of the materials i) to v) is coated, a porous film of at least one of the materials i) to v), a dense film of at least one of the materials i) to v), or a combination thereof.

The first surface layer and the second surface layer may be each independently a single layer containing at least one of the materials i) to v), a single layer containing at least two of the materials i) to v), or a stacked layer in which at least two of the materials i) to v) are layered and stacked, respectively.

The first surface layer and the second surface layer may be patterned in a shape that the first surface layer and the second surface layer correspond to each other.

The first surface layer and the second surface layer may be each independently formed by printing, coating or vapor deposition.

The first surface layer and the second surface layer may be each independently formed by using a solution in which at least one of the materials i) and v) is dissolved or slurry or an ink in which at least one of the materials i) and v) is dispersed.

At least one surface layer of the first surface layer and the second surface layer may contain i) the inorganic/organic hybrid perovskite compound, and the surface layer containing i) the inorganic/organic hybrid perovskite compound may be manufactured by heat treatment of a layer of iv) the inorganic/organic hybrid perovskite compound precursor or a stacked layer in which v) the metal halide precursor and ii) the organic halide are stacked.

The i) inorganic/organic hybrid perovskite compound may satisfy Chemical Formula 1, 2 or 3 below:

$$AMX_3 \qquad \text{(Chemical Formula 1)}$$

in Chemical Formula 1, A is a monovalent cation, A is an organic ammonium ion, an amidinium group ion or an organic ammonium ion and an amidinium group ion, M is a divalent metal ion, and X is a halogen ion, $$A(M_{1-a}N_a)X_3 \qquad \text{(Chemical Formula 2)}$$

in Chemical Formula 2, A is a monovalent cation, A is an organic ammonium ion, an amidinium group ion or an organic ammonium ion and an amidinium group ion, M is a divalent metal ion, N is at least one doping metal ion selected from a monovalent metal ion and a trivalent metal ion, a is a real number of 0<a≤0.1, and X is a halogen ion, $$A(N^1_{1-b}N^2_b)X_3 \qquad \text{(Chemical Formula 3)}$$

in Chemical Formula 3, A is a monovalent cation, A is an organic ammonium ion, an amidinium group ion or an organic ammonium ion and an amidinium group ion, $N^1$ is a monovalent metal ion, $N^2$ is a trivalent metal ion, b is a real number of 0.4≤b≤0.6, and X is a halogen ion.

In Chemical Formula 1, 2 or 3, A may be $A^a_{(1-x)}A^b_x$, $A^a$ is an amidinium group ion, $A^b$ may be an organic ammonium ion, and x may be a real number of 0.3 to 0.05.

In Chemical Formula 1, 2 or 3, X may include two different halogen ions.

In Chemical Formula 1, 2 or 3, X may be $X^a_{(1-y)}X^b_y$, $X^a$ may be iodine ion, $X^b$ may be bromine ion, and y may be a real number of 0.05 to 0.3.

The iv) organic halide may satisfy Chemical Formula 4 below:

$$AX \qquad \text{(Chemical Formula 4)}$$

in Chemical Formula 4, A is a monovalent cation, A is an organic ammonium ion, an amidinium group ion or an organic ammonium ion and an amidinium group ion, and X is a halogen ion.

The v) metal halide may satisfy Chemical Formula 5, Chemical Formula 6 or Chemical Formula 7 below:

$$MX_2 \qquad \text{(Chemical Formula 5)}$$

in Chemical Formula 5, M is a divalent metal ion, and X is a halogen ion, $$(M_{1-a}N_a)X_2 \qquad \text{(Chemical Formula 6)}$$

in Chemical Formula 6, M is a divalent metal ion, N is at least one doping metal ion selected from a monovalent metal ion and a trivalent metal ion, a is a real number of 0<a≤0.1, and X is a halogen ion, $$(N^1_{1-b}N^2_b)X_2 \qquad \text{(Chemical Formula 7)}$$

in Chemical Formula 7, $N^1$ is a monovalent metal ion, $N^2$ is a trivalent metal ion, b is a real number of 0.4≤b≤0.6, and X is a halogen ion.

The physical force may include a compressive force.

The applying of heat and physical force in b) may be performed by hot pressing.

The hot pressing may be performed at a temperature of 50 to 250° C. and a pressure of 1 to 100 MPa.

The hot pressing may be performed in a vacuum or normal pressure atmosphere.

The first structure may further include a first substrate and a first electrode positioned on the first substrate.

The second structure may further include a second substrate and a second electrode positioned on the second substrate.

The first structure may further include an electron transport structure positioned on the first electrode.

The electron transport structure may be an organic material or an inorganic material.

The electron transport structure may have a dense film structure or a porous film structure.

The second structure may further include a hole transport structure positioned on the second electrode.

The hole transport structure may be an organic material or an inorganic material.

The hole transport structure may have a dense film structure or a porous film structure.

The first substrate and the second substrate may be flexible substrates.

At least one of the first substrate and the second substrate may be a transparent substrate, and at least one of the first electrode and the second electrode may be a transparent electrode.

At least one of the first substrate and the second substrate may be transparent substrates, respectively, and the first electrode and the second electrode may be transparent electrodes, respectively.

The first structure may further include a first substrate that is a transparent substrate, a first electrode that is a transparent electrode positioned on the first substrate, and a charge transport structure, and the second structure may further include a second electrode, an inorganic light absorbing layer that is positioned on the second electrode and absorbs light of 800 nm or more to generate electrons and holes, and a bonding layer.

The inorganic light absorbing layer may be a Group 4 semiconductor, a Group 3-5 semiconductor, a Group 2-6 semiconductor, a Group 4-6 semiconductor, or a metal chalcogen compound semiconductor.

The device may be a light emitting device, a memory device, a photovoltaic device, or a thermoelectric device.

In another general aspect, the present invention provides a device manufactured by the method for manufacturing a device including an inorganic/organic hybrid perovskite compound as described above.

The present invention provides a light emitting device manufactured by the manufacturing method as described above, a memory device manufactured by the manufacturing method as described above, a photovoltaic device (solar cell) manufactured by the manufacturing method as described above, and a thermoelectric device manufactured by the manufacturing method as described above.

The present invention includes a binding method for binding at least two structures.

The binding method according to the present invention includes a) stacking a first structure including a first surface layer containing at least one of materials i) to v) below, and a second structure including a second surface layer containing, independently from the first surface layer, at least one of the materials i) to v) below so that the first surface layer and the second surface layer are in contact with each other, and b) applying heat and physical force to a laminate in which the first structure and the second structure are stacked, thereby binding the first structure and the second structure,
  i) an inorganic/organic hybrid perovskite compound,
  ii) an organic halide,
  iii) a metal halide,
  iv) an inorganic/organic hybrid perovskite compound precursor, and
  v) a metal halide precursor.

The present invention provides a method for manufacturing an inorganic/organic hybrid perovskite compound film.

In another general aspect, a method for manufacturing an inorganic/organic hybrid perovskite compound film includes: a) stacking a first structure including a first surface layer containing at least one of materials i) to v) below, and a second structure including a second surface layer containing, independently from the first surface layer, at least one of the materials i) to v) below so that the first surface layer and the second surface layer are in contact with each other, and b) applying heat and physical force to a laminate in which the first structure and the second structure are stacked,
  i) an inorganic/organic hybrid perovskite compound,
  ii) an organic halide,
  iii) a metal halide,
  iv) an inorganic/organic hybrid perovskite compound precursor, and
  v) a metal halide precursor.

The present invention provides a laminate for manufacturing a solar cell in which the solar cell is formed by combination. In detail, the present invention includes a laminate for manufacturing a solar cell in which the solar cell is formed by integral bonding using heat and physical force.

In another general aspect, a laminate for manufacturing a solar cell includes: a first structure including a first substrate, a first electrode positioned on the first substrate, an electron transport structure positioned on the first electrode, and a first surface layer containing at least one of materials i) to v) below, and a second structure including a second substrate, a second electrode positioned on the second substrate, a second surface layer containing, independently from the first surface layer, at least one of the materials i) to v) below, wherein the laminate is a laminate in which the first structure and the second structure are stacked so that the first surface layer of the first structure and the second surface layer of the second structure are in contact with each other,
  i) an inorganic/organic hybrid perovskite compound,
  ii) an organic halide,
  iii) a metal halide,
  iv) an inorganic/organic hybrid perovskite compound precursor, and
  v) a metal halide precursor.

The second structure may further include a hole transport structure positioned on the second electrode.

The laminate for manufacturing a solar cell according to an exemplary embodiment of the present invention may be a laminate for manufacturing a solar cell having a tandem structure.

In another general aspect, a laminate for manufacturing a solar cell having a tandem structure includes: a first structure including a first substrate which is a transparent substrate, a first electrode which is a transparent electrode positioned on the first substrate, a charge transport structure positioned on the first electrode, and a first surface layer containing at least one of materials i) to v) below, and a second structure including a second electrode, an inorganic light absorbing layer that is positioned on the second electrode and absorbs light of 800 nm or more to generate electrons and holes, a bonding layer positioned on the inorganic light absorbing layer, and a second surface layer containing, independently from the first surface layer, at least one of the materials i) to v) below, wherein the laminate is a laminate in which the first structure and the second structure are stacked so that the first surface layer of the first structure and the second surface layer of the second structure are in contact with each other,
  i) an inorganic/organic hybrid perovskite compound,
  ii) an organic halide,
  iii) a metal halide,
  iv) an inorganic/organic hybrid perovskite compound precursor, and
  v) a metal halide precursor.

In the laminate for manufacturing a solar cell having a tandem structure according to an exemplary embodiment of the present invention, the inorganic light absorbing layer of the second structure may include a semiconductor substrate in which an emitter layer and a back surface field (BSF) layer forming a back electric field are formed, the second electrode may be electrically connected to the BSF layer of the semiconductor substrate, the bonding layer may be positioned on the emitter layer, and the second structure may further include a second charge transport structure positioned on the bonding layer.

In the laminate for manufacturing a solar cell having a tandem structure according to an exemplary embodiment of the present invention, the inorganic light absorbing layer of the second structure may include a metal chalcogen compound, the second structure may further include a second substrate, a buffer layer positioned on the inorganic light absorbing layer, and a second charge transport structure, and the second substrate, the second electrode, the inorganic light absorbing layer, the buffer layer, the bonding layer, the second charge transport structure, and the second surface layer may be sequentially formed.

The present invention provides a solar cell in which the first surface layer and the second surface layer of the above-described laminate for manufacturing a solar cell (including the laminate for manufacturing a solar cell having a tandem structure) are converted to a single inorganic/organic hybrid perovskite compound layer, and the first structure and the second structure are bonded to each other.

In another general aspect, a solar cell includes: a first substrate and a second substrate facing each other, a first electrode, a first charge transport structure, an inorganic/organic hybrid perovskite compound layer, a second charge transport structure, and a second electrode sequentially stacked between the first substrate and the second substrate.

At least one of the first charge transport structure and the second charge transport structure may be a porous charge transport structure, and the inorganic/organic hybrid perovskite compound layer may fill pores of the porous charge transport structure and cover the porous charge transport structure.

Both the first charge transport structure and the second charge transport structure may be a porous charge transport structure, and the inorganic/organic hybrid perovskite compound layer may fill all of the pores of the first charge transport structure and pores of the second charge transport structure, and may be intercalated between the first charge transport structure and the second charge transport structure.

The first substrate and the second substrate may be transparent substrates, respectively, and the first electrode and the second electrode may be transparent electrodes, respectively.

In the solar cell according to an exemplary embodiment of the present invention, the first electrode may be directly in contact with and bonded to the first substrate, and the second electrode may be directly in contact with and bonded to the second substrate.

The present invention includes a solar cell having a four-terminal tandem structure.

The solar cell having a four-terminal tandem structure according to an exemplary embodiment of the present invention includes an inorganic/organic hybrid perovskite compound-based solar cell including a first substrate and a second substrate which are two transparent substrates facing each other, and a first electrode which is a transparent electrode, a first charge transport structure, an inorganic/organic hybrid perovskite compound layer, a second charge transport structure, and a second electrode which is a transparent electrode sequentially stacked between the first substrate and the second substrate, and an inorganic light absorber-based solar cell that absorbs light of 800 nm or more to generate electrons and holes, wherein the inorganic/organic hybrid perovskite compound-based solar cell is positioned on a light receiving side, and an inorganic light absorber-based solar cell receives light through the inorganic/organic hybrid perovskite compound-based solar cell.

Advantageous Effects

According to the method for manufacturing a device according to an exemplary embodiment of the present invention, it is possible to manufacture a device including a high-quality inorganic/organic hybrid perovskite compound film which is dense and has excellent crystallinity and a coarse crystal grain size.

Further, the method for manufacturing a device of an exemplary embodiment of the present invention is advantageous in that it is a low-cost, quick, and simple process, a large-area process is possibly performed, and a continuous process is performed, which is a commercial method capable of mass-producing a high-quality device at a low-cost.

Further, according to the method for manufacturing a device of an exemplary embodiment of the present invention, process factors affecting film quality of the inorganic/organic hybrid perovskite compound film are simply heat and physical forces (pressure). That is, a film quality of the inorganic/organic hybrid perovskite compound film is controlled by heat and physical forces (pressure), which are excessively simple and easily controllable two process factors, and thus, the device is capable of being manufactured with excellent reproducibility and reliability.

Further, according to the method for manufacturing a device of an exemplary embodiment of the present invention, a high-quality dense inorganic/organic hybrid perovskite compound film is manufactured by a low-temperature process at a very low temperature, and thus, other components configuring the device (for example, a flexible substrate such as a polyethylene terephthalate substrate, an organic material such as an organic hole transport structure, or the like.) are free from thermal damage. According to these advantages, the method for manufacturing a device according to an exemplary embodiment of the present invention may be very suitable for manufacturing the flexible device.

Further, the method for manufacturing a device of an exemplary embodiment of the present invention is a more environmentally friendly process since it is possible to eliminate or minimize the use of a volatile organic solvent in order to manufacture a high-quality dense film-shaped inorganic/organic hybrid perovskite compound film.

Further, according to the method for manufacturing a device of an exemplary embodiment of the present invention, since the inorganic/organic hybrid perovskite compound film provided in the device is protected from external environment (for example, moisture) by the first substrate of the first structure and the second substrate of the second structure, lifespan, stability, and durability of the device may be improved to a commercial level without a separate encapsulation material capping process.

In addition, a transparent device including a transparent solar cell is able to be manufactured by a simple method of adopting transparent substrates and transparent electrodes as the substrates and the electrodes of the first structure and the second structure.

In addition, the method for manufacturing a device according to an exemplary embodiment of the present invention may have excellent commerciality since it is possible to manufacture a high-quality dense film from a low-quality surface layer such as a coating film on which grains of the inorganic/organic hybrid perovskite compound are simply coated. That is, the method for manufacturing a device according to an exemplary embodiment of the present invention is able to manufacture a high-quality dense film having a high density of large crystal grains by using a low-density film having a very rough surface, a coating film in which particulates are dispersed, or a porous film.

In addition, the method for manufacturing a device according to an exemplary embodiment of the present invention is able to implement a high-quality dense film patterned by a simple method of patterning and printing an ink or slurry containing grains of the inorganic/organic hybrid perovskite compound. Accordingly, a degree of freedom of device design is remarkably increased, and it is possible to implement a device having a highly patterned design by a very simple process including patterned printing-stacking-application of heat and physical forces.

Further, according to the method for manufacturing a device of an exemplary embodiment of the present invention, it is possible to hybridize one device and another device based on an action of the inorganic/organic hybrid perovskite compound film by a simple design change of a lower component of the surface layer of the first structure or the second structure.

In detail, when a solar cell is manufactured according to an exemplary embodiment of the present invention, transparent electrodes may be used as both the first electrode and the second electrode to be capable of manufacturing a semi-transparent or a selective wavelength-transmittable solar cell, which is easily usable for BIPV (building integrated photovoltaics), silicon solar cells, thin-film solar cells, and solar cells having a 4-terminal tandem structure.

Further, by forming a structure of a quaternary semiconductor solar cell including silicon or a chalcogen compound-based solar cell structure such as CIGS in the first structure or the second structure, it is possible to easily manufacture a solar cell having a 2-terminal tandem structure, etc.

The method for manufacturing an inorganic/organic hybrid perovskite compound film according to an exemplary embodiment of the present invention is advantageous in that it is a low-cost, quick, and simple process, a large-area process may be performed, and a continuous process may be performed, and thus, it is possible to manufacture a high-quality inorganic/organic hybrid perovskite compound film which is dense and has excellent crystallinity and a coarse crystal grain size from a low-quality surface layer.

A binding method according to an exemplary embodiment of the present invention is advantageous in that two structures to be bonded are physically integrated and firmly bonded with each other via the high-quality inorganic/organic hybrid perovskite compound film by a simple method of applying heat and physical force.

A laminate for manufacturing a solar cell according to an exemplary embodiment of the present invention is advantageous in that a solar cell including a high-quality light absorbing layer is manufactured by a simple method of applying heat and pressure to a laminate in which the first structure and the second structure are stacked.

BEST MODE

Figure 1:
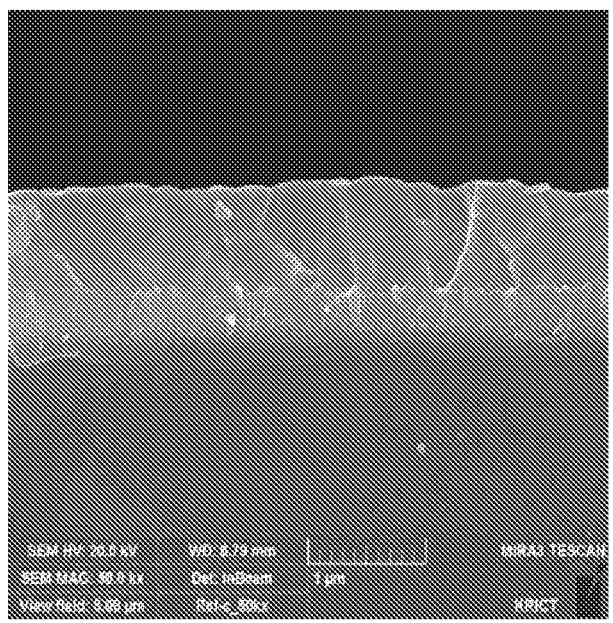
FIG. 1 is a scanning electron microscope (SEM) image of a cross section of a surface layer in Example 1.

Hereinafter, the present invention will be described in detail with reference to the accompanying drawings. The drawings to be described below are provided by way of example so that the idea of the present invention can be sufficiently transferred to those skilled in the art to which the present invention pertains. Therefore, the present invention may be implemented in many different forms, without being limited to the drawings to be described below. The drawings below may be exaggerated in order to specify the spirit of the present invention. Here, unless technical and scientific terms used herein are defined otherwise, they have meanings generally understood by those skilled in the art to which the present invention pertains. Description of known functions and components that may obscure the gist of the present invention will be omitted from the following description and the accompanying drawings.

The present invention provides a method for manufacturing a device including an inorganic/organic hybrid perovskite compound (hereinafter, referred to as a perovskite compound) film. In addition, the present invention also provides a method for manufacturing a solar cell which is a typical example of a device including the perovskite compound film. Further, the present invention provides a method for manufacturing a perovskite compound film. Further, the present invention provides a binding method between two structures via the perovskite compound film. In addition, the present invention provides a laminate for manufacturing a solar cell capable of manufacturing a solar cell including a perovskite compound film as a light absorbing layer.

The manufacturing method provided by the present invention may be specified into a manufacturing method of a desired device when other well-known basic components required for operation of the desired device itself other than the perovskite compound film are previously formed in the first structure and the second structure.

The manufacturing method provided by the present invention may be specified into the method for manufacturing a perovskite compound film by converting the surface layer to a high-quality dense perovskite compound film regardless of the structure or material type of the components configuring the first structure and the second structure other than the surface layer.

In the manufacturing method provided by the present invention, the first surface layer of the first structure and the second surface layer of the second structure are converted to a single and integral perovskite compound film, and since the first structure and the second structure are integrally bonded, the method may be specified into a method of binding the first structure and the second structure via the perovskite compound film.

Further, the present invention provides a device component capable of manufacturing a device including the perovskite compound film. The device component of the present invention is characterized in that other known basic components required for operation of the device itself are previously formed in the first structure and the second structure, and the device component is a laminate in which the first structure and the second structure are stacked so that a surface layer of the first structure and a surface layer of the second structure are in contact with each other. Even though the present invention is not limited to the type of device, the present invention provides a component (laminate) for manufacturing a solar cell, which is a typical example of the device including a perovskite compound film.

Specifically, the present invention provides a method for manufacturing a device including an inorganic/organic hybrid perovskite compound film.

The method for manufacturing a device including an inorganic/organic hybrid perovskite compound film according to the present invention includes: a) stacking a first structure including a first surface layer containing at least one of materials i) to v) below, and a second structure including a second surface layer containing, independently from the first surface layer, at least one of the materials i) to v) below so that the first surface layer and the second surface layer are in contact with each other, and b) applying heat and physical force to a laminate in which the first structure and the second structure are stacked, i) an inorganic/organic hybrid perovskite compound,
   ii) an organic halide,
   iii) a metal halide,
   iv) an inorganic/organic hybrid perovskite compound precursor, and
   v) a metal halide precursor.

Specifically, the present invention provides a method for manufacturing a solar cell including an inorganic/organic hybrid perovskite compound film as a light absorbing layer.

The method for manufacturing a solar cell according to the present invention includes: a) stacking a first structure including a first surface layer containing at least one of materials i) to v) below, and a second structure including a second surface layer containing, independently from the first surface layer, at least one of the materials i) to v) below so that the first surface layer and the second surface layer are in contact with each other, and b) applying heat and physical force to a laminate in which the first structure and the second structure are stacked.

Specifically, the present invention provides a method for manufacturing an inorganic/organic hybrid perovskite compound film.

The method for manufacturing an inorganic/organic hybrid perovskite compound film according to the present invention includes a) stacking a first structure including a first surface layer containing at least one of materials i) to v) below, and a second structure including a second surface layer containing, independently from the first surface layer, at least one of the materials i) to v) below so that the first surface layer and the second surface layer are in contact with each other, and b) applying heat and physical force to a laminate in which the first structure and the second structure are stacked, i) an inorganic/organic hybrid perovskite compound,
   ii) an organic halide,
   iii) a metal halide,
   iv) an inorganic/organic hybrid perovskite compound precursor, and
   v) a metal halide precursor.

Specifically, the present invention provides a method for binding two structures via the inorganic/organic hybrid perovskite compound film.

The binding method according to the present invention includes a) stacking a first structure including a first surface layer containing at least one of materials i) to v) below, and a second structure including a second surface layer containing, independently from the first surface layer, at least one of the materials i) to v) below so that the first surface layer and the second surface layer are in contact with each other, and b) applying heat and physical force to a laminate in which the first structure and the second structure are stacked, i) an inorganic/organic hybrid perovskite compound,
   ii) an organic halide,
   iii) a metal halide,
   iv) an inorganic/organic hybrid perovskite compound precursor, and
   v) a metal halide precursor.

In the method for manufacturing a device, the method for manufacturing a solar cell, the method for manufacturing a perovskite compound film and/or the binding method as described above, the first surface layer and the second surface layer may be converted to the single inorganic/organic hybrid perovskite compound film by applying heat and physical force in b).

Here, the conversion to the single inorganic/organic hybrid perovskite compound film means that the interface (contact surface) between the first surface layer and the second surface layer disappears in the laminate due to the application of heat and physical force. In detail, 'the conversion to the single inorganic/organic hybrid perovskite compound film' may mean that in a grain micro-structure of the inorganic/organic hybrid perovskite compound configuring a film (converted film), a region where the interface (contact surface) between the first surface layer and the second surface layer existed and the other region have the same grain micro-structure, and thus, a region where the interface between the first surface layer and the second surface layer existed is not substantially distinguished. More specifically, 'the conversion to the single inorganic/organic hybrid perovskite compound film' may mean that the grain micro-structure of the inorganic/organic hybrid perovskite compound forming the film has a homogeneous structure in a thickness direction of the film.

In another aspect, 'the conversion to the single inorganic/organic hybrid perovskite compound film' may mean that the first surface layer and the second surface layer of the laminate are at least densified, and the first surface layer and the second surface layer are bonded to each other, thereby manufacturing a single dense film. In another aspect, 'the conversion to the single inorganic/organic hybrid perovskite compound film' may mean that densification and grain growth are performed in the first surface layer and the second surface layer of the laminate, and the single dense film is manufactured from the first surface layer and the second surface layer. In addition, 'the conversion to the single inorganic/organic hybrid perovskite compound film' may mean that densification, and nucleation of the crystal (including recrystallization) and growth are performed, and the single dense film is manufactured from the first surface layer and the second surface layer.

The method for manufacturing a device, the method for manufacturing a solar cell, the method for manufacturing an inorganic/organic hybrid perovskite compound film, the binding method and/or detailed configuration of the component for manufacturing a device (laminate) and the solar cell described above are described in detail. In describing the detailed configuration, unless specifically defined and described as an embodiment according to the present invention including the 'binding method' or the 'laminate for manufacturing a solar cell', the 'manufacturing method', etc., the above description is entirely applicable to all embodiments provided by the present invention. For clearer explanation, when it is entirely applicable to all embodiments provided in the present invention, the present invention is described assuming 'an exemplary embodiment according to the present invention' or described without any particular limitation. When describing a configuration more suitable for a specific exemplary embodiment, the present invention is described assuming 'an exemplary embodiment according to one embodiment of the present invention'.

The i) inorganic/organic hybrid perovskite compound, ii) the organic halide, iii) the metal halide, iv) the inorganic/organic hybrid perovskite compound precursor, and v) the metal halide precursor that are each independently contained in the first surface layer or the second surface layer, are described below.

The i) inorganic/organic hybrid perovskite compound contained in the surface layer (first surface layer or second surface layer) may mean a compound containing an organic cation (A), a metal cation (M), and a halogen anion (X), and having a perovskite structure.

M is positioned at the center of a unit cell in the perovskite structure, X is positioned at the center of each surface of the unit cell to form an octahedron structure around M, and A may be positioned at each corner of the unit cell. In other words, the organic cation (A) may be positioned in the middle of a three-dimensional network including corner-shared $MX_6$ octahedron.

In the following description, i) the inorganic/organic hybrid perovskite compound contained in the surface layer is collectively referred to as a perovskite compound.

The perovskite compound may satisfy Chemical Formula 1, 2 or 3 below:

$$AMX_3 \quad \text{(Chemical Formula 1)}$$

In Chemical Formula 1, A is a monovalent cation, A is an organic ammonium ion, an amidinium group ion or an organic ammonium ion and an amidinium group ion, M is a divalent metal ion, and X is a halogen ion. Here, the halogen ion may be one or two or more selected from $I^-$, $Br^-$, $F^-$, and $Cl^-$.

$$A(M_{1-a}N_a)X_3 \quad \text{(Chemical Formula 2)}$$

in Chemical Formula 2, A is a monovalent cation, A is an organic ammonium ion, an amidinium group ion or an organic ammonium ion and an amidinium group ion, M is a divalent metal ion, N is at least one doping metal ion selected from a monovalent metal ion and a trivalent metal ion, a is a real number of $0<a\leq 0.1$, and X is a halogen ion, Here, the halogen ion may be one or two or more selected from $I^-$, $Br^-$, $F^-$, and $Cl^-$.

In Chemical Formula 2, the monovalent metal ion which is a doping metal ion includes an alkali metal ion. The alkali metal ion may be one or two or more selected from $Li^+$, $Na^+$, $K^+$, $Rb^+$, and $Cs^+$ ions.

In Chemical Formula 2, the trivalent metal ion which is a doping metal ion may be one or two or more selected from $Al^{3+}$, $Ga^{3+}$, $In^{3+}$, $Tl^{3+}$, $Sc^{3+}$, $Y^{3+}$, $La^{3+}$, $Ce^{3+}$, $Fe^{3+}$, $Ru^{3+}$, $Cr^{3+}$, $V^{3+}$, and $Ti^{3+}$ ions.

At the time of doping with the monovalent metal ion and/or the trivalent metal ion as shown in Chemical Formula 2, electrical properties of the perovskite compound may be controlled to n-type or p-type. Specifically, the perovskite compound may have a p-type by doping with the monovalent metal ion. In addition, the perovskite compound may have an n-type by doping with the trivalent metal ion. That is, the monovalent metal ion is similar to a case where an acceptor is doped in conventional silicon semiconductors, and the trivalent metal ion is similar to a case where a donor is doped in conventional silicon semiconductors. Here, both the monovalent metal ion and the trivalent metal ion may be used for doping, and entire electrical properties of the perovskite compound may be controlled by metal ions that are contained in a larger amount.

$$A(N^1_{1-b}N^2_b)X_3 \quad \text{(Chemical Formula 3)}$$

in Chemical Formula 3, A is a monovalent cation, A is an organic ammonium ion, an amidinium group ion or an organic ammonium ion and an amidinium group ion, $N^1$ is a monovalent metal ion, $N^2$ is a trivalent metal ion, b is a real number of $0.4\leq b\leq 0.6$, and X is a halogen ion.

In Chemical Formula 3, the monovalent metal ion includes an alkali metal ion. The alkali metal ion may be one or two or more selected from $Li^+$, $Na^+$, $K^+$, $Rb^+$, and $Cs^+$ ions.

In Chemical Formula 3, the trivalent metal ion may be one or two or more selected from $Al^{3+}$, $Ga^{3+}$, $In^{3+}$, $Tl^{3+}$, $Sc^{3+}$, $Y^{3+}$, $La^{3+}$, $Ce^{3+}$, $Fe^{3+}$, $Ru^{3+}$, $Cr^{3+}$, $V^{3+}$, and $Ti^{3+}$ ions.

Chemical Formula 3 may mean that the divalent metal ion (M) of Chemical Formula 1 is replaced with a monovalent metal ion and a trivalent metal ion.

Here, similar to the above-described Chemical Formula 2, by adjusting a relative element ratio of the monovalent metal ion and the trivalent metal ion to the range of $0.4\leq b\leq 0.6$, electrical properties of the perovskite compound according to Chemical Formula 3 may be controlled to n-type, intrinsic or p-type.

In Chemical Formula 1, 2 or 3, the organic ammonium ion may satisfy Chemical Formulas 4 to 5 below:

$$R_1-NH_3^+ \quad \text{(Chemical Formula 4)}$$

in Chemical Formula 4, $R_1$ is C1-C24 alkyl, C3-C20 cycloalkyl or C6-C20 aryl, $$R_2-C_3H_3N_2^+-R_3 \quad \text{(Chemical Formula 5)}$$

in Chemical Formula 5, $R_2$ is C1-C24 alkyl, C3-C20 cycloalkyl or C6-C20 aryl, and $R_3$ is hydrogen or C1-C24 alkyl.

In Chemical Formula 1, 2 or 3, the amidinium group ion may satisfy Chemical Formula 6 below:

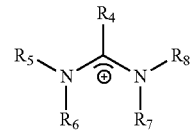

(Formula 6)

in Chemical Formula 6, $R_4$ to $R_8$ are each independently hydrogen, C1-C24 alkyl, C3-C20 cycloalkyl or C6-C20 aryl.

In Chemical Formula 1, 2 or 3, A may be an organic ammonium ion, an amidinium group ion or an organic ammonium ion and an amidinium group ion. When both the organic ammonium ion and the amidinium group ion are contained, charge mobility of the perovskite compound may be remarkably improved.

In the case where A contains both the organic ammonium ion and the amidinium group ion, when the total number of moles of the monovalent organic cation is 1, A may contain 0.7 to 0.95 mol of the amidinium group ion and 0.3 to 0.05 mol of the organic ammonium ion. That is, in Chemical Formula 1, 2 or 3, A may be $A^a_{(1-x)}A^b_x$, wherein $A^a$ may be an amidinium group ion, $A^b$ may be an organic ammonium ion, and x may be a real number of 0.3 to 0.05. A molar ratio of the amidinium group ions to the organic ammonium ions, that is, a molar ratio of 0.7 to 0.95 mol of the amidinium group ions to 0.3 to 0.05 mol of the organic ammonium ions is a range at which it is possible to absorb light in a very wide wavelength band and to perform faster migration and separation of excitons, and faster migration of photoelectrons and photoholes.

$R_1$ in Chemical Formula 4, $R_2$ to $R_3$ in Chemical Formula 5 and/or $R_4$ to $R_8$ in Chemical Formula 6 may be appropriately selected depending on the use of the perovskite compound.

In detail, a size of the unit cell of the perovskite compound affects a bandgap of the perovskite compound. Accordingly, in consideration of the use of the perovskite compound film such as a light emitting layer, a semiconductor layer, a light absorbing layer, and a charge storing layer, $R_1$ in Chemical Formula 4, $R_2$ to $R_3$ in Chemical Formula 5 and/or $R_4$ to $R_8$ in Chemical Formula 6 may be suitably controlled so that the intended use has a suitable bandgap, which is well known to those skilled in the art relating to the semiconductor device or the light device.

As a specific example, it is possible to have a band gap energy of 1.5 to 1.1 eV suitable for being used for a solar cell that absorbs sunlight in a small unit cell size. Accordingly, when considering a band gap energy of 1.5 to 1.1 eV suitable for being used as the solar cell, in Chemical Formula 4, $R_1$ may be C1-C24 alkyl, specifically C1-C7 alkyl, and more specifically, methyl. Further, in Chemical Formula 5, $R_2$ may be C1-C24 alkyl, $R_3$ may be hydrogen or C1-C24 alkyl, specifically, $R_2$ may be C1-C7 alkyl, $R_3$ may be hydrogen or C1-C7 alkyl, and more specifically, $R_2$ may be methyl, and $R_3$ may be hydrogen. Further, in Chemical Formula 6, $R_4$ to $R_8$ may be each independently hydrogen, amino or C1-C24 alkyl, specifically, hydrogen, amino or C1-C7 alkyl, and more specifically, hydrogen, amino or methyl, and more specifically, $R_4$ may be hydrogen, amino or methyl and $R_5$ to $R_8$ may be hydrogen. As a specific and non-limiting example, the amidinium group ion may include formamidinium ion ($NH_2CH=NH_2^+$), acetamidinium ion ($NH_2C(CH_3)=NH_2^+$), guamidinium ion ($NH_2C(NH_2)=NH_2^+$), or the like.

As described above, a specific example of the organic cation (A) is an example considering the use of the perovskite compound film, that is, the use as the light absorbing layer of sunlight. $R_1$ in Chemical Formula 4, $R_2$ to $R_3$ in Chemical Formula 5 and $R_4$ to $R_8$ in Chemical Formula 6 may be appropriately selected in consideration of a design of a wavelength band of light to be absorbed, a design of emission wavelength band when used as a light emitting layer of a light emitting device, an energy band gap and threshold voltage when used as a semiconductor device of a transistor, etc.

In Chemical Formula 1 or 2, M may be a divalent metal ion. As a specific example, M may be one or two or more metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$.

In Chemical Formula 1, 2 or 3, X is a halogen anion. Here, the halogen anion may be one or two or more selected from $I^-$, $Br^-$, $F^-$, and $Cl^-$. Specifically, the halogen anion may include one or more ions selected from iodine ion ($I^-$), chlorine ion ($Cl^-$), and bromine ion ($Br^-$). More specifically, the halogen anion may contain an iodine ion and a bromine ion. When the halogen anion contains both iodine ions and bromine ions, crystallinity and moisture resistance of the perovskite compound may be improved.

As a specific example, in Chemical Formula 1, 2 or 3, X may be $X^a_{(1-y)}X^b_y$, $X^a$ and $X^b$ may be different halogen ions [mutually different halogen ions selected from iodine ion ($I^-$), chlorine ion ($Cl^-$) and bromine ion ($Br^-$)], and y may be a real number of $0<y<1$. More specifically, in Chemical Formula 1, X may be $X^a_{(1-y)}X^b_y$, $X^a$ may be an iodine ion, $X^b$ may be bromine ion, and y may be a real number of $0.05≤y≤0.3$, and specifically, $0.1≤y≤0.15$. That is, in the case where the halogen anion contains both iodine ion and bromine ion in order to significantly prevent deterioration due to moisture, and to have excellent crystallinity even at a low temperature process of 100° C. or less, when the total number of moles of the anion is 1, 0.7 to 0.95 mol of iodine ions and 0.3 to 0.05 mol of bromine ions may be contained.

As a specific and non-limiting example of the perovskite compound in which M is $Pb^{2+}$ based on the above-description, the perovskite compound may be $CH_3NH_3PbI_xCl_y$ (x is a real number of $0≤x≤3$, y is a real number of $0≤y≤3$, and x+y=3), $CH_3NH_3PbI_xBr_y$ (x is a real number of $0≤x≤3$, y is a real number of $0≤y≤3$, and x+y=3), $CH_3NH_3PbCl_xBr_y$ (x is a real number of $0≤x≤3$, y is a real number of $0≤y≤3$, and x+y=3), $CH_3NH_3PbI_xF_y$ (x is a real number of $0≤x≤3$, y is a real number of $0≤y≤3$, and x+y=3), $NH_2CH=NH_2PbI_xCl_y$ (x is a real number of $0≤x≤3$, y is a real number of $0≤y≤3$, and x+y=3), $NH_2CH=NH_2PbI_xBr_y$ (x is a real number of $0≤x≤3$, y is a real number of $0≤y≤3$, and x+y=3), $NH_2CH=NH_2PbCl_xBr_y$ (x is a real number of $0≤x≤3$, y is a real number of $0≤y≤3$, and x+y=3), $NH_2CH=NH_2PbI_xF_y$ (x is a real number of $0≤x≤3$, y is a real number of $0≤y≤3$, and x+y=3), $NH_2CH=NH_{2(1-x)}CH_3NH_{3x}Pb(I_{(1-y)}Br_y)_3$ (x is a real number of $0<x<1$, and y is a real number of $0<y<1$), $NH_2CH=NH_{2(1-x)}CH_3NH_{3x}Pb(I_{(1-y)}Br_y)_3$ (x is a real number of $0.05≤x≤0.3$, and y is a real number of $0.05≤y≤0.3$), $NH_2CH=CH_{2(1-x)}CH_3NH_3Pb(I_{(1-x)}Br_x)_3$ (x is a real number of $0.05≤x≤0.3$), $NH_2C(CH_3)=NH_2PbI_xCl_y$ (x is a real number of $0≤x≤3$, y is a real number of $0≤y≤3$, and x+y=3), $NH_2C(CH_3)=NH_2PbI_xBr_y$ (x is a real number of $0≤x≤3$, y is a real number of $0≤y≤3$, and x+y=3), $NH_2C(CH_3)=NH_2PbCl_xBr_y$ (x is a real number of $0≤x≤3$, y is a real number of $0≤y≤3$, and x+y=3), $NH_2C(CH_3)=NH_2PbI_xF_y$ (x is a real number of $0≤x≤3$, y is a real number of $0≤y≤3$, and x+y=3), $NH_2C(CH_3)=NH_{2(1-x)}CH_3NH_{3x}Pb(I_{(1-y)}Br_y)_3$ (x is a real number of $0<x<1$, and y is a real number of $0<y<1$), $NH_2C(CH_3)=NH_{2(1-x)}CH_3NH_{3x}Pb(I_{(1-y)}Br_y)_3$ (x is a real number of $0.05≤x≤0.3$, and y is a real number of $0.05≤y≤0.3$), $NH_2C(CH_3)=CH_{2(1-x)}CH_3NH_{3x}Pb(I_{(1-x)}Br_x)_3$ (x is a real number of $0.05≤x≤0.3$), $NH_2C(NH_2)=NH_2PbI_xCl_y$ (x is a real number of $0≤x≤3$, y is a real number of $0≤y≤3$, and x+y=3), $NH_2C(NH_2)=NH_2PbI_xBr_y$ (x is a real number of $0≤x≤3$, y is a real number of $0≤y≤3$, and x+y=3), $NH_2C(NH_2)=NH_2PbCl_xBr_y$ (x is a real number of $0≤x≤3$, y is a real number of $0≤y≤3$, and x+y=3), $NH_2C(NH_2)=NH_2PbI_xF_y$ (x is a real number of $0≤x≤3$, y is a real number of $0≤y≤3$, and x+y=3), $NH_2C(NH_2)=NH_{2(1-x)}CH_3NH_{3x}Pb(I_{(1-y)}Br_y)_3$ (x is a real number of $0<x<1$, and y is a real number of $0<y<1$), $NH_2C(NH_2)=NH_{2(1-x)}CH_3NH_{3x}Pb(I_{(1-y)}Br_y)_3$ (x is a real number of $0.05≤x≤0.3$, and y is a real number of $0.05≤y≤0.3$) or $NH_2C(NH_2)=CH_{2(1-x)}CH_3NH_{3x}Pb(I_{(1-x)}Br_x)_3$ (x is a real number of $0.05≤x≤0.3$).

In the following description, the inorganic/organic hybrid perovskite compound precursor contained in the surface layer is collectively referred to as a perovskite compound precursor. Regarding the inorganic/organic hybrid perovskite compound precursor, all of the contents of International Patent PCT-KR2014-012727 of the present applicant may be used for reference, and the present invention includes the contents described in International Patent PCT-KR2014-012727.

In detail, the iv) perovskite compound precursor contained in the surface layer (the first surface layer or the second surface layer) is a precursor of the above-described perovskite compound, and may include a monovalent organic cation (A), a metal cation (M), a halogen anion (X), and a guest molecule (GM). Further, in X-ray diffraction measurement using Cu-Kα line (measurement using θ-2θ method) on the perovskite compound precursor, diffraction peaks may be detected when diffraction angles 2Θ are 6.2 to 6.8°, 7 to 7.5°, and 8.9 to 9.5°.

The perovskite compound precursor may be an adduct formed by combining GM with a perovskite compound containing an organic cation (A), a metal cation (M), and a halogen anion (X). In the crystal structure, the perovskite compound precursor may be amorphous, crystalline, or a substance in which amorphous and crystalline are mixed.

In the perovskite compound precursor, the monovalent organic cation, the metal ion and the halogen anion may be similar to or the same as the monovalent organic cation (A), the metal ion (M) and the halogen anion (X) described above in the perovskite compound.

The perovskite compound precursor may be an adduct of the above-described perovskite compound and the guest molecule (GM).

In detail, the perovskite compound precursor may satisfy Chemical Formula 7, 8 or 9 below:

$$AM(GM)_nX_3 \quad \text{(Chemical Formula 7)}$$

in Chemical Formula 7, A is a monovalent cation, A is an organic ammonium ion, an amidinium group ion or an organic ammonium ion and an amidinium group ion, M is a divalent metal ion, X is a halogen ion, GM is a guest molecule, and n is a real number of 0<n<3, $$A(M_{1-a}N_a)(GM)_nX_3 \quad \text{(Chemical Formula 8)}$$

in Chemical Formula 8, A is a monovalent cation, A is an organic ammonium ion, an amidinium group ion or an organic ammonium ion and an amidinium group ion, M is a divalent metal ion, N is at least one doping metal ion selected from a monovalent metal ion and a trivalent metal ion, a is a real number of 0<a≤0.1, X is a halogen ion, GM is a guest molecule, and n is a real number of 0<n<3, $$A(N^1_{1-b}N^2_b)(GM)_nX_3 \quad \text{(Chemical Formula 9)}$$

in Chemical Formula 9, A is a monovalent cation, A is an organic ammonium ion, an amidinium group ion or an organic ammonium ion and an amidinium group ion, $N^1$ is a monovalent metal ion, $N^2$ is a trivalent metal ion, b is a real number of 0.4≤b≤0.6, X is a halogen ion, GM is a guest molecule, and n is a real number of 0<n<3.

In Chemical Formulas 7, 8 and 9, A, M, N, $N^1$, $N^2$, X, a, and b except for GM may be the same as described above based on Chemical Formula 1, 2 or 3. Further, in Chemical Formulas 7, 8 and 9, A, M, N, $N^1$, $N^2$, X, a, and b except for GM include all of the above-described contents in the perovskite compound based on Chemical Formula 1, 2 or 3.

In the perovskite compound precursor, GM may be non-covalently bonded with one or two or more cation(s) selected from an organic cation (A) and metal cations (M, N, $N^1$, $N^2$) The non-covalent bond may include ionic bonds, coordination bonds, hydrogen bonds or bonds by van der Waals force.

In the perovskite compound precursor, the GM may contain one or more elements selected from oxygen, nitrogen, fluorine, chlorine, bromine and iodine, including non-covalent electron pairs.

That is, GM may be a molecule including oxygen, nitrogen, fluorine, chlorine, bromine, and iodine which include non-covalent electron pairs capable of non-covalent bonding with organic cations (A) and/or metal cations (M, N, $N^1$ and/or $N^2$)

As a specific example, the GM may be a solvent containing one or more elements selected from oxygen, nitrogen, fluorine, chlorine, bromine and iodine, and dissolving the perovskite compound. Accordingly, the perovskite compound precursor may be a solvate of a perovskite compound and a solvent in which the perovskite compound is dissolved. As known in the art, the solvate may mean a higher order compound formed between a molecule of a solute (perovskite compound) or ion and a molecule of a solvent or ion.

When the perovskite compound precursor is a solvate of the perovskite compound and a solvent in which the perovskite compound is dissolved, the GM is homogeneously and quickly removed at low temperature, and the perovskite compound is manufactured.

As described above, the perovskite compound configuring the solvate may satisfy the above-described Chemical Formula 1, 2 or 3. In Chemical Formula 1, 2 or 3, A may be $A^a_{(1-x)}A^b_x$ ($A^a$ is an amidinium group ion, $A^b$ is an organic ammonium ion, x is a real number of 0.3 to 0.05), and independently, X may be $X^a_{(1-y)}X^b_y$ ($X^a$ is iodine ion, $X^b$ is bromine ion, and y is a real number of 0.05 to 0.3, specifically 0.1≤y≤0.15).

In the perovskite compound precursor, which is a solvate, the guest molecule may be one or two or more selected from N,N-dimethylacetamide, 1,4-dioxane, diethylamine, ethyl-acetate, tetrahydrofuran, pyridine, methanol, ethanol, 1,2-dichlorobenzene, glycerin, dimethylsulfoxide (DMSO), and N,N-dimethylformamide (DMF).

In the perovskite compound precursor, the guest molecule may be removed by energy applied to the perovskite compound precursor, and the perovskite compound precursor may be converted to a crystalline perovskite compound.

That is, since the perovskite compound precursor is a non-covalently bonding compound of the perovskite compound and GM, the GM may be removed from the precursor by energy application, atmospheric control or decompression, and thus, the perovskite compound precursor may be converted to a pure perovskite compound.

The perovskite compound precursor may be prepared to be used, or may be purchased from known materials. As a specific and non-limiting example, the perovskite compound precursor may be prepared by adding drop-wise, in a non-solvent, a solution in which the perovskite compound (or an organic cation, a metal cation, and a halogen anion configuring the perovskite compound) and the guest molecule are dissolved.

More specifically, when the perovskite compound precursor is the solvate, the perovskite compound precursor may be prepared by dissolving the perovskite compound or organic cations, metal cations, and halogen ions according to a stoichiometric ratio of the perovskite compound in a solvent which is the guest molecule, thereby preparing a perovskite compound solution; by adding drop-wise the perovskite compound solution in a non-solvent; and recovering and drying a solid phase obtained by adding drop-wise. Here, the non-solvent may mean an organic solvent that does not dissolve the perovskite compound and does not have miscibility with the solvent. Here, the description "that does not dissolve the perovskite compound" may mean an organic solvent in which a solubility of the perovskite compound is less than 0.1 M, specifically less than 0.01 M, and more specifically less than 0.001 M, at 20° C. under 1 atm. The description "that the non-solvent does not have miscibility with the solvent that dissolves the perovskite compound (a guest molecule when the perovskite compound is the solvate)" may mean that when the non-solvent and the solvent of the perovskite solution are mixed with each other, layers are separated in a static state in which physical stirring is not performed. An example of the non-solvent may include a non-polar organic solvent, and the non-polar organic solvent may be one or two or more organic solvents selected from pentane, hexene, cyclohexene, 1,4-dioxane, benzene, toluene, triethylamine, chlorobenzene, ethylamine, ethylether, chloroform, ethyl acetate, acetic acid, 1,2-dichlorobenzene, tert-butyl alcohol, 2-butanol, isopropanol, and methyl ethyl ketone, but is not limited thereto.

The iii) metal halide contained in the surface layer (first surface layer or second surface layer) may mean a compound of a metal ion and a halogen anion.

In detail, the metal halide may mean a compound of a metal cation (M, N, $N^1$ and/or $N^2$) and a halogen ion (X) in the perovskite compound described above based on Chemical Formula 1, 2 or 3.

That is, the metal halide may satisfy Chemical Formula 10, Chemical Formula 11, or Chemical Formula 12 below:

$$MX_2 \quad \text{(Chemical Formula 10)}$$

in Chemical Formula 10, M is a divalent metal ion, and X is a halogen ion. Here, the halogen ion may be one or two or more selected from $I^-$, $Br^-$, $F^-$, and $Cl^-$.

$$(M_{1-a}N_a)X_2 \quad \text{(Chemical Formula 11)}$$

In Chemical Formula 11, M is a divalent metal ion, N is at least one doping metal ion selected from a monovalent metal ion and a trivalent metal ion, a is a real number of $0<a\leq 0.1$, and X is a halogen ion. Here, the halogen ion may be one or two or more selected from $I^-$, $Br^-$, $F^-$, and $Cl^-$.

In Chemical Formula 11, the monovalent metal ion which is the doping metal ion (N) includes an alkali metal ion. The alkali metal ion may be one or two or more selected from $Li^+$, $Na^+$, $K^+$, $Rb^+$, and $Cs^+$ ions.

In Chemical Formula 11, the trivalent metal ion which is the doping metal ion (N) may be one or two or more selected from $Al^{3+}$, $Ga^{3+}$, $In^{3+}$, $Tl^{3+}$, $Sc^{3+}$, $Y^{3+}$, $La^{3+}$, $Ce^{3+}$, $Fe^{3+}$, $Ru^{3+}$, $Cr^{3+}$, $V^{3+}$, and $Ti^{3+}$ ions.

When the metal halide is doped with the monovalent metal ion or the monovalent metal ion in an amount larger than that of the trivalent metal ion, a p-type perovskite compound may be prepared by a reaction of a metal halide and an organic halide. Further, when the metal halide is doped with the trivalent metal ion or the trivalent metal ion in an amount larger than that of the monovalent metal ion, an n-type perovskite compound may be prepared by a reaction of a metal halide and an organic halide.

$$(N^1_{1-b}N^2_b)X_2 \quad \text{(Chemical Formula 12)}$$

In Chemical Formula 12, $N^1$ is a monovalent metal ion, $N^2$ is a trivalent metal ion, b is a real number of $0.4\leq b\leq 0.6$, and X is a halogen ion.

In Chemical Formula 12, the monovalent metal ion ($N^1$) includes an alkali metal ion. The alkali metal ion may be one or two or more selected from $Li^+$, $Na^+$, $K^+$, $Rb^+$, and $Cs^+$ ions.

In Chemical Formula 12, the trivalent metal ion may be one or two or more selected from $Al^{3+}$, $Ga^{3+}$, $In^{3+}$, $Tl^{3+}$, $Sc^{3+}$, $Y^{3+}$, $La^{3+}$, $Ce^{3+}$, $Fe^{3+}$, $Ru^{3+}$, $Cr^{3+}$, $V^{3+}$, and $Ti^{3+}$ ions.

Chemical Formula 12 may mean that the divalent metal ion (M) of Chemical Formula 10 is replaced with a monovalent metal ion and a trivalent metal ion.

Here, similar to the above-described Chemical Formula 11, by adjusting a relative element ratio of the monovalent metal ion and the trivalent metal ion to the range of $0.4\leq b\leq 0.6$, electrical properties of the perovskite compound prepared by the reaction of the metal halide with the organic halide may be controlled to n-type, intrinsic or p-type.

M and X of Chemical Formula 10 may be the same as or similar to M and X described above based on Chemical Formula 1, M, N, X and a of Chemical Formula 11 may be the same as or similar to M, N, X and a described above based on Chemical Formula 2, and $N^1$, $N^2$, X, and b in Chemical Formula 12 may be the same as or similar to $N^1$, $N^2$, X, and b described above based on Chemical Formula 3. In Chemical Formulas 10, 11, and 12, M, N, $N^1$, $N^2$, X, a, and b include all of the above-described contents relating to M, N, $N^1$, $N^2$, X, a, and b in the perovskite compound described above based on Chemical Formulas 1, 2 and 3.

The v) metal halide precursor contained in the surface layer (the first surface layer or the second surface layer) may be a compound including the heterogeneous molecule (or the guest molecule, hereinafter referred to as GM') together with a metal cation and a halogen anion forming the metal halide.

In detail, the metal halide precursor may be a compound in which the metal halide ($MX_2$) of the metal cation and the halogen anion configuring the inorganic/organic hybrid perovskite compound is non-covalently bonded with the guest molecule. The non-covalent bond may include ionic bonds, coordination bonds, hydrogen bonds or bonds by van der Waals force.

In other words, the metal halide precursor may be an adduct of a halogenated metal and a guest molecule.

Structurally, the metal halide precursor may have a structure in which the guest molecule is intercalated between layers of the metal halide having a layered structure. Here, the guest molecule may include a single molecule to a polymer.

The metal halide precursor may be converted to the perovskite compound by intramolecular exchange between the guest molecule contained in the metal halide precursor and the organic halide.

In detail, in the metal halide precursor, the guest molecule bonded to the metal halide is removed, and at the same time, the perovskite compound may be formed by reacting the organic halide which is diffused and introduced with the metal halide.

The guest molecule of the metal halide precursor is extremely easily removed when the perovskite compound is formed, and thus, formation of the perovskite structure in which A is positioned in the middle of a three-dimensional network including corner-shared $MX_6$ octahedron may not be interrupted, nucleation of the perovskite compound at the time of conversion to the perovskite compound and volume change (volume difference between the metal halide precursor and the perovskite compound) occurring during growth may be suppressed, and the migration (diffusion) of the organic halide may be improved.

The metal halide precursor may be a compound in which the metal halide is non-covalently bonded with the guest molecule, and specifically, may be a compound including the metal halide and the guest molecule that includes oxygen, nitrogen, or oxygen and nitrogen including a non-covalent electron pair.

When describing the metal halide precursor based on Chemical Formula, the metal halide precursor may satisfy Chemical Formula 13, 14 or 15 below:

$$MX_2(GM')_n \quad \text{(Chemical Formula 13)}$$

in Chemical Formula 13, M is a divalent metal cation, X is one or two or more halogen anions selected from $Cl^-$, $Br^-$, $F^-$, and $I^-$, GM' is a guest molecule non-covalently bonded with $MX_2$, and n is a real number of 0.5 to 50.

The perovskite compound may be formed by molecular exchange between the guest molecule of the metal halide precursor and the organic halide. Accordingly, a volume change (volume difference between the metal halide precursor and the perovskite compound) may be suppressed before and after the molecular exchange reaction, and in order to secure the improved migration (diffusion) of the organic halide, n in Chemical Formula 13 may be 0.5 to 5, specifically, n may be 0.5 to 2, and more specifically, 0.5 to 1.5.

In $MX_2$ in Chemical Formula 13, M may be one or two or more metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X may be one or two or more selected from $I^-$, $Br^-$, $F^-$, and $Cl^-$.

$(M_{1-a}N_a)X_2(GM')_n$ <span>(Chemical Formula 14)</span> in Chemical Formula 14, M may be a divalent metal ion, N may be at least one doping metal ion selected from a monovalent metal ion and a trivalent metal ion, a may be a real number of $0<a\leq0.1$, X may be a halogen ion, GM' may be a guest molecule non-covalently bonded with $(M_{1-a}N_a)X_2$, n may be a real number of 0.5 to 50, preferably 0.5 to 5, specifically 0.5 to 2, and more specifically, n may be 0.5 to 1.5.

$(N^1_{1-b}N^2_b)X_2(GM')_n$ <span>(Chemical Formula 15)</span> in Chemical Formula 15, $N^1$ may be a monovalent metal ion, $N^2$ may be a trivalent metal ion, b may be a real number of $0.4\leq b\leq 0.6$, X may be a halogen ion, GM' may be a guest molecule non-covalently bonded with $(N^1_{1-b}N^2_b)X_2$, n may be a real number of 0.5 to 50, preferably 0.5 to 5, specifically 0.5 to 2, and more specifically, n may be 0.5 to 1.5.

In Chemical Formulas 13, 14 and 15, M, N, $N^1$, $N^2$, X, a and b except for GM' may be the same as or similar to the above-description in the perovskite compound based on Chemical Formula 1, 2 or 3 described above. Further, in Chemical Formulas 13, 14, and 15, M, N, $N^1$, $N^2$, X, a, and b include all of the above-described contents relating to M, N, $N^1$, $N^2$, X, a, and b in the perovskite compound described above based on Chemical Formula 1, 2 or 3.

The GM' which is the guest molecule intercalated between layers of the metal halide having a layered structure, may be a molecule that includes oxygen, nitrogen, or oxygen and nitrogen including a non-covalent electron pair, and may be a single molecule to a polymer.

As a specific example, the guest molecule GM' that is non-covalently bonded with the metal halide may be a single molecule to a polymer that includes oxygen, nitrogen, or oxygen and nitrogen including a non-covalent electron pair. As an example, the guest molecule that is non-covalently bonded with the metal halide is any molecule as long as it is capable of forming a compound by non-covalently bonding with the metal halide, such as dimethylsulfoxide (DMSO), N,N-dimethylformamide (DMF), N-methyl-2-pyrrolidone (NMP), 2,2'-bipyridine, 4,4'-bipyridine-N,N'-dioxide, pyrazine, 1,10-phenanthroline, 2-methylpyridine, poly(ethylene oxide), or the like.

Preferably, the metal halide precursor is preferably a solvate of a metal halide and a solvent that dissolves the metal halide in view of facilitating diffusion removal of the guest molecule intercalated between the layers of the metal halide having a layered structure and providing an easy diffusion path to the organic halide.

When the metal halide precursor is the solvate of the metal halide and the solvent that dissolves the metal halide, it is possible to diffusion-remove the guest molecule rapidly and easily due to strong volatility of the solvent, and simultaneously to generate rapid and easy site exchange with the organic halide to be generated. Accordingly, it is possible to manufacture a perovskite compound film having a very coarse crystal grain.

When the metal halide precursor is the solvate, the metal halide precursor may be a compound in which the metal halide is non-covalently bonded with the guest molecule, which is a solvent of the metal halide. As a specific example, the guest molecule may be a solvent including oxygen, nitrogen, or oxygen and nitrogen, and dissolving the metal halide.

When describing this description based on the Chemical Formula, GM' in Chemical Formula 13, 14 or 15 may be a solvent (solvent molecule) containing oxygen, nitrogen, or oxygen and nitrogen and dissolving the metal halide ($MX_2$, $(M_{1-a}N_a)X_2$ or $(N^1_{1-b}N^2_b)X_2$)

The solvate in which the metal halide is non-covalently bonded with the solvent molecule that dissolves the metal halide may have a structure in which solvent molecules are intercalated between layers of a metal halide ($MX_2$, $(M_{1-a}N_a)X_2$ or $(N^1_{1-b}N^2_b)X_2$) having a layered structure, and the solvate may have extremely excellent reactivity with the organic halide due to the structure.

Specific examples of the guest molecule which is the solvent may include one or two or more selected from dimethylsulfoxide (DMSO), N,N-dimethylformamide (DMF), and N-methyl-2-pyrrolidone (NMP). More preferably, the metal halide precursor may be a compound of a metal halide and dimethylsulfoxide. In the case of such a metal halide precursor, the perovskite compound may be formed by molecular exchange of the guest molecule of the metal halide precursor with the organic halide, and there is almost no volume change before and after the reaction, and thus, physical deformation and increase in roughness due to the reaction may be prevented. Further, since the perovskite compound is formed by a very easy and fast molecular exchange reaction, it is possible to manufacture an extremely thick film form.

The metal halide precursor may be prepared to be used, or may be purchased from known materials. As a specific and non-limiting example, the metal halide precursor may be prepared by adding drop-wise, in a non-solvent, a solution in which the metal halide (or a metal cation, and a halogen anion) and the guest molecule are dissolved.

More specifically, when the metal halide precursor is the solvate, the metal halide precursor may be prepared by dissolving the metal halide or metal cations and halogen ions according to a stoichiometric ratio of the metal halide in a solvent which is the guest molecule, thereby preparing a metal halide solution; by adding drop-wise the metal halide solution in a non-solvent; and recovering and drying a solid phase obtained by adding drop-wise. Here, the non-solvent may mean an organic solvent that does not dissolve the metal halide and does not have miscibility with the solvent. Here, the description "that does not dissolve the metal halide" may mean an organic solvent in which a solubility of the metal halide is less than 0.1 M, specifically less than 0.01 M, and more specifically less than 0.001 M, at 20° C. under 1 atm. The description "that the non-solvent does not have miscibility with the solvent that dissolves the metal halide (a guest molecule when the metal halide is the solvate)" may mean that when the non-solvent and the solvent of the metal halide solution are mixed with each other, layers are separated in a static state in which physical stirring is not performed. An example of the non-solvent may include a non-polar organic solvent, and the non-polar organic solvent may be one or two or more organic solvents selected from pentane, hexene, cyclohexene, 1,4-dioxane, benzene, toluene, triethylamine, chlorobenzene, ethylamine, ethylether, chloroform, ethyl acetate, acetic acid, 1,2-dichlorobenzene, tert-butyl alcohol, 2-butanol, isopropanol, and methyl ethyl ketone, but the present invention is not limited by the non-solvent.

The ii) organic halide contained in the surface layer (first surface layer or second surface layer) may mean a compound of the monovalent organic cation (A) and the halogen anion (X), and may be represented by Chemical Formula AX.

That is, the organic halide may be represented by Chemical Formula 16 below:

$$AX \quad \text{(Chemical Formula 16)}$$

in Chemical Formula 16, A is a monovalent cation, A is an organic ammonium ion, an amidinium group ion or an organic ammonium ion and an amidinium group ion, and X is a halogen ion.

In Chemical Formula 16, A and X may be the same as or similar to the monovalent organic ion A and the halogen ion X described above based on Chemical Formula 1. In addition, in Chemical Formula 16, A and X include all of the above-described contents relating to A and X in the perovskite compound based on Chemical Formula 1, 2 or 3. Further, A in Chemical Formula 16 includes all of the above-described contents based on Chemical Formula 4, 5 or 6 in the perovskite compound.

That is, in Chemical Formula 16, the monovalent organic ion (A) may be an amidinium group ion, an organic ammonium ion or an amidinium group ion and an organic ammonium ion.

In detail, the organic halide may satisfy Chemical Formula 17 or 18 below:

$$(R_1\text{---}NH_3^+)X \quad \text{(Chemical Formula 17)}$$

in Chemical Formula 17, $R_1$ is C1-C24 alkyl, C3-C20 cycloalkyl or C6-C20 aryl, and X is one or two or more halogen ions selected from Cl⁻, Br⁻, F⁻, and I⁻.

$$(R_2\text{---}C_3H_3N_2^+\text{---}R_3)X \quad \text{(Chemical Formula 18)}$$

in Chemical Formula 18, $R_2$ is C1-C24 alkyl, C3-C20 cycloalkyl or C6-C20 aryl, $R_3$ is hydrogen or C1-C24 alkyl, and X is one or two or more halogen ions selected from Cl⁻, Br⁻, F⁻, and I⁻.

As a non-limiting example, in consideration of absorption of sunlight, $R_1$ in Chemical Formula 17 may be C1-C24 alkyl, specifically C1-C7 alkyl, and more specifically, methyl. Further, in Chemical Formula 18, $R_2$ may be C1-C24 alkyl, $R_3$ may be hydrogen or C1-C24 alkyl, specifically, $R_2$ may be C1-C7 alkyl, $R_3$ may be hydrogen or C1-C7 alkyl, and more specifically, $R_2$ may be methyl, and $R_3$ may be hydrogen.

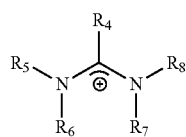

(Formula 19)

the amidinium group ion may satisfy Chemical in Chemical Formula 19, $R_4$ to $R_8$ are each independently hydrogen, C1-C24 alkyl, C3-C20 cycloalkyl or C6-C20 aryl. Further, as a non-limiting and specific example, in consideration of absorption of sunlight, $R_4$ to $R_8$ in Chemical Formula 19 may be each independently hydrogen, amino or C1-C24 alkyl, specifically, hydrogen, amino or C1-C7 alkyl, and more specifically, hydrogen, amino or methyl, and more specifically, $R_4$ may be hydrogen, amino or methyl and $R_5$ to $R_8$ may be hydrogen, respectively. As a specific and non-limiting example, the amidinium group ion may include formamidinium ion ($NH_2CH=NH_2^+$), acetamidinium ion ($NH_2C(CH_3)=NH_2^+$), guamidinium ion ($NH_2C(NH_2)=NH_2^+$), or the like.

In detail, in Chemical Formula 16, when the monovalent organic ion includes both an organic ammonium ion and an amidinium group ion, the organic halide may satisfy Chemical Formula 20 below. When both the organic ammonium ion and the amidinium group ion are contained, charge mobility of the perovskite compound may be remarkably improved.

$$A^a_{(1-x)}A^b_xX \quad \text{(Chemical Formula 20)}$$

in Chemical Formula 20, $A^b$ is a monovalent organic ammonium ion, $A^a$ is an amidinium group ion, X is a halogen ion, and x is a real number of 0<x<1. Here, the halogen ion may be one or two or more selected from I⁻, Br⁻, F⁻, and Cl⁻.

When the organic halide contains an amidinium group ion and an organic ammonium ion as the monovalent organic cation, the organic halide reacts with the metal halide to prepare the perovskite compound containing the amidinium group ion and the organic ammonium ion. The perovskite compound is capable of absorbing light in a very wide wavelength band, and it is possible to perform faster migration and separation of excitons, and faster migration of photoelectrons and photoholes. To this end, preferably, x may be 0.3 to 0.05. Specifically, A may be $A^a_{(1-x)}A^b_x$ (wherein $A^a$ is an amidinium group ion, $A^b$ is an organic ammonium ion, and x is a real number of 0.3 to 0.05).

The surface layer (the first surface layer or the second surface layer) may be a single layer containing at least one of the materials i) to v), a single layer containing at least two of the materials i) to v), or a stacked layer in which at least two of the materials i) to v) are layered and stacked, respectively.

The surface layer (the first surface layer or the second surface layer) containing at least one of the materials i) to v) described above may refer to a component that is positioned at the uppermost or outermost part to be exposed to the atmosphere among components configuring the structure (the first structure or the second structure). That is, the surface layer may mean a layer (a layer forming the surface) exposed to the surface of the structure.

The 'layer' of the surface layer (the first surface layer or the second surface layer) means that at least one of the materials i) to v) described above is present in a predetermined region and forms a surface. That is, at least one of the materials i) to v) is present in a predetermined region and forms the surface of the structure, which is referred to as a surface layer. Accordingly, in the surface layer, the term 'layer' should not be construed as meaning a dense film, and the term 'layer' in the surface layer should not be construed to be limited to the meaning of a film entirely covering one surface of other components configuring the structure such as the substrate, etc.

Further, it should be recognized that the presence of at least one of the materials i) to v) also includes a case where at least one of the materials i) to v) is partially embedded in components other than the surface layer configuring the structure (the first structure or the second structure), at least one of the materials partially protrudes, and a projected portion forms the surface layer.

Here, the region in which at least one of the materials i) to v) is present to form the surface is sufficient as long as it is a region in which the first and second surface layers are converted to the inorganic/organic hybrid perovskite compound film so that the first structure and the second structure are physically integrated with each other through the converted inorganic/organic hybrid perovskite compound film. Further, when it is attempted to manufacture a device including an inorganic/organic hybrid perovskite compound film, in consideration of a position, a shape, etc., of the inorganic/organic hybrid perovskite compound film required for normal operation of the device or for effective operation of the device, the position, the shape, or the like, of the region where the surface layer is positioned may be appropriately designed.

Further, the surface layer may be patterned or unpatterned. The phrase in which the surface layer is patterned means that the surface layer is positioned only in a region intended to have a previously designed shape. As an example of the patterning, a plurality of strip shapes spaced apart from each other, a mesh shape, dots regularly spaced apart (a shape is not limited, for example, a circular shape, a square shape, or the like, and a size is not limited) may be included, but the present invention is not limited thereto. It is needless to say that the surface layer may be patterned to conform to the shape of the desired inorganic/organic hybrid perovskite compound film. When the surface layer is patterned, the first surface layer and the second surface layer may be patterned in a shape that the first surface layer and the second surface layer correspond to each other. The description "the shape that the first surface layer and the second surface layer correspond to each other" means that the second surface layer has a pattern symmetrical (line symmetrical) with the pattern of the first surface layer. The corresponding shape may be easily understood when considering that the first surface layer and the second surface layer are stacked in contact with each other and then converted into a single inorganic/organic hybrid perovskite compound.

The first surface layer may contain at least one material of i) the inorganic/organic hybrid perovskite compound, iv) the inorganic/organic hybrid perovskite compound precursor, v) the metal halide precursor, ii) the organic halide, and iii) the metal halide as described above. The first surface layer may be a dense film, a porous film, or a stacked film thereof.

As a specific example, the first surface layer may contain the above-described perovskite compound. As a more specific example, the first surface layer may be formed of the above-described perovskite compound.

As a specific example, the first surface layer may contain the above-described perovskite compound precursor. As a more specific example, the first surface layer may be formed of the above-described perovskite compound precursor.

As a specific example, the first surface layer may contain the above-described metal halide precursor. As a more specific example, the first surface layer may be formed of the above-described metal halide precursor.

As a specific example, the first surface layer may contain the above-described organic halide. As a more specific example, the first surface layer may be formed of the above-described organic halide.

As a specific example, the first surface layer may contain the above-described metal halide. As a specific example, the first surface layer may be formed of the above-described metal halide.

As a specific example, the first surface layer may contain the above-described metal halide and the above-described organic halide. As a more specific example, the first surface layer may be formed of a mixture of the above-described metal halide and the above-described organic halide.

The second surface layer may contain, independently from the first surface layer, at least one material of i) the inorganic/organic hybrid perovskite compound, ii) the inorganic/organic hybrid perovskite compound precursor, iii) the metal halide precursor, iv) the organic halide, and v) the metal halide.

The second structure including the second surface layer may refer to a structure in which a surface region containing at least one of the material of i) the inorganic/organic hybrid perovskite compound, ii) the inorganic/organic hybrid perovskite compound precursor, iii) the metal halide precursor, iv) the organic halide, and v) the metal halide, is present. The second surface layer may be a dense film, a porous film, or a stacked film thereof.

The second surface layer may contain at least one of the material of i) the inorganic/organic hybrid perovskite compound, ii) the inorganic/organic hybrid perovskite compound precursor, iii) the metal halide precursor, iv) the organic halide, and v) the metal halide as described above.

As a specific example, the second surface layer may contain the above-described perovskite compound. As a specific example, the second surface layer may be formed of the above-described perovskite compound.

As a specific example, the second surface layer may contain the above-described perovskite compound precursor. As a more specific example, the second surface layer may be formed of the above-described perovskite compound precursor.

As a specific example, the second surface layer may contain the above-described metal halide precursor. As a more specific example, the second surface layer may be formed of the above-described metal halide precursor.

As a specific example, the second surface layer may contain the above-described organic halide. As a more specific example, the second surface layer may be formed of the above-described organic halide.

As a specific example, the second surface layer may contain the above-described metal halide. As a more specific example, the second surface layer may be formed of the above-described metal halide.

As a specific example, the second surface layer may contain the above-described metal halide and the above-described organic halide. As a more specific example, the second surface layer may be formed of a mixture of the above-described metal halide and the above-described organic halide.

A pair of at least one of the materials i) to v) contained in the first surface layer and at least one of the materials i) to v) contained in the second surface layer in consideration of the material of the first surface layer is as follows:

a pair of the material contained in the first surface layer and the material contained in the second surface layer perovskite compound-perovskite compound perovskite compound-perovskite compound precursor perovskite compound precursor-perovskite compound precursor metal halide precursor-organic halide organic halide-metal halide precursor organic halide-metal halide metal halide-organic halide In the above-described material pair, even though the first surface layer and the second surface layer both contain the perovskite compound or the perovskite compound precursor, the specific materials contained in each surface layer may be the same as or different from each other.

Specifically, when the first surface layer and the second surface layer both contain the perovskite compound, the first surface layer and the second surface layer both satisfy Chemical Formula 1, 2, or 3, but specific compositions (A, M and/or X) may be different from each other.

As a specific and non-limiting example, the first surface layer may contain an n-type perovskite compound and the second surface layer may contain a p-type perovskite compound.

As a specific and non-limiting example, when the first surface layer and the second surface layer both contain the perovskite compound, the perovskite compound contained in the first surface layer and the perovskite compound contained in the second surface layer may be each independently $CH_3NH_3PbI_xCl_y$ (x is a real number of $0 \leq x \leq 3$, y is a real number of $0 \leq y \leq 3$, and x+y=3), $CH_3NH_3PbI_xBr_y$ (x is a real number of $0 \leq x \leq 3$, y is a real number of $0 \leq y \leq 3$, and x+y=3), $CH_3NH_3PbCl_xBr_y$ (x is a real number of $0 \leq x \leq 3$, y is a real number of $0 \leq y \leq 3$, and x+y=3), $CH_3NH_3PbI_xF_y$ (x is a real number of $0 \leq x \leq 3$, y is a real number of $0 \leq y \leq 3$, and x+y=3), $NH_2CH=NH_2PbI_xCl_y$ (x is a real number of $0 \leq x \leq 3$, y is a real number of $0 \leq y \leq 3$, and x+y=3), $NH_2CH=NH_2PbI_xBr_y$ (x is a real number of $0 \leq x \leq 3$, y is a real number of $0 \leq y \leq 3$, and x+y=3), $NH_2CH=NH_2PbCl_xBr_y$ (x is a real number of $0 \leq x \leq 3$, y is a real number of $0 \leq y \leq 3$, and x+y=3), $NH_2CH=NH_2PbI_xF_y$ (x is a real number of $0 \leq x \leq 3$, y is a real number of $0 \leq y \leq 3$, and x+y=3), $NH_2CH=NH_{2(1-x)}CH_3NH_{3x}Pb(I_{(1-y)}Br_y)_3$ (x is a real number of $0<x<1$, and y is a real number of $0<y<1$), $NH_2CH=NH_{2(1-x)}CH_3NH_{3x}Pb(I_{(1-y)}Br_y)_3$ (x is a real number of $0.05 \leq x \leq 0.3$, and y is a real number of $0.05 \leq y \leq 0.3$), $NH_2CH=CH_{2(1-x)}CH_3NH_{3x}Pb(I_{(1-x)}Br_x)_3$ (x is a real number of $0.05 \leq x \leq 0.3$), $NH_2C(CH_3)=NH_2PbI_xCl_y$ (x is a real number of $0 \leq x \leq 3$, y is a real number of $0 \leq y \leq 3$, and x+y=3), $NH_2C(CH_3)=NH_2PbI_xBr_y$ (x is a real number of $0 \leq x \leq 3$, y is a real number of $0 \leq y \leq 3$, and x+y=3), $NH_2C(CH_3)=NH_2PbCl_xBr_y$ (x is a real number of $0 \leq x \leq 3$, y is a real number of $0 \leq y \leq 3$, and x+y=3), $NH_2C(CH_3)=NH_2PbI_xF_y$ (x is a real number of $0 \leq x \leq 3$, y is a real number of $0 \leq y \leq 3$, and x+y=3), $NH_2C(CH_3)=NH_{2(1-x)}CH_3NH_{3x}Pb(I_{(1-y)}Br_y)_3$ (x is a real number of $0<x<1$, and y is a real number of $0<y<1$), $NH_2C(CH_3)=NH_{2(1-x)}CH_3NH_{3x}Pb(I_{(1-y)}Br_y)_3$ (x is a real number of $0.05 \leq x \leq 0.3$, and y is a real number of $0.05 \leq y \leq 0.3$), $NH_2C(CH_3)=CH_{2(1-x)}CH_3NH_{3x}Pb(I_{(1-x)}Br_x)_3$ (x is a real number of $0.05 \leq x \leq 0.3$), $NH_2C(NH_2)=NH_2PbI_xCl_y$ (x is a real number of $0 \leq x \leq 3$, y is a real number of $0 \leq y \leq 3$, and x+y=3), $NH_2C(NH_2)=NH_2PbI_xBr_y$ (x is a real number of $0 \leq x \leq 3$, y is a real number of $0 \leq y \leq 3$, and x+y=3), $NH_2C(NH_2)=NH_2PbCl_xBr_y$ (x is a real number of $0 \leq x \leq 3$, y is a real number of $0 \leq y \leq 3$, and x+y=3), $NH_2C(NH_2)=NH_2PbI_xF$ (x is a real number of $0 \leq x \leq 3$, y is a real number of $0 \leq y \leq 3$, and x+y=3), $NH_2C(NH_2)=NH_{2(1-x)}CH_3NH_{3x}Pb(I_{(1-y)}Br_y)_3$ (x is a real number of $0<x<1$, and y is a real number of $0<y<1$), $NH_2C(NH_2)=NH_{2(1-x)}CH_3NH_{3x}Pb(I_{(1-y)}Br)_3$ (x is a real number of $0.05 \leq x \leq 0.3$, and y is a real number of $0.05 \leq y \leq 0.3$) or $NH_2C(NH_2)=CH_{2(1-x)}CH_3NH_{3x}Pb(I_{(1-x)}Br_x)_3$ (x is a real number of $0.05 \leq x \leq 0.3$).

In addition, when the perovskite compound contained in the first surface layer and the perovskite compound contained in the second surface layer form a solid solution, it is needless to say that the perovskite compound contained in the first surface layer and the perovskite compound contained in the second surface layer or relative amounts of the first surface layer and the second surface layer may be designed so as to prepare the perovskite compound of the above-described more preferable and specific materials and compositions based on Chemical Formula 1.

Specific examples in which the first surface layer and the second surface layer both contain the perovskite compound are described above. However, even in the case of pairs of perovskite compound-perovskite compound precursor, perovskite compound precursor-perovskite compound precursor, metal halide precursor-organic halide, organic halide-metal halide precursor or organic halide-metal halide, a material and a thickness of the first surface layer and a material and a thickness of the second surface layer may be controlled so that a composition including the material of the first surface layer and the material of the second surface layer (GM and GM' are not considered since they are removed) has a desired perovskite compound composition, which is the same as or similar to the case where the first surface layer and the second surface layer both contain the perovskite compound. This is because the material of the first surface layer and the material of the second surface layer are converted to a homogeneously uniform perovskite compound by applying heat and physical force.

Specifically, the material and thickness of the first surface layer and the material and thickness of the second surface layer may be controlled so that the material and the composition of the perovskite compound to be converted from the first surface layer and the second surface layer satisfy the material and composition of the perovskite compound described above based on Chemical Formula 1, 2 or 3. As a specific and non-limiting example, the material and the thickness of the first surface layer and the material and the thickness of the second surface layer may be adjusted so that the composition of the perovskite compound finally obtained after the conversion from the surface layer satisfies $CH_3NH_3PbI_xCl_y$ (x is a real number of $0 \leq x \leq 3$, y is a real number of $0 \leq y \leq 3$, and x+y=3), $CH_3NH_3PbI_xBr_y$ (x is a real number of $0 \leq x \leq 3$, y is a real number of $0 \leq y \leq 3$, and x+y=3), $CH_3NH_3PbCl_xBr_y$ (x is a real number of $0 \leq x \leq 3$, y is a real number of $0 \leq y \leq 3$, and x+y=3), $CH_3NH_3PbI_xF_y$ (x is a real number of $0 \leq x \leq 3$, y is a real number of $0 \leq y \leq 3$, and x+y=3), $NH_2CH=NH_2PbI_xCl_y$ (x is a real number of $0 \leq x \leq 3$, y is a real number of $0 \leq y \leq 3$, and x+y=3), $NH_2CH=NH_2PbI_xBr_y$ (x is a real number of $0 \leq x \leq 3$, y is a real number of $0 \leq y \leq 3$, and x+y=3), $NH_2CH=NH_2PbCl_xBr_y$ (x is a real number of $0 \leq x \leq 3$, y is a real number of $0 \leq y \leq 3$, and x+y=3), $NH_2CH=NH_2PbI_xF_y$ (x is a real number of $0 \leq x \leq 3$, y is a real number of $0 \leq y \leq 3$, and x+y=3), $NH_2CH=NH_{2(1-x)}CH_3NH_{3x}Pb(I_{(1-y)}Br_y)_3$ (x is a real number of $0<x<1$, and y is a real number of $0<y<1$), $NH_2CH=NH_{2(1-x)}CH_3NH_{3x}Pb(I_{(1-y)}Br_y)_3$ (x is a real number of $0.05 \leq x \leq 0.3$, and y is a real number of $0.05 \leq y \leq 0.3$), $NH_2CH=CH_{2(1-x)}CH_3NH_{3x}Pb(I_{(1-x)}Br_x)_3$ (x is a real number of $0.05 \leq x \leq 0.3$), $NH_2C(CH_3)=NH_2PbI_xCl_y$ (x is a real number of $0 \leq x \leq 3$, y is a real number of $0 \leq y \leq 3$, and x+y=3), $NH_2C(CH_3)=NH_2PbI_xBr_y$ (x is a real number of $0 \leq x \leq 3$, y is a real number of $0 \leq y \leq 3$, and x+y=3), $NH_2C(CH_3)=NH_2PbCl_xBr_y$ (x is a real number of $0 \leq x \leq 3$, y is a real number of $0 \leq y \leq 3$, and x+y=3), $NH_2C(CH_3)=NH_2PbI_xF_y$ (x is a real number of $0 \leq x \leq 3$, y is a real number of $0 \leq y \leq 3$, and x+y=3), $NH_2C(CH_3)=NH_{2(1-x)}CH_3NH_{3x}Pb(I_{(1-y)}Br_y)_3$ (x is a real number of $0<x<1$, and y is a real number of $0<y<1$), $NH_2C(CH_3)=NH_{2(1-x)}(CH_3NH_{3x}Pb(I_{(1-y)}Br_y)_3$ (x is a real number of $0.05 \leq x \leq 0.3$, and y is a real number of $0.05 \leq y \leq 0.3$), $NH_2C(CH_3)=CH_{2(1-x)}CH_3NH_{3x}Pb(I_{(1-x)}Br_x)_3$ (x is a real number of $0.05 \leq x \leq 0.3$), $NH_2C(NH_2)=NH_2PbI_xCl_y$ (x is a real number of $0 \leq x \leq 3$, y is a real number of $0 \leq y \leq 3$, and x+y=3), $NH_2C(NH_2)=NH_2PbI_xBr_y$ (x is a real number of $0 \leq x \leq 3$, y is a real number of $0 \leq y \leq 3$, and x+y=3), $NH_2C(NH_2)=NH_2PbCl_xBr_y$ (x is a real number of $0 \leq x \leq 3$, y is a real number of $0 \leq y \leq 3$, and x+y=3), $NH_2C(NH_2)=NH_2PbI_xF_y$ (x is a real number of $0 \leq x \leq 3$, y is a real number of $0 \leq y \leq 3$, and x+y=3), $NH_2C(NH_2)=NH_{2(1-x)}CH_3NH_{3x}Pb(I_{(1-y)}Br_y)_3$ (x is a real number of 0<x<1, and y is a real number of 0<y<1), $NH_2C(NH_2)=NH_{2(1-x)}CH_3NH_{3x}Pb(I_{(1-y)}Br_y)_3$ (x is a real number of 0.05≤x≤0.3, and y is a real number of 0.05≤y≤0.3) or $NH_2C(NH_2)=CH_{2(1-x)}CH_3NH_{3x}Pb(I_{(1-x)}Br)_3$ (x is a real number of 0.05≤x≤0.3). Here, it is needless to say that by adjusting the first surface layer and the second surface layer to have the same composition, the composition of the inorganic/organic hybrid perovskite compound film manufactured according to the thickness of the first surface layer and the second surface layer may not be changed.

The first surface layer and the second surface layer may be each independently a dense film, a porous film, or a stacked film thereof. Here, the porous film contains at least one of the materials i) to iv), and may include an island structure in which grains configuring the film are not continuously connected to each other.

The thickness of the first surface layer and the thickness of the second surface layer may be appropriately adjusted in consideration of the thickness of the inorganic/organic hybrid perovskite compound film required in the device to be manufactured. As a specific example, the thickness of the first surface layer and the thickness of the second surface layer may be each independently 1 nm to 10 μm, but the present invention is not limited thereto. As an example of the solar cell, the thickness of the first surface layer and the thickness of the second surface layer may be each independently 1 nm to 10 μm, specifically 10 nm to 5 μm, and more particularly, 100 nm to 2 μm.

In the structure (the first structure or the second structure), the surface layer may include a coating body (coating film) on which grains containing at least one of the materials i) to v) are coated, a porous film containing at least one of the materials i) to v), a dense film containing at least one of the materials i) to v), or a combination thereof.

In particular, even when the surface layer itself such as the coating body (or coating film) in which the grains are dispersed and coated, the porous film, or the like is not dense, the first surface layer and the second surface layer may be converted to a dense inorganic/organic hybrid perovskite compound film. That is, the first surface layer and the second surface layer are formed by simply applying the grains containing at least one of the materials i) to v), and the manufacture of high quality dense inorganic/organic hybrid perovskite compound film may have significantly large commercial utility.

Hereinafter, the structure (first structure or second structure) excluding the surface layer (first surface layer or second surface layer) is collectively referred to as a substrate, and a method for manufacturing the surface layer (first surface layer or second surface layer) will be described in detail.

The surface layer may be formed by applying a solution in which the material of the surface layer is dissolved or a dispersion liquid in which the surface layer material (particulate) is dispersed on the substrate, printing an ink or slurry in which the material of the surface layer is dissolved or dispersed, or by depositing the material of the surface layer on the substrate. That is, the surface layer may be formed by applying or printing a solution, slurry or ink (dispersion liquid) containing at least one of the materials i) to v) on the substrate, or by physical or chemical vapor deposition of at least one of the materials i) to v) on the substrate.

Here, the application of the solution or the ink may be performed by a coating method which is conventionally used for applying a liquid or a dispersion phase. As a specific example, the coating may include dip coating, spin coating, casting, etc. The printing may include screen printing, inkjet printing, electrostatic hydraulic printing, microcontact printing, imprinting, gravure printing, reverse offset printing, gravure offset printing, etc.

The vapor deposition may be performed by physical or chemical vapor deposition. As a specific example, the vapor deposition may be performed by sputtering, electron-beam vapor deposition, evaporation vapor deposition (including thermal evaporation), pulsed laser deposition, plasma-assisted chemical vapor deposition, photo-assisted chemical vapor deposition, thermal chemical vapor deposition, low-pressure chemical vapor deposition, atmospheric pressure chemical vapor deposition, high-temperature chemical vapor deposition, low-temperature chemical vapor deposition, or the like. However, it is needless to say that the surface layer may be formed using application or vapor deposition methods commonly used for forming a film or a structure of a perovskite compound in an electronic material in which the perovskite compound is used.

Even if the surface layer is formed of a very coarse powder layer by using an ink or slurry in which grains of at least one of the materials i) to v) are dispersed, it is possible to be converted to a dense perovskite compound film according to the method provided in the present invention. In this case, the surface layer may be manufactured by mixing the particulate of at least one of the materials (i) and (v) with the non-solvent to prepare an ink or slurry, and then printing or applying the ink or slurry on the substrate. An example of the non-solvent may include a non-polar organic solvent, and the non-polar organic solvent may be one or two or more organic solvent selected from pentane, hexene, cyclohexene, 1,4-dioxane, benzene, toluene, triethylamine, chlorobenzene, ethylamine, ethylether, chloroform, ethyl acetate, acetic acid, 1,2-dichlorobenzene, tert-butyl alcohol, 2-butanol, isopropanol, and methyl ethyl ketone, but is not limited thereto.

A method for applying a solution (a surface layer-forming solution) in which at least any one selected from the materials i) to v) is dissolved to form the surface layer may include application of a solution (a surface layer-forming solution) using a single solvent, application of a solution (a surface layer-forming solution) using a mixed solvent having different vapor pressures, a two-step application in which a solution in which at least one selected from the materials i) to v) is dissolved and a non-solvent are sequentially applied, etc. It should be appreciated that the two-step application is advantageous for manufacturing a dense surface layer, but the present invention also encompasses a surface layer having a porous structure or a concavo-convex structure such as a pillar. As a specific example of the two-step application, the surface layer-forming solution may be added to a rotation center of spin coating and the non-solvent may be applied during the rotation. In consideration of a size of the device to be manufactured, a time interval between when the addition of the surface layer-forming solution to the rotation center of the spin coating is completed and when the non-solvent is added may be appropriately controlled, but as a specific and non-limiting example, the non-solvent may be added within 1 to 100 seconds immediately after the addition of the surface layer-forming solution is completed. In this case, the non-solvent used for the two-step application may be a non-polar organic solvent, preferably, a non-polar solvent in which a dielectric constant (s; relative dielectric constant) of 20 or less, and the dielectric constant is substantially 1 to 20. As a specific example, the non-solvent at the time of 2-step application may be one or two or more selected from pentane, hexene, cyclohexene, 1,4-dioxane, benzene, toluene, triethylamine, chlorobenzene, ethylamine, ethyl ether, chloroform, ethyl acetate, acetic acid, 1,2-dichlorobenzene, tert-butyl alcohol, 2-butanol, isopropanol, and methyl ethyl ketone, but is not limited thereto. The more detailed method for manufacturing a surface layer using solution application may be performed with reference to the present applicants' Korean Patent Laid-Open Publication Nos. 10-2014-0035285, 10-2014-0035284 or 10-2014-0035286, the disclosure of which is incorporated herein by reference in its entirety.

As described above, the surface layer may be formed by depositing the corresponding material or by applying or printing a solution or a dispersion liquid (including ink), but the surface layer may be formed in a step of preparing the perovskite compound precursor.

In detail, when the surface layer contains ii) the perovskite compound precursor or iii) the metal halide precursor, preparation of the precursor and formation of the surface layer may be performed simultaneously in a single process.

When the perovskite compound precursor is a solvate, a surface layer containing the precursor may be manufactured by dissolving a perovskite compound; or organic cations, metal cations and halogen ions according to the stoichiometric ratio of the perovskite compound in a solvent which is a guest molecule (GM) to prepare a perovskite compound solution, applying the perovskite compound solution on a substrate to be formed with the surface layer, and re-applying a non-solvent on the coating film that is applied with the perovskite compound solution. That is, the perovskite compound precursor may be prepared while simultaneously forming the surface layer by sequential application and drying of the perovskite compound solution in which the perovskite compound is dissolved in the solvent which is the guest molecule and the non-solvent. Here, the non-solvent to be sequentially applied may be a non-polar organic solvent, as described above.

More specifically, when the metal halide precursor is a solvate, a surface layer containing the metal halide precursor may be manufactured by dissolving a metal halide; or metal cations and halogen ions according to the stoichiometric ratio of the metal halide in a solvent which is a guest molecule (GM') to prepare a metal halide solution, applying the metal halide solution on a substrate to be formed with the surface layer, and re-applying a non-solvent on a coating film that is applied with the metal halide solution. That is, the metal halide precursor may be prepared while simultaneously forming the surface layer by sequential application and drying of the metal halide solution in which the metal halide is dissolved in the solvent which is the guest molecule and the non-solvent. Here, the non-solvent to be sequentially applied may be a non-polar organic solvent, as described above.

When manufacturing the surface layer containing ii) the perovskite compound precursor or iii) the metal halide precursor, the drying may be performed at a temperature from room temperature to 90° C., stably from room temperature to 70° C., and more stably from room temperature to 50° C. Such a low-temperature drying may not remove GM bonded to the perovskite compound or GM' bonded to the metal halide, but may remove GM which is not bonded to the perovskite compound and other heterogeneous solvent or GM' which is not bonded to the metal halide and other heterogeneous solvent, thereby preventing damage of the surface layer. However, when the solvent is highly volatile, the drying may be substantially performed while the application process such as spin coating is performed, and thus, the drying may be selectively performed if necessary.

When the surface layer contains i) the perovskite compound, the surface layer may be formed by a method using the perovskite compound precursor or the metal halide precursor as follows. In this case, the surface layer, which is dense and has a low surface roughness, may be manufactured by a simple and low-cost process.

An example in which the surface layer containing the perovskite compound is manufactured using ii) the perovskite compound precursor is described below.

When the surface layer containing the perovskite compound is manufactured by using the perovskite compound precursor, a solution in which the perovskite compound precursor is dissolved or a dispersion liquid or an ink in which the perovskite compound precursor is dispersed may be applied on a substrate and dried to form a precursor layer, and then GM may be removed from the precursor layer, thereby converting the precursor layer to the surface layer.

Alternatively, the precursor layer containing the perovskite compound precursor may be manufactured by dissolving a perovskite compound; or organic cations, metal cations and halogen ions according to the stoichiometric ratio of the perovskite compound in a solvent which is a guest molecule (GM) to prepare a perovskite compound solution, applying the perovskite precursor solution on a substrate to be formed with the surface layer, and re-applying a non-solvent on the coating film. Here, the solvent which is the guest molecule (GM) may be one or two or more selected from N,N-dimethylacetamide, 1,4-dioxane, diethylamine, ethylacetate, tetrahydrofuran, pyridine, methanol, ethanol, 1,2-dichlorobenzene, glycerin, dimethylsulfoxide (DMSO), and N,N-dimethylformamide (DMF). In addition, the non-solvent may be the above-described non-polar organic solvent.

In order to convert the precursor layer containing the perovskite compound precursor to the surface layer of the perovskite compound, the GM of the precursor layer may be removed by applying energy to the precursor layer. The energy applied at this time may be thermal energy, light energy, vibration energy, etc. A magnitude of the applied energy is enough to break the bond between the perovskite compound and the GM and allow the GM to be volatilized and removed. As an example, when the precursor layer formed on the substrate is heated to 100° C. or higher, the perovskite compound precursor may be converted to the perovskite compound. Further, when the precursor layer is heated to 130° C. or higher, the perovskite compound precursor may be converted to the perovskite compound in a very short time. The precursor layer may be converted to the perovskite compound layer (surface layer) by heating the precursor layer substantially at 100 to 150° C., preferably at 130 to 150° C.

Hereinafter, an example in which the surface layer containing the perovskite compound is manufactured using iii) the metal halide precursor is described below.

The surface layer may be manufactured by a method including a) forming a first film containing a metal halide precursor on a first substrate; and b) reacting the first film with an organic halide to manufacture the surface layer containing a perovskite compound. Here, the metal halide precursor and the method for manufacturing the first film are the same as or similar to the above-description.

The first film of step a) may be formed by applying a solution in which the metal halide precursor is dissolved, or depositing a dispersion liquid (ink) in which the metal halide precursor is dispersed or the metal halide precursor. Among them, application, particularly, the application of a solution phase, is commercially preferable because it is possible to form a dense film at low cost by a simple apparatus and process.

When the first film is manufactured using the application method, the first film may be manufactured by applying a first solution containing a metal halide precursor and a solvent (a first solvent) that dissolves the metal halide precursor, or a dispersion liquid (ink) in which the metal halide precursor is dispersed on a substrate, followed by drying. The first solvent that dissolves the metal halide precursor may be any solvent that dissolves the metal halide precursor and that is readily volatilized and removed. As a specific and non-limiting example, the solvent may include N,N-dimethylformamide (DMF), gamma-butyrolactone (GBL), 1-methyl-2-pyrrolidone, N,N-dimethylacetamide, or a mixed solvent thereof.

The application of the first solution may be performed by an application method that is generally used for forming the film by applying and drying the liquid phase. As a specific example, spin coating may be used, but the present invention is not limited by the application method of the first solution.

Here, when the metal halide precursor is a solvate, a first film may be manufactured by dissolving a metal halide; or metal cations and halogen ions according to the stoichiometric ratio of the metal halide in a solvent which is a guest molecule (GM') to prepare a metal halide precursor solution, applying the metal halide solution on a substrate to be formed with the surface layer, and re-applying a non-solvent on a coating film applied with the metal halide solution.

That is, the metal halide precursor may be prepared while simultaneously forming the first film by a sequential application and drying of the metal halide solution in which the metal halide is dissolved in the solvent which is the guest molecule and the non-solvent. Here, the solvent which is the guest molecule (GM') may be dimethylsulfoxide (DMSO), N,N-dimethylformamide (DMF), N-methyl-2-pyrrolidone (NMP), 2,2'-bipyridine, 4,4'-bipyridine-N,N'-dioxide, pyrazine, 1,10-phenanthroline, 2-methylpyridine, poly(ethylene oxide), or the like, and the non-solvent to be sequentially applied may be a non-polar organic solvent as described above.

Here, a thickness of the first film may be 1 nm to 1 μm, specifically, 5 nm to 800 nm, more specifically, 300 nm to 800 nm, and more specifically, 300 to 600 nm. An extremely thick film of up to 1 μm may be implemented since reactivity of metal halide precursor (substitution reaction with organic halide) is generated very quickly and easily.

After the first solution is applied on the substrate, the first film may be dried, wherein a temperature for drying is sufficient as long as it is a temperature at which the solvent is easily volatilized and removed without damaging the film. As a specific example, the drying may be performed at a temperature from room temperature to 90° C., and stably from room temperature to 70° C. However, when the first solvent is highly volatile, the drying may be substantially performed while the application process such as spin coating is performed, and thus, the drying may be selectively performed if necessary. Even if the drying is performed, the drying is performed at a low temperature at which the GM' bonded to the metal oxide is not removed from the first film.

In a step of reacting the first film with an organic halide to manufacture a perovskite compound film, the organic halide may be the same as or similar to the above-description.

The reaction of the first film with the organic halide may be a solid phase reaction, a liquid phase reaction, a gas phase reaction, a mixed reaction thereof, or a sequential reaction thereof depending on a state of the organic halide to be reacted. Here, since a substitution reaction between the GM' of the metal halide precursor and the organic halide is generated extremely easily and actively, the perovskite compound film may be manufactured by an easy method of applying the solution in which the organic halide is dissolved to an upper portion of the first film. That is, in a step of applying the solution containing the organic halide to the first film at substantially room temperature, the first film may be converted to the perovskite compound film.

As a specific and substantial example, after forming the first film, a second solution containing the organic halide and a solvent (a second solvent) that dissolves the organic halide on the first film is applied, thereby manufacturing the perovskite compound film.

However, at the time of applying the second solution, it is preferable to select a solvent in which the solvent of the organic halide solution does not dissolve the metal halide precursor, in order to prevent a lower film from dissolving again. In this regard, the second solvent that dissolves the organic halide may be one or more selected from tert-butyl alcohol, 2-butanol, isobutyl alcohol, 1-butanol, isopropanol, 1-propanol, ethanol, and methanol.

The application of the second solution may be performed by an application method that is generally used for forming the film by applying and drying the liquid phase. As a specific example, spin coating may be used, but the present invention is not limited by the application method of the second solution.

The first structure may include a first substrate capable of supporting a first surface layer and the second structure may include a second substrate capable of supporting a second surface layer. That is, the first structure may include a first substrate and a first surface layer positioned on the first substrate and forming a surface (one surface). In addition, the second structure may include a second substrate and a second surface layer positioned on the second substrate and forming a surface.

In the macroscopic configuration, the first substrate or the second substrate (hereinafter referred to as a substrate) may be a wafer or a film, and the surface thereof may be patterned in consideration of a physical shape of an electronic device, an optical device or a sensor to be designed.

In view of a physical property, the substrate may be a rigid substrate or a flexible substrate.

In view of a material, the substrate may be a laminate in which a semiconductor, a ceramic, a metal, a polymer, or two or more materials selected therefrom are layered and stacked, respectively. As a specific and non-limiting example of the laminate, a laminate in which different semiconductor materials are layered and stacked, respectively, a laminate in which different ceramic materials are layered and stacked, respectively, a laminate in which a semiconductor and a metal are layered and stacked, respectively, and a laminate in which a semiconductor and a ceramic are layered and stacked, respectively, etc., may be included.

As a non-limiting example of the semiconductor substrate (the first substrate or the second substrate), the semiconductor substrate may include a laminate in which a Group 4 semiconductor including silicon (Si), germanium (Ge) or silicon germanium (SiGe), a Group 3-5 semiconductor including gallium arsenide (GaAs), indium phosphide (InP) or gallium phosphide (GaP), a Group 2-6 semiconductor including cadmium sulfide (CdS) or zinc telluride (ZnTe), a Group 4-6 semiconductor including lead sulfide (PbS) or two or more materials selected therefrom are layered and stacked. As a non-limiting example of the ceramic substrate (the first substrate or the second substrate), the ceramic substrate may include a laminate in which a semiconductor oxide, a semiconductor nitride, a semiconductor carbide, a metal oxide, a metal carbide, a metal nitride, or two or more materials selected therefrom are layered and stacked. Here, the semiconductor of the semiconductor oxide, the semiconductor nitride, or the semiconductor carbide may include a Group 4 semiconductor, a Group 3-5 semiconductor, a Group 2-6 group semiconductor, a Group 4-6 semiconductor, or a mixture thereof. A non-limiting example of the metal substrate (the first substrate or the second substrate) may include a transition metal including noble metals, a metal, and a mixture thereof. Here, the transition metal may include Sc, Y, La, Ac, Ti, Zr, Hf, V, Nb, Ta, Cr, Mo, W, Mn, Te, Re, Fe, Ru, Os, Co, Rh, Ir, Ni, Pd, Pt, Cu, Ag, Au or a mixture thereof. The metal may include Li, Na, K, Rb, Cs, Fr, Be, Mg, Ca, Sr, Ba, Ra, Zn, Cd, Al, Ga, In, Tl, Ge, Sn, Pb, Sb, Bi, Po or a mixture thereof. A non-limiting example of a flexible polymer substrate (first substrate or second substrate) may include polyethylene terephthalate (PET), polyethylene naphthalate (PEN), polyimide (PI), polycarbonate (PC), polypropylene (PP), triacetyl cellulose (TAC), polyethersulfone (PES), polydimethylsiloxane (PDMS) or a mixture thereof.

Crystallographically, the substrate (the first substrate or the second substrate) may be a monocrystalline, polycrystalline or amorphous body, or may be a mixed phase in which a crystalline phase and an amorphous phase are mixed. When the substrate is a laminate in which two or more layers are stacked, respective layers may be each independently the monocrystalline, polycrystalline or amorphous body, or the mixed phase.

As a specific example, the substrate (the first substrate or the second substrate) may include a semiconductor substrate (including a wafer) such as a Si substrate; a semiconductor substrate (including a wafer) on which a semiconductor oxide layer is stacked, such as a Si semiconductor substrate or a SOI (silicon on insulator) substrate having a surface oxide film formed thereon; a Si semiconductor substrate (including a wafer) on which a metal layer and a semiconductor oxide layer are stacked, such as a Si semiconductor substrate having a metal thin film and a surface oxide film formed thereon or a Si semiconductor substrate having a patterned metal film formed in a Si oxide film, an amorphous oxide substrate such as a glass or a flexible polymer substrate such as polyethylene terephthalate (PET), polyethylene naphthalate (PEN), polyimide (PI), polycarbonate (PC), polypropylene (PP), triacetylcellulose (TAC), polyethersulfone (PES) or polydimethylsiloxane (PDMS).

Here, it should be recognized that even when the first structure is composed of the first substrate and the first surface layer, and the second structure is composed of the second substrate and the second surface layer, the first surface layer and the second surface layer may be converted to the inorganic/organic hybrid perovskite compound film. That is, the present invention also includes a case where the structure is composed of only the substrate and the surface layer.

The substrate (the first substrate or the second substrate) is provided to physically support the surface layer, to easily physically handle the structure, and to serve as a transfer member for transferring physical force to the surface layer. However, when a component provided below the first surface layer or the second surface layer may serve as the substrate, it is not necessary to provide the substrate. As an example thereof, a semiconductor substrate in which a p-n junction, etc., are formed, a multilayer inorganic thin film, or the like, may be present as a lower component of the surface layer.

According to a basic structure of a device including an inorganic/organic hybrid perovskite compound film such as an electronic device such as a transistor, a light emitting device that generates light, a memory device, a photovoltaic device (solar cell), etc., the lower component of the first surface layer of the first structure and the lower component of the second surface layer of the second structure may be appropriately designed and modified. That is, in the previously known device structure, based on the inorganic/organic hybrid perovskite compound film, a component positioned under a lower part thereof may be formed under the first surface layer of the first structure, and a component positioned on an upper part thereof may be formed under the second surface layer of the second structure.

For example, when the device to be manufactured is a light emitting diode having an inorganic/organic hybrid perovskite compound film as a light emitting layer, the light emitting diode has a basic structure of first electrode-n-type semiconductor (electron transport structure)-light emitting layer-p-type semiconductor (hole transport structure)-second electrode, and thus, the first structure may have a structure of first substrate-first electrode-n-type semiconductor-first surface layer, and the second structure may have a structure of second substrate-second electrode-p-type semiconductor-second surface layer. Here, as described above, when the n-type semiconductor or the p-type semiconductor may function as the substrate, the first structure may have a structure of n-type semiconductor on which the first electrode is formed-first surface layer, and the second structure may have a structure of p-type semiconductor on which the second electrode is formed second surface layer.

As an example, when a device to be manufactured is a resistance change type memory using an inorganic/organic hybrid perovskite compound film, since the resistance change memory has a structure of first electrode-semiconductor-second electrode, the first structure may have a structure of first substrate-first electrode-first surface layer, and the second structure may have a structure of second substrate-second electrode-second surface layer. Here, as well known, the first electrode may be metal strips spaced apart from each other in one direction, and the second electrode may be metal strips spaced apart from each other in another one direction so as to be orthogonal to the metal strips of the first electrode. In addition, when the first structure and the second structure are stacked so that the surface layers are in contact with each other, the first surface layer and the second surface layer may be patterned so that the metal strip of the first electrode and the metal strip of the second electrode are positioned only in a region where they cross (including orthogonality) each other, respectively.

As described above, it is obvious that in order to manufacture a desired device, those skilled in the art related to an electronic device such as a transistor, a light emitting device that generates light, a memory device, a photovoltaic device (solar cell), etc., may design and modify the lower component of the first surface layer of the first structure and the lower component of the second surface layer of the second structure to be appropriate for the corresponding device, thereby manufacturing the corresponding device. That is, the desired device may be manufactured by forming other configurations (structures) other than the perovskite compound film between the substrate and the surface layer in the basic structure essential for driving the electronic device, the optical element, the sensor, or the like, to be manufactured.

Among various applications of inorganic/organic hybrid perovskite compound, an application to a solar cell including the inorganic/organic hybrid perovskite compound which is commercially important as a light absorber is described in detail.

A specific example of the first structure and the second structure is described below assuming that the structure providing a hole movement path is the second structure and the structure providing an electron movement path is the first structure. However, when the first structure provides the hole movement path, it is needless to say that the first structure may have a structure of the second structure described below, and likewise, the second structure may have a structure of the first structure described above.

The first structure may include a first substrate that is a support for supporting at least the first surface layer. In addition, the first structure may have a state in which the components positioned under the light absorber which is the perovskite compound of the devices (solar cell, etc.) to be manufactured on the first substrate, are previously formed. As a specific example, the first structure may further include a first substrate; a first electrode positioned on the first substrate; and an electron transport structure positioned on the first electrode.

That is, the first structure may include a laminate in which the first substrate, the first electrode, the electron transport structure, and the first surface layer are sequentially stacked.

The first substrate may be a rigid substrate or a flexible substrate. As a specific example, the first substrate may be a rigid substrate including a glass substrate or a flexible substrate including polyethylene terephthalate (PET); polyethylene naphthalate (PEN); polyimide (PI); polycarbonate (PC); polypropylene (PP); triacetylcellulose (TAC); polyether sulfone (PES), etc. However, the present invention is not limited by the kind of the first substrate.

The first electrode is any conductive electrode that is ohmic-bonded to the electron transport structure, and a material thereof may be any material commonly used as an electrode material of a front electrode or a rear electrode in a solar cell. As a non-limiting example, when the first electrode is formed of an electrode material of the rear electrode, the first electrode may be formed of one or more materials selected from gold, silver, platinum, palladium, copper, aluminum, carbon, cobalt sulfide, copper sulfide, nickel oxide, and a combination thereof. As a non-limiting example, when the first electrode is a transparent electrode, the first electrode may be an inorganic conductive electrode such as fluorine doped tin oxide (FTO), indium doped tin oxide (ITO), ZnO, carbon nanotube (CNT), graphene, etc., or an organic conductive electrode such as PEDOT:PSS. When it is attempted to provide a transparent solar cell, it is preferable that all of the electrodes (the first electrode and the second electrode) and the substrates (the first substrate and the second substrate) are transparent electrodes and transparent substrates. In addition, when the electrode (the first electrode or the second electrode) is an organic conductive electrode, it is more preferred when a flexible solar cell or a transparent solar cell is attempted to be provided.

The first electrode may be formed by depositing or applying an electrode material on a substrate. The vapor deposition may be formed by physical vapor deposition or chemical vapor deposition, and may be formed by thermal evaporation. The application may be performed by applying a solution in which the electrode material is dissolved or a dispersion liquid of the electrode material on the substrate, followed by drying, or by heat-treating the selectively dried film. However, the first electrode may be formed by using a method for forming a front electrode or a rear electrode in a conventional solar cell.

The electron transport structure positioned on the first electrode may be an electron conductive organic material layer or an inorganic material layer. The electron conductive organic material may be an organic material used as an n-type semiconductor in a conventional organic solar cell. As a specific and non-limiting example, the electron conductive organic material may include fullerenes (C60, C70, C74, C76, C78, C82, C95), fullerene derivatives including PCBM([6,6]-phenyl-C61butyric acid methyl ester), C71-PCBM, C84-PCBM, and $PC_{70}BM$([6,6]-phenyl $C_{70}$-butyric acid methyl ester), PBI(polybenzimidazole), PTCBI(3,4,9,10-perylenetetracarboxylic bisbenzimidazole), F4-TCNQ (tetra fluorotetracyanoquinodimethane) or a mixture thereof. The electron conductive inorganic material may be an electron conductive metal oxide conventionally used for electron transfer in a conventional quantum dot-based solar cell or a dye-sensitized solar cell. As a specific example, the electron conductive metal oxide may be an n-type metal oxide semiconductor. As a non-limiting example, the n-type metal oxide semiconductor may include one or two or more materials selected from Ti oxide, Zn oxide, In oxide, Sn oxide, W oxide, Nb oxide, Mo oxide, Mg oxide, Ba oxide, Zr oxide, Sr oxide, Yr oxide, La oxide, V oxide, Al oxide, Y oxide, Sc oxide, Sm oxide, Ga oxide, In oxide, and SrTi oxide, and may include a mixture thereof or a composite thereof.

In the structure, the electron transport structure may be a porous layer (porous film) or a dense layer (dense film). The dense electron transport structure may be a film of the electron conductive organic material or a dense film of the electron conductive inorganic material. The porous electron transport structure may be a porous film formed of grains of the above-described electron conductive inorganic material. The electron transport structure may have a thickness of 50 nm to 10 μm, specifically 50 nm to 1000 nm. When the electron transport structure is porous, a specific surface area may be 10 to 100 $m^2/g$, and an average diameter of the metal oxide grains forming the electron transport structure may be 5 to 500 nm. A porosity (apparent porosity) of the porous electron transport structure may be 30% to 65%, and specifically 40% to 60%.

When the electron transport structure has a porous structure, an electron transport film may be further provided between the first electrode and the electron transport structure. The electron transport film may prevent the direct contact between the light absorber and the first electrode in advance, and at the same time, may transfer electrons. The electron transport film may be any material as long as it is a material in which electrons are capable of moving spontaneously from the porous metal oxide to the first electrode through the electron transport film on an energy band diagram. As a non-limiting and specific example, the electron transport film may be a metal oxide thin film, and a metal oxide of the metal oxide thin film may be the same as or different from a metal oxide of the porous metal oxide. In detail, a material of the metal oxide thin film may be one or more materials selected from Ti oxide, Zn oxide, In oxide, Sn oxide, W oxide, Nb oxide, Mo oxide, Mg oxide, Ba oxide, Zr oxide, Sr oxide, Yr oxide, La oxide, V oxide, Al oxide, Y oxide, Sc oxide, Sm oxide, Ga oxide, In oxide, SrTi oxide, ZnSn oxide, a mixture thereof, and a composite thereof. A thickness of the electron transport film may be substantially 10 nm or more, more substantially 10 nm to 100 nm, and more substantially 50 nm to 100 nm.

The electron transport structure may be formed by application or vapor deposition. Specifically, the electron transport structure may be prepared by applying a solution in which an electron transport structure is dissolved or a dispersion liquid (or slurry) in which the electron transport structure is dispersed, and drying or selectively heat-treating the dried product. Specifically, the vapor deposition may be performed by physical vapor deposition or chemical vapor deposition.

When a porous electron transport structure is described in detail as an example, the electron transport structure may be prepared by applying a slurry containing metal oxide grains on the first electrode, followed by drying and heat-treatment. The slurry may be applied by one or more methods selected from screen printing; spin coating; bar coating; gravure coating; blade coating; and roll coating.

However, the electron transport structure may be formed by using a method for forming a porous electron transport structure of a metal oxide known in a conventional dye-sensitized solar cell or an organic solar cell.

The first surface layer may refer to a region in the first structure where the first structure is exposed to the surface in contact with the atmosphere when viewed in a stacked direction, with reference to the stacked direction from the electron transport structure to the first substrate. That is, the first structure provided with the first surface layer may refer to a structure in which a surface region containing at least one of i) an inorganic/organic hybrid perovskite compound, ii) an organic halide, iii) a metal halide, iv) an inorganic/organic hybrid perovskite compound precursor, and v) a metal halide precursor, is present.

The first surface layer may be a dense film, a porous film or a stacked film thereof or may be a coating film that coats a surface of the electron transport structure. The porous film may have a porosity (apparent porosity) of more than 0 to 65%.

Specifically, when the electron transport structure is a dense layer, the first surface layer may be a dense film, a porous film, or a stacked film thereof positioned on the dense layer of the electron transport structure.

Specifically, when the electron transport structure is a porous layer, the first surface layer may be a coating film that coats surfaces of the electron transport structure including the surface by pores, a dense film filling the pores of the electron transport structure and covering the electron transport structure, a porous film filling the pores of the electron transport structure and covering the electron transport structure, or a stacked film of a dense film and a porous film filling the pores of the electron transport structure and covering the electron transport structure.

Here, the porous film may include an island structure in which grains that form the film are not connected to each other continuously. That is, when a structure in which the pores of the porous electron transport structure are filled with the material of the first surface layer containing at least one of the materials i) to v) is referred to as a composite layer, a projection structure formed of the material of the first surface layer and protruding to the upper part of the composite layer may also be included in the category of the porous Film. It should be recognized that such a protruding structure includes a pillar structure described in Applicants' Patent Laid-Open Publication No. 10-2014-0035285, No. 10-2014-0035284 or No. 10-2014-0035286, the disclosure of which is incorporated herein by reference in its entirety.

A thickness of the first surface layer may be appropriately controlled in consideration of an amount or a thickness of the light absorber (or light absorbing layer) designed in the solar cell to be manufactured.

As a specific and non-limiting example, the thickness of the first surface layer positioned on the electron transport structure having a dense film structure may be 1 nm and 10 µm.

As another specific and non-limiting example, in the case of the electron transport structure having a porous structure, the first surface layer may have a structure of a porous film, a dense film, or a stacked film thereof filling pores of the electron transport structure and covering an upper part of the electron transport structure. Here, a thickness of the film covering the upper part of the electron transport structure may be 1 nm to 10 µm.

The first surface layer may be manufactured using the above-described method for manufacturing the surface layer.

The second structure may be a structure in which the second surface layer containing at least one of the materials i) an inorganic/organic hybrid perovskite compound, ii) an organic halide, iii) a metal halide, iv) an inorganic/organic hybrid perovskite compound precursor, and v) a metal halide precursor, is present.

The second structure may include a second substrate that is a support for supporting at least the second surface layer. In addition, the second structure may have a state in which the components positioned under the light absorber which is the perovskite compound of the devices (solar cell, etc.) to be manufactured on the second substrate, are previously formed. In a specific example, the second structure may have a structure of a second substrate, a second electrode positioned on the second substrate, and a second surface layer positioned on the second electrode, or the second structure may have a structure of a second substrate; a second electrode positioned on the second substrate; a hole transport structure positioned on the second electrode; and a second surface layer positioned on the hole transport structure.

The second substrate may be a rigid substrate or a flexible substrate. In addition, the second substrate may be a transparent substrate. As a specific example, the second substrate may be a rigid substrate including a glass substrate or a flexible substrate including polyethylene terephthalate (PET); polyethylene naphthalate (PEN); polyimide (PI); polycarbonate (PC); polypropylene (PP); triacetylcellulose (TAC); polyether sulfone (PES), etc. However, the present invention is not limited by the kind of the second substrate.

The second electrode is any conductive electrode that is ohmic-bonded to the hole transport structure, and a material thereof may be any material commonly used as an electrode material of a front electrode or a rear electrode in a solar cell. As a non-limiting example, when the second electrode is an electrode material of the rear electrode, the second electrode may be one or more materials selected from gold, silver, platinum, palladium, copper, aluminum, carbon, cobalt sulfide, copper sulfide, nickel oxide, and a composite thereof. As a non-limiting example, when the second electrode is a transparent electrode, the second electrode may be an inorganic conductive electrode such as fluorine doped tin oxide (FTO), indium doped tin oxide (ITO), ZnO, carbon nanotube (CNT), and graphene, or an organic conductive electrode such as PEDOT:PSS. When a transparent solar cell is to be provided, the second electrode is preferably a transparent electrode, and when the second electrode is an organic conductive electrode, it is more preferred when a flexible solar cell or a transparent solar cell is attempted to be provided.

The second electrode may be formed using vapor deposition or coating on a rigid substrate or a flexible substrate. The vapor deposition may be formed by physical vapor deposition or chemical vapor deposition, and may be formed by thermal evaporation. The application may be performed by applying a solution in which the electrode material is dissolved or a dispersion solution of the electrode material on the substrate, followed by drying, or by heat-treating the selectively dried film. However, the second electrode may be formed by using a method for forming a front electrode or a rear electrode in a conventional solar cell.

When the second structure includes a hole transport structure, the hole transport structure may be an organic hole transport structure, an inorganic hole transport structure, or a laminate thereof.

When the hole transport structure includes an inorganic hole transport structure, the inorganic hole transport structure may be formed of an oxide semiconductor, a sulfide semiconductor, a halide semiconductor, or a mixture thereof, which is a p-type semiconductor having hole conductivity.

Examples of the oxide semiconductor may include NiO, CuO, $CuAlO_2$, $CuGaO_2$, etc., examples of the sulfide semiconductor may include PbS, and examples of the halide semiconductor may include $PbI_2$, etc. However, the present invention is not limited to the inorganic hole transport structure.

The hole transport structure may be a porous layer (porous film) or a dense layer (dense film). The dense hole transport structure may be a dense film of the above-described p-type semiconductor, and the porous hole transport structure may be a porous film formed of p-type semiconductor grains. Here, a structure in which the electron transport structure of the porous film and the hole transport structure of the porous film are simultaneously included, the pores of the electron transport structure and the pores of the hole transport structure are filled by the perovskite compound which is the light absorber, respectively, and the film of the perovskite compound may be intercalated between the electron transport structure and the hole transport structure is a structure in which the first structure and the second structure are each independently manufactured, and then the two structures are bonded to each other to manufacture a device including a solar cell according to an exemplary embodiment of the present invention.

A thickness of the inorganic hole transport structure may be 50 nm to 10 μm, specifically 10 nm to 1000 nm, and more specifically 50 nm to 1000 nm. When the hole transport structure is porous, a specific surface area may be 10 to 100 $m^2/g$, and an average diameter of the p-type semiconductor grains forming the hole transport structure may be 5 to 500 nm. A porosity (apparent porosity) of the porous hole transport structure may be 30% to 65%, and specifically 40% to 60%.

When the hole transport structure includes an organic hole transport structure, the organic hole transport structure may include an organic hole transport material, specifically, a monomolecular to polymeric organic hole transport material (hole conductive organic material). The organic hole transport material may be any organic hole transport material as long as it is used in a conventional inorganic semiconductor-based solar cell using an inorganic semiconductor quantum dot as dye. However, in view of energy matching and stability with a light absorber that is a perovskite compound, a polymeric organic hole transport material is preferable.

A non-limiting example of the monomolecular to polymeric organic hole transport material may be one or two or more materials selected from pentacene, coumarin 6 [3-(2-benzothiazolyl)-7-(diethylamino)coumarin], ZnPC (zinc phthalocyanine), CuPC (copper phthalocyanine), TiOPC (titanium oxide phthalocyanine), spiro-MeOTAD (2,2',7,7'-tetrakis(N,N-p-dimethoxyphenylamino)-9,9'-spirobifluorene), F16CuPC (copper(II) 1,2,3,4,8,9,10,11,15,16,17,18, 22,23,24,25-hexadecafluoro-29H,31H-phthalocyanine), SubPc (boron subphthalocyanine chloride), and N3(cis-di(thiocyanato)-bis(2,2'-bipyridyl-4,4'-dicarboxylic acid)-ruthenium(II)), but is not limited thereto.

The organic hole transport material is preferably a polymer (hole conductive polymer), and thus, stable solar cell operation may be assured, and further improved power generation efficiency may be obtained by energy matching with the light absorber. Specifically, the hole conductive polymer may be one or two or more materials selected from thiophene-based, paraphenylene vinylene-based, carbazole-based, and triphenylamine-based materials, preferably, one or two or more selected from thiophene-based, and triphenylamine-based materials, and more preferably, a triphenylamine-based material. As a non-limiting example, the polymeric organic hole transport material may be one or two or more materials selected from P3HT(poly[3-hexylthiophene]), MDMO-PPV(poly[2-methoxy-5-(3',7'-dimethyloctyloxyl)]-1,4-phenylene vinylene), MEH-PPV(poly[2-methoxy-5-(2"-ethylhexyloxy)-p-phenylene vinylene]), P3OT(poly(3-octyl thiophene)), POT(poly(octyl thiophene)), P3DT(poly(3-decyl thiophene)), P3DDT(poly(3-dodecyl thiophene), PPV(poly(p-phenylene vinylene)), TFB (poly(9,9'-dioctylfluorene-co-N-(4-butylphenyl)diphenyl amine), polyaniline, spiro-MeOTAD ([2,22',7,77'-tetrkis (N,N-di-p-methoxyphenyl amine)-9,9,9'-spirobi fluorine]), PCPDTBT(Poly[2,1,3-benzothiadiazole-4,7-diyl[4,4-bis(2-ethylhexyl-4H-cyclopenta [2,1-b:3,4-b']dithiophene-2,6-diyl]], Si-PCPDTBT(poly[(4,4'-bis(2-ethylhexyl)dithieno [3,2-b:2',3'-d]silole)-2,6-diyl-alt-(2,1,3-benzothiadiazole)-4, 7-diyl]), PBDTTPD(poly((4,8-diethylhexyloxyl) benzo([1, 2-b:4,5-b']dithiophene)-2,6-diyl)-alt-((5-octylthieno[3,4-c] pyrrole-4,6-dione)-1,3-diyl)), PFDTBT(poly[2,7-(9-(2-ethylhexyl)-9-hexyl-fluorene)-alt-5,5-(4',7,-di-2-thienyl-2', 1',3'-benzothiadiazole)]), PFO-DBT(poly[2,7-.9,9-(dioctyl-fluorene)-alt-5,5-(4',7'-di-2-.thienyl-2',1',3'-benzothiadiazole)]), PSiFDTBT(poly[(2,7-dioctylsilafluorene)-2,7-diyl-alt-(4,7-bis(2-thienyl)-2,1,3-benzothiadiazole)-5,5'-diyl]), PSBTBT(poly[(4,4'-bis(2-ethylhexyl)dithieno[3,2-b:2',3'-d]silole)-2,6-diyl-alt-(2,1,3-benzothiadiazole)-4,7-diyl]), PCDTBT(poly[[9-(1-octylnonyl)-9H-carbazole-2,7-diyl]-2,5-thiophenediyl-2,1, 3-benzothiadiazole-4,7-diyl-2,5-thiophenediyl]), PFB(poly (9,9'-dioctylfluorene-co-bis(N,N'-(4,butylphenyl))bis(N,N'-phenyl-1,4-phenylene)diamine), F8BT(poly(9,9'-dioctylfluorene-co-benzothiadiazole), PEDOT (poly(3,4-ethylenedioxythiophene)), PEDOT:PSS (poly(3,4-ethylenedioxythiophene) poly(styrenesulfonate)), PTAA (poly(triarylamine)), poly(4-butylphenyl-diphenyl-amine), and a copolymer thereof.

As a non-limiting and specific example, the hole transport structure may be a thin film of an organic hole transport material, and the thin film may have a thickness of 10 nm to 500 nm.

The organic hole transport structure may further include an additive conventionally used for improving properties such as conductivity improvement of an organic material-based hole conductive layer in a conventional inorganic semiconductor-based solar cell using an inorganic semiconductor quantum dot as a dye. As a non-limiting example, the hole transport structure may further contain one or two or more additives selected from tertiary butyl pyridine (TBP), lithium bis(trifluoro methanesulfonyl)imide (LiTFSI), and tris(2-(1H-pyrazol-1-yl) pyridine)cobalt (III), and may contain 0.05 mg to 100 mg of additive per 1 g of the organic hole transport material. However, the present invention may not be limited by presence or absence of the additive in the hole transport structure, the kind of the additive, and a content of the additive.

The hole transport structure may include an inorganic hole transport structure which is a dense film of the above-described p-type semiconductor; an inorganic hole transport structure which is a porous film formed of p-type semiconductor grains; a laminate of the inorganic hole transport structure which is the porous film and the inorganic hole transport structure which is the dense film; or a laminate of the inorganic hole transport structure which is the dense film or the porous film and the organic hole transport structure which is the dense film.

When the hole transport structure is formed of an organic material, the hole transport structure may be formed by applying and drying a solution containing an organic hole transport material (hereinafter, referred to as organic hole transport solution). The coating may be performed by spin coating. The solvent used for forming the hole transport structure may be any solvent that the organic hole transport material is dissolved. However, the hole transport structure may be formed by a method generally used for forming an n-type organic layer or a p-type organic layer in an organic solar cell.

The hole transport structure may be formed by coating or vapor deposition when the hole transport structure is an inorganic material which is a p-type semiconductor.

Specifically, the hole transport structure may be prepared by applying a solution in which a hole transport structure is dissolved or a dispersion liquid (or slurry) in which the hole transport structure is dispersed, and drying or selectively heat-treating the dried product. The vapor deposition may be performed by physical vapor deposition or chemical vapor deposition.

When describing a specific example of the porous hole transport structure in detail, the hole transport structure may be prepared by applying, drying and heat-treating a slurry containing p-type semiconductor grains on the second electrode. The slurry may be applied by one or more methods selected from screen printing; spin coating; bar coating; gravure coating; blade coating; and roll coating.

After the hole transport structure is formed, the surface layer may be formed on the hole transport structure using the above-described method for manufacturing a surface layer, thereby manufacturing the second structure.

Even though a specific example of the method for manufacturing a device is provided by way of example of the manufacture of the solar cell using the first structure and the second structure, it is needless to say that the device manufactured by the present invention may not be limited to the solar cell.

In an example of the above-described perovskite compound-based solar cell, it is possible to manufacture a transparent solar cell by implementing only the first substrate, the second substrate, the first electrode and the second electrode as transparent substrates and transparent electrodes (transparent conductive materials). In this case, a 4-terminal tandem structure may be implemented by simply stacking a perovskite compound-based transparent solar cell on an upper part of a conventionally used non-perovskite compound-based solar cell.

In addition to the structure in which respective solar cells that are individually operated are stacked, the manufacture of a device using the first structure and the second structure provided by the present invention is very advantageous for complexation (hybridization) with other elements that are not based on the perovskite compound.

That is, the first surface layer of the first structure and the second surface layer of the second structure may be converted to a single and integral inorganic/organic perovskite hybrid compound film, and since the first structure and the second structure form an integral device, another conventional device may be formed under the surface layer (the first surface layer or the second surface layer) of the structure (the first structure or the second structure), thereby extremely facilitating hybridization between a perovskite-based device and the another device.

As an example of a 2-terminal tandem solar cell, a specific example of hybridization between the perovskite compound-based device and the non-perovskite compound-based device by changing the component under the surface layer of the structure, is described. However, an example of the 2-terminal tandem solar cell provides an example of effective hybridization, which is provided for clear understanding of complexation with the conventional non-perovskite compound-based device. Those skilled in the art related to an electronic device, a light emitting device, a sensor, a memory device, etc., may easily implement hybridization with various non-perovskite compound-based devices, based on the specific examples of hybridization to be described below.

Hereinafter, the hybridization is described based on a case where components of the non-perovskite compound-based solar cell to be hybridized with the perovskite compound-based solar cell are formed on the second structure.

In the case of the perovskite compound, photoelectrons and photoholes are generated by absorbing light having a relatively short wavelength as compared to other light absorber materials for a solar cell. Accordingly, it is preferable that at the time of hybridization, the perovskite compound-based solar cell is positioned on a light receiving side, and the non-perovskite compound-based solar cell is positioned under the perovskite compound-based solar cell. Specifically, the light absorbing layer (second light absorbing layer) of the non-perovskite compound positioned under the light absorbing layer (first light absorbing layer) of the perovskite compound preferably includes a light absorber that absorbs light of a wavelength band of at least 800 nm or more and generates photoelectrons and photoholes.

In this regard, the first structure may include a first substrate which is a transparent substrate, a first electrode which is a transparent electrode positioned on the first substrate, a charge transport structure (an electron transport structure or a hole transport structure) positioned on the first electrode, and a first surface layer positioned on the charge transport structure. The second structure on which the basic structure of the device to be hybridized is implemented may include a second electrode, an inorganic light absorbing layer which is positioned on the second electrode and absorbs light of 800 nm or more to generate electrons and holes, a bonding layer positioned on the inorganic light absorbing layer, and a second surface layer positioned on the bonding layer.

The first structure and the second structure may be stacked so that the first surface layer and the second surface layer are in contact with each other, and the first surface layer and the second surface layer may be converted to a single perovskite compound film by applying energy and physical force, and thus, a solar cell having a two-terminal tandem structure including a light absorbing layer-a charge transport structure-a transparent electrode-a transparent substrate of a second electrode-an inorganic light absorbing layer-a bonding layer-a perovskite compound film may be manufactured.

More specifically, the first structure may include a first substrate which is a transparent substrate, a first electrode which is a transparent electrode positioned on the first substrate, a first charge transport structure positioned on the first electrode, and a first surface layer positioned on the first charge transport structure. Together with the first structure, the second structure may include a second electrode, an inorganic light absorbing layer that is positioned on the second electrode and absorbs light of 800 nm or more to generate electrons and holes, a bonding layer positioned on the inorganic light absorbing layer, a second charge transport structure positioned on the bonding layer, and a second surface layer positioned on the second charge transport structure. Here, the first charge transport structure and the second charge transport structure transfer complementary charges, and when the first charge transport structure is an electron transport structure for moving electrons, the second charge transport structure may be a hole transport structure for moving holes.

The inorganic light absorbing layer may be a non-perovskite compound-based light absorbing layer. In detail, the inorganic light absorbing layer may be an inorganic semiconductor layer. The inorganic semiconductor of the inorganic semiconductor layer may include a Group 4 semiconductor including silicon (Si), germanium, silicon germanium (SiGe), etc.; a Group 3-5 semiconductor including gallium arsenide (GaAs), indium phosphorus (InP), gallium phosphorus (GaP), gallium indium phosphorus (GaInP$_2$), indium gallium arsenide (TnGaAs), etc.; a Group 2-6 semiconductor including cadmium sulfide (CdS) or zinc telluride (ZnTe); or a Group 4-6 semiconductor including lead sulfide (PbS), or a metal chalcogen compound semiconductor including a copper-indium-chalcogen compound, a copper-indium-gallium-chalcogen compound, etc.

Crystallographically, the inorganic light absorbing layer may be monocrystalline, polycrystalline or amorphous.

The inorganic light absorbing layer may be a layer of a single inorganic semiconductor material, but is not limited thereto. Inorganic light absorbing layers formed of different materials may have a structure in which they are bonded through a tunneling junction, that is, the inorganic light absorbing layer itself may have a known tandem structure.

The light absorbing layer may have a p-n junction structure or a p-i(intrinsic)-n junction structure. In addition, an intrinsic semiconductor containing a quantum dot may also be provided as the light absorbing layer. For example, the intrinsic semiconductor layer containing a quantum dot may be a layer in which a quantum dot of Si, Ge, SiGe, phosphide (P)-based compound semiconductor, arsenide (As)-based compound semiconductor or nitride (N)-based compound semiconductor is formed in a medium which is a semiconductor. The semiconductor layer containing the quantum dot may be manufactured using a method for forming a quantum dot commonly used in the field of inorganic solar cells, and as a practical example, a self-assembled quantum dot method in which it is assembled into the quantum dot itself for stress relaxation, etc., may be used.

The bonding layer is a layer for bonding the inorganic light absorbing layer and the light absorbing layer of the perovskite compound to each other. A material and a thickness of the bonding layer may be sufficient as long as a material and a thickness are generally used for bonding between the light absorbing layers having different band gaps from each other in a conventionally known solar cell having a tandem structure. As known in the art, the bonding layer may be a conductive layer or a tunnel bonding layer. More specifically, the bonding layer may include a thin light-permeable metal layer such as Au, Ag, Al, Cu, or the like, an oxide transparent conductive layer such as Sn:In$_2$O$_3$ (ITO), Sb:SnO$_2$ (ATO), Al:ZnO (AZO), or the like, a carbon layer such as graphene, graphene oxide, or the like, an organic conductive layer such as PEDOT:PSS, or the like, or an amorphous oxide semiconductor layer such as titanium oxide, and molybdenum oxide, or a composite layer thereof, but the present invention is not limited thereto. A thickness of the bonding layer may be about 0.5 nm to 50 nm, substantially 0.5 nm to 20 nm.

Hereinafter, a specific example for hybridization with a solar cell based on a p-n junction such as silicon is provided. However, the specific example is provided for clearer understanding of hybridization, by presenting a practical example for hybridization with the solar cell based on a p-n junction. It is obvious that those skilled in the art relating to a tandem solar cell may also easily implement the hybridization with various solar cells such as a solar cell based on a p-i-n junction on the basis of following practical examples.

The first structure may include a first substrate which is a transparent substrate, a front electrode (first electrode) which is a transparent electrode positioned on the first substrate, a first charge transport structure positioned on the front electrode (first electrode) and providing a photocurrent movement path, and a first surface layer positioned on the first charge transport structure.

The second structure may include a semiconductor substrate in which a back surface field (BSF) layer forming an emitter layer and a rear electric field is formed, and a rear electrode (second electrode) electrically connected to the BSF layer of the semiconductor substrate, and may include a bonding layer positioned on the emitter layer, a second charge transport structure positioned on the bonding layer and providing the photocurrent movement path, and a second surface layer positioned on the second charge transport structure.

As a specific example, in the semiconductor substrate, a first conductive type impurity is doped on a surface, thereby forming a first conductive type layer, and a second conductive type impurity is doped on a surface facing the surface on which the first conductive type layer is formed, thereby forming a second conductive type layer. Here, the semiconductor substrate itself also preferably has a first conductive type or a second conductive type. When the first conductive type layer is an emitter layer, the second conductive type layer may be a BSF layer, and when the second conductive type layer is an emitter layer, the first conductive type layer may be a BSF layer.

When the first conductive type is a P type, the second conductive type which is a conductive type complementary to the first conductive type is an N type, and when the first conductive type is an N type, the second conductive type is a P type. Further, when the first conductive type impurity is a donor type impurity, the second conductive type impurity is an acceptor type impurity, and when the first conductive type impurity is an acceptor type impurity, the second conductive type impurity is a donor type impurity. As known in the art, in an example of the silicon semiconductor, the acceptor type impurity may include boron (B), aluminum (Al), or the like, the donor type impurity may include phosphorous (P), germanium (Ge), or the like.

In detail, the first structure may include a first substrate which is a transparent substrate, a front electrode (first electrode) which is a transparent electrode positioned on the first substrate, a first charge transport structure positioned on the front electrode (first electrode) and providing a hole movement path, and a first surface layer positioned on the first charge transport structure. In addition, the second structure may include an n-type semiconductor substrate in which a p-type emitter layer is formed by doping the p-type impurity on the surface, and an n-type BSF layer is formed by doping the n-type impurity on a surface facing the surface on which the p-type emitter layer is formed, a rear electrode electrically connected to the BSF layer of the n-type semiconductor substrate, a bonding layer positioned on the p-type emitter layer, a second charge transport structure positioned on the bonding layer and providing an electron movement path, and a second surface layer positioned on the second charge transport structure.

Independently, in detail, the first structure may include a first substrate which is a transparent substrate, a front electrode (first electrode) which is a transparent electrode positioned on the first substrate, a first charge transport structure positioned on the front electrode (first electrode) and providing an electron movement path, and a first surface layer positioned on the first charge transport structure. In addition, the second structure may include a p-type semiconductor substrate in which an n-type emitter layer is formed by doping the n-type impurity on the surface, and a p-type BSF layer is formed by doping the p-type impurity on a surface facing the surface on which the n-type emitter layer is formed, a rear electrode electrically connected to the BSF layer of the p-type semiconductor substrate, a bonding layer positioned on the n-type emitter layer, a second charge transport structure positioned on the bonding layer and providing a hole movement path, and a second surface layer positioned on the second charge transport structure.

As known in the art, a dielectric film such as an anti-reflection film and/or a passivation film may be formed on the surface of the substrate on which the BSF layer of the semiconductor substrate is formed. The rear electrode (second electrode) may penetrate the dielectric film through a punch-through phenomenon to be electrically connected to the BSF layer. As an example of the silicon solar cell, the dielectric film may be a single film or a stacked film of two or more selected from a silicon nitride film, a silicon nitride film containing hydrogen, a silicon nitride film containing hydrogen, a silicon oxynitride film, a silicon oxide film, an $Al_2O_3$ film, a $MgF_2$ film, a ZnS film, a $MgF_2$ film, a $TiO_2$ film, and a $CeO_2$ film.

The rear electrode may include a conductive material and a glass frit. As a typical example, the conductive material may include one or two or more selected from silver (Ag), copper (Cu), titanium (Ti), gold (Au), tungsten (W), nickel (Ni), chromium (Cr), molybdenum (Mo), platinum (Pt), lead (Pb), palladium (Pd), and an alloy thereof. The glass frit may include lead glass containing lead oxide, lead-free glass containing bismuth oxide and boron oxide, etc., that are commonly used to form a solar cell electrode.

The emitter layer or the BSF layer may be formed by doping impurities on the semiconductor substrate, as commonly known in a process for manufacturing a semiconductor. As known in the art, doping of the impurities may be performed by heat treatment of a semiconductor substrate in the presence of a gas containing impurities used for doping, or by using a solid-state source or a spray-on-diffusion type source containing impurities used for doping.

The rear electrode may be formed by applying an electrode material to a semiconductor substrate on which the emitter layer and the BSF layer are formed, and the electrode material may be applied by inkjet printing, masking, stencil, screen printing, or the like. Here, the dielectric film which is the anti-reflection film and/or the passivation film may be further formed on the BSF layer of the semiconductor substrate, and the electrode material may be applied on the dielectric film in a fish bone structure or an interdigitate structure, and may penetrate through the dielectric film by heat treatment to be electrically connected to the BSF layer.

The bonding layer is for bonding the inorganic light absorbing layer and the light absorbing layer of the perovskite compound to each other, and a material thereof may be a material generally used in a conventional solar cell having a tandem structure. More specifically, the bonding layer may include a thin light-permeable metal layer such as Au, Ag, Al, Cu, or the like, an oxide transparent conductive layer such as $Sn:In_2O_3$ (ITO), $Sb:SnO_2$ (ATO), Al:ZnO (AZO), or the like, a carbon layer such as graphene, graphene oxide, or the like, an organic conductive layer such as PEDOT:PSS, or the like, or an amorphous oxide semiconductor layer such as titanium oxide, and molybdenum oxide, or a composite layer thereof, and may have a thickness of 0.5 nm to 50 nm, substantially 0.5 nm to 20 nm. However, the present invention is not limited by the material and the thickness of the bonding layer. The bonding layer may be formed through conventional physical vapor deposition, chemical vapor deposition, or the like.

Hereinafter, a specific example for hybridization with a solar cell based on a metal chalcogen compound is provided.

The first structure may include a first substrate which is a transparent substrate, a front electrode (first electrode) which is a transparent electrode positioned on the first substrate, a first charge transport structure positioned on the front electrode (first electrode) and providing a photocurrent movement path, and a first surface layer positioned on the first charge transport structure.

The second structure may include a second substrate, a second electrode positioned on the second substrate, an inorganic light absorbing layer of the metal chalcogen compound positioned on the second electrode, a buffer layer positioned on the inorganic light absorbing layer, a bonding layer positioned on the buffer layer, a second charge transport structure positioned on the bonding layer, and a second surface layer positioned on the second charge transport structure. Further, the second structure may further include a window layer between the buffer layer and the bonding layer.

In detail, the first structure may include a first substrate, a front electrode (first electrode) which is a transparent electrode positioned on the first substrate, a first charge transport structure positioned on the front electrode (first electrode) and providing an electron movement path, and a first surface layer positioned on the first charge transport structure. Together with the first structure, the second structure may include a second substrate, a second electrode positioned on the second substrate, an inorganic light absorbing layer of the metal chalcogen compound positioned on the second electrode, a buffer layer positioned on the inorganic light absorbing layer, a bonding layer positioned on the buffer layer, a second charge transport structure positioned on the bonding layer and providing a hole movement path, and a second surface layer positioned on the second charge transport structure.

The metal chalcogen compound may mean a chalcogen compound containing copper and one or more elements selected from Group 12 to Group 14. Specifically, the metal chalcogen compound may include a copper-indium-gallium-chalcogen compound or a copper-zinc-tin-chalcogen compound. More specifically, the metal chalcogen compound may be CIGS(Cu—In—Ga—Se or Cu—In—Ga—S), CIGSS(Cu—In—Ga—Se—S), CZTS(Cu—Zn—Sn—Se or Cu—Zn—Sn—S) or CZTSS(Cu—Zn—Sn—Se—S). More specifically, the metal chalcogen compound may be $CuIn_{1-x}Ga_{1-x}Se_2$ (x is a real number of $0 \leq x \leq 1$), $CuIn_xGa_{1-x}S_2$ (x is a real number of $0 \leq x \leq 1$), $CuIn_xGa_{1-x}(Se_yS_{1-y})_2$ (x is a real number of $0 \leq x \leq 1$, and y is a real number of $0 \leq y \leq 1$), $Cu_2Zn_xSn_{1-x}Se_4$ (x is a real number of $0 \leq x \leq 1$), $Cu_2Zn_xSn_{1-x}S_4$ (x is a real number of $0 \leq x \leq 1$) or $Cu_2Zn_xSn_{1-x}(Se_yS_{1-y})_4$ (x is a real number of $0 \leq x \leq 1$, and y is a real number of $0 \leq y \leq 1$), but is not limited thereto.

The second electrode may be formed of any material as long as it is a conductive material that is ohmic-bonded to the metal chalcogen compound. As known in the art, the second electrode may be molybdenum or molybdenum doped with a doping element such as Na, K, Ag, Sb, Al, and/or Cu, etc.

The buffer layer is a layer preventing extinction due to recombination of electrons and holes in the metal chalcogen compound-based solar cell and reducing a bandgap difference between the conventional window layer and the light absorbing layer of the metal chalcogen compound. The buffer layer may be formed of any material as long as it is a material positioned between the light absorbing layer and the window layer (transparent electrode layer) in order to perform the above-described role in the conventional metal chalcogen compound-based solar cell. As a specific and non-limiting example, the buffer layer may include one or more materials selected from CdS, Zn(O,S), ZnSe, $In_2S_3$, $ZnIn_xSe_y$ ($0 \leq x \leq 1$, $0 \leq y \leq 1$, and x and y are real numbers), and $Zn_{1-x}Mg_xO$ ($0 \leq x \leq 1$, and x is a real number), but is not limited thereto. A thickness of the buffer layer is not particularly limited, but may be 10 nm to 1000 nm, and specifically, 30 nm to 800 nm.

The bonding layer may be implemented using a material used as the window layer (transparent electrode layer) of the conventional metal chalcogen compound-based solar cell. Otherwise, the window layer may be formed between the bonding layer and the buffer layer of the second structure, and then, the metal layer may be used as the bonding layer.

Specifically, when the bonding layer is a material of the window layer of the conventional metal chalcogen compound-based solar cell, the bonding layer may be ZnO, aluminum-doped zinc oxide (AZO), Ga-doped zinc oxide (GZO), boron-doped zinc oxide (BZO), indium tin oxide (ITO), fluorinated tin oxide (FTO), etc. When the window layer is further provided between the bonding layer and the buffer layer of the second structure, the bonding layer may include a thin light-permeable metal layer such as Au, Ag, Al, Cu, or the like, an oxide transparent conductive layer such as $Sn:In_2O_3$ (ITO), $Sb:SnO_2$ (ATO), Al:ZnO (AZO), or the like, a carbon layer such as graphene, and graphene oxide, an organic conductive layer such as PEDOT:PSS, or an amorphous oxide semiconductor layer such as titanium oxide, and molybdenum oxide, or a composite layer thereof, and may have a thickness of 0.5 nm to 50 nm, substantially 0.5 nm to 20 nm, but the thickness is not limited thereto.

The second electrode may be formed on the substrate using conventional vapor deposition, specifically sputtering, vacuum evaporation, chemical vapor deposition (CVD), spin coating, spray coating, or the like. The light absorbing layer of the metal chalcogen compound may be formed by a known method for the light absorbing layer. For example, the light absorbing layer may be manufactured by using simultaneous evaporation, sputtering+selenization, electrodeposition, ink printing in which a precursor ink in powder or colloid state is applied, followed by reaction and sintering, spray pyrolysis, or the like.

The buffer layer, optionally the window layer (transparent electrode layer), and the bonding layer, may be each independently formed by methods including chemical bath deposition (CBD), electron beam coating, sputtering and chemical vapor deposition. However, the method may be any method known for forming a film using a gas phase, a liquid phase, or a dispersed phase in the field for manufacturing a semiconductor or in the field for manufacturing a solar cell.

In the semiconductor solar cell and the metal chalcogen compound-based solar cell based on the p-n junction described above, the first charge transport structure of the first structure and the second charge transport structure of the second structure may correspond to the electron transport structure and the hole transport structure described above. That is, when the first charge transport structure (or the second charge transport structure) is a charge transport structure providing the hole movement path, the first charge transport structure (or the second charge transport structure) may correspond to the hole transport structure described above, and when the first charge transport structure (or the second charge transport structure) is a charge transport structure providing the electron movement path, the first charge transport structure (or the second charge transport structure) may correspond to the electron transport structure described above. However, when the first charge transport structure corresponds to the hole transport structure, the second charge transport structure may correspond to the electron transport structure, and when the first charge transport structure corresponds to the electron transport structure, the second charge transport structure may correspond to the hole transport structure. Further, as described above, when the first charge transport structure corresponds to the hole transport structure, an emitter of the semiconductor substrate may be a p-type emitter, and when the first charge transport structure corresponds to the electron transport structure, the emitter of the semiconductor substrate may be an n-type emitter.

In addition, the surface layer (the first surface layer or the second surface layer) positioned on the first charge transport structure (or the second charge transport structure) may correspond to the surface layer positioned on the electron transport structure or the hole transport structure described above. That is, a structure of rear electrode-semiconductor substrate in which the emitter layer and the BSF layer are formed-bonding layer may correspond to the above-described substrate. That is, the structure of substrate-second electrode-metal chalcogen compound-buffer layer-bonding layer may correspond to the above-described substrate.

Accordingly, in embodiments of the tandem structure, the structure, the material, and the manufacturing method of the transparent substrate, the transparent electrode, the first charge transport structure, the first surface layer, the second charge transport structure, and the second surface layer include all of the above-described contents in an example of the solar cell including the above-described perovskite compound film as the light absorbing layer.

The first structure and the second structure may be stacked so that the first surface layer of the first structure and the second surface layer of the second structure are in contact with each other, and heat and physical force may be applied to the laminate of the first structure and the second structure, and thus, binding of the first structure and the second structure, and conversion of the first surface layer and the second surface layer to the single perovskite compound film may be performed at the same time.

When heat is applied to the laminate of the first structure and the second structure without applying physical force, there is a limitation in converting the first and second surface layers to a dense single film, and it is difficult to convert to a dense single film through a low temperature process of 250 or less, and specifically, 200 or less. Further, when physical force is applied to the laminate of the first structure and the second structure without applying heat energy, it is difficult to overcome an activation energy required for densification of the materials existing in the surface layer or grain growth, and thus, it is substantially difficult to convert the first surface layer and the second surface layer to a dense single film.

That is, by simultaneously applying heat and physical force, the first surface layer and the second surface layer may be converted to a high-quality single dense perovskite compound layer, and this conversion may be performed even at a low temperature of 250□ or lower, and specifically 200□ or lower.

The physical force applied to the laminate of the first structure and the second structure is preferably a compressive force, and it is preferable that the physical force is a uni-directional compressive force. Unidirection of the uni-directional compressive force may mean a compressive force in the same direction as a stacking direction of the first structure and the second structure (including both a direction from the first substrate to the second substrate and a direction from the second substrate to the first substrate). The uni-directional compressive force may have a state in which the surface layer (the first surface layer or the second surface layer) is already bonded to the lower component of the surface layer of the structure while forming an interface, and thus, when two-directional compressive force or isotropic compressive forces in different directions are applied, the perovskite compound layer to be converted may rather be damaged, etc., i.e., adversely affected.

The application of the uni-directional compressive force may be represented by pressing, and a configuration of applying heat and physical force to the laminate of the first structure and the second structure may be represented by a configuration of hot-pressing the laminate of the first structure and the second structure.

That is, by hot pressing the laminate of the first structure and the second structure, the first structure and the second structure may be bonded into an integral material, the first surface layer and the second surface layer may be converted to a single perovskite compound layer, and a device including a high-quality dense perovskite compound layer may be manufactured. The hot pressing may be performed by positioning a laminate between two plates including a heating element that generates Joule heat to be respectively heatable and facing each other, and then applying a compressive force to the laminate through the heated two plates.

Specifically, in the first surface layer of the first structure and the second surface layer of the second structure, crystal growth and densification of the material contained in the surface layer (the first surface layer or the second surface layer) may be actively generated in regions of the first surface layer itself, the second surface layer itself, and an entire region of an interface (contact surface) of the first surface layer and the second surface layer by hot-pressing. Accordingly, an integral single film in which the interface between the first surface layer and the second surface layer substantially disappears may be manufactured, a dense film may be manufactured, and a film formed of coarse perovskite compound grains may be manufactured.

Specifically, when a material pair of a material contained in the first surface layer-a material contained in the second surface layer is a perovskite compound-a perovskite compound, due to the hot pressing, the perovskite compound may be grown and densified, the interface between the first surface layer and the second surface layer may disappear, and the first surface layer and the second surface layer may be converted to a single integral layer.

In detail, when the material pair of a material contained in the first surface layer-a material contained in the second surface layer is a perovskite compound-a perovskite compound precursor (or a perovskite compound precursor-a perovskite compound precursor), due to the hot pressing, GM of the perovskite compound precursor may be diffused and removed, nucleation, growth and densification of the perovskite compound may be generated, and the first and second surface layers may be converted to a single integral layer.

In detail, when the material pair of a material contained in the first surface layer—a material contained in the second surface layer is a metal halide precursor—an organic halide, due to the hot pressing, GM' of the metal halide precursor may be diffused and removed, or may be exchanged with the organic halide, nucleation, growth and densification of the perovskite compound may be generated, and the first and second surface layers may be converted to a single integral layer.

In detail, when the material pair of a material contained in the first surface layer-a material contained in the second surface layer is a metal halide-an organic halide, due to the hot pressing, the organic halide and the metal halide may be directly diffused and reacted, nucleation, growth and densification of the perovskite compound may be generated, and the first and second surface layers may be converted to a single integral layer.

According to the manufacturing method of the present invention, a high-quality light absorbing layer may be manufactured, and such a high-quality light absorbing layer may be manufactured at an extremely low processing temperature.

In detail, hot pressing may be performed at a temperature of 250□ or lower. Substantially, the hot pressing may be performed at 50 to 250□, and more substantially, at 100 to 200□. Such a low temperature means that other components of the device are free from thermal damage in manufacturing devices using the first structure and the second structure, and the manufacturing cost is reduced due to the low temperature process. That is, since the high-quality perovskite compound layer may be manufactured by the above-described low-temperature hot-pressing, a material having a very poor thermal resistance property such as polyethylene terephthalate may also be used as the first substrate and/or the second substrate.

In order to effectively provide nucleation and/or growth driving force and induce effective densification, a pressure of the hot pressing may be 1 MPa to 100 MPa, preferably 5 MPa to 100 MPa, more preferably 10 MPa to 100 MPa, and even more preferably 10 MPa to 70 MPa. The pressure is able to easily volatilize and remove the guest molecule (GM or GM') included in the metal halide precursor or the perovskite compound precursor, and to promote densification of the light absorbing layer and crystal growth, and to prevent physical damage to other components such as the porous electron transport structure by excessive compressive force.

At the time of the hot pressing of the first structure and the second structure, the hot pressing of the first structure and the second structure may be performed in a vacuum or normal pressure (1 atm) atmosphere. In detail, the hot pressing may be performed in an atmosphere of 0.01 to 1 atm. Here, the atmosphere in which the hot pressing is performed may be in the air.

The hot pressing may be performed at normal pressure, but a reduced pressure atmosphere is more preferable since it accelerates the volatilization and removal of the guest molecule (GM or GM') included in the metal halide precursor or the perovskite compound precursor.

A time at which the hot pressing is performed is sufficient as long as the surface layer is able to be stably converted to the perovskite compound layer. As a substantial example, the hot pressing may be performed for 5 to 20 minutes, but the time for the hot pressing is not limited thereto.

The present invention includes a device manufactured by the manufacturing method as described above.

The present invention includes a perovskite compound layer manufactured by the manufacturing method as described above.

The present invention includes a laminate for manufacturing a solar cell.

The laminate for manufacturing a solar cell is a laminate in which a solar cell may be manufactured by simply applying heat and physical force to the laminate and converting the first surface layer and the second surface layer to a single perovskite compound layer.

In detail, the laminate for manufacturing a solar cell may include a first structure and a second structure, the first structure including a first substrate, a first electrode positioned on the first substrate, an electron transport structure positioned on the first electrode, and a first surface layer, and the second structure including a second substrate, a second electrode positioned on the second substrate, and a second surface layer, wherein the laminate may be a laminate in which the first surface layer of the first structure and the second surface layer of the second structure are stacked while forming an interface. In other words, the laminate may be a laminate in which the first structure and the second structure are stacked so that the first surface layer of the first structure and the second surface layer of the second structure are in contact with each other.

In the laminate for manufacturing a solar cell, the hole transport structure may not be provided between the second electrode and the second surface layer, and thus, the second electrode may be directly in contact with the second surface layer. In this case, the perovskite compound layer formed from the first surface layer and the second surface layer may simultaneously perform the function of the hole transport structure as well as the function of the light absorber.

However, the hole transport structure is not intentionally excluded from the laminate for manufacturing a solar cell, and the second structure may include the second substrate and the second electrode positioned on the second substrate, the hole transport structure positioned on the second electrode, and the second surface layer positioned on the hole transport structure.

The hole transport structure, and the electron transport structure may be each independently an organic material or an inorganic material, and may be a porous film or a dense film. In the case in which the electron transport structure includes an inorganic electron transport structure of the porous film, when the first surface layer and the second surface layer are converted to the single perovskite compound layer by applying heat and physical force, the perovskite compound may fill pores of the porous electron transport structure (inorganic electron transport structure of the porous film).

Alternatively, the first surface layer itself may form a layer filling the pores of the porous electron transport structure and covering the surface of the porous electron transport structure. Independently, in the case in which the hole transport structure includes an inorganic electron transport structure of the porous film, when the first surface layer and the second surface layer are converted to the single perovskite compound layer by applying heat and physical force, the perovskite compound may fill pores of the porous hole transport structure (inorganic hole transport structure of the porous film). Alternatively, the second surface layer itself may form a layer filling the pores of the porous hole transport structure and covering the surface of the porous hole transport structure.

When both the electron transport structure and the hole transport structure have a porous structure, by applying heat and physical force to the laminate, the perovskite compound may fill the pores of the electron transport structure and the pores of the hole transport structure, respectively, thereby forming the perovskite compound layer in a dense film form which is positioned between the porous electron transport structure and the porous hole transport structure. This structure may also be interpreted as a structure in which the dense film of the perovskite compound is provided between the hole transport structure and the electron transport structure, wherein the perovskite compound penetrates into the pores of the hole transport structure to fill the pores and penetrates into the pores of the electron transport structure to fill the pores. Such a structure is preferable since it expands a contact area between the electron transport structure and the light absorber, and a contact area between the hole transport structure and the light absorber.

The present invention includes a laminate for manufacturing a solar cell having a tandem structure.

The laminate for manufacturing a solar cell having a tandem structure may include a first structure and a second structure, the first structure including a first substrate which is a transparent substrate, a first electrode which is a transparent electrode positioned on the first substrate, a charge transport structure, and a first surface layer, and the second structure including a second electrode, an inorganic light absorbing layer that is positioned on the second electrode and absorbs light of 800 nm or more to generate electrons and holes, a bonding layer positioned on the inorganic light absorbing layer, and a second surface layer, wherein the laminate is a laminate in which the first structure and the second structure are stacked so that the first surface layer of the first structure and the second surface layer of the second structure are in contact with each other. In other words, the laminate may be a laminate in which the first structure and the second structure are stacked so that the first surface layer of the first structure and the second surface layer of the second structure are in contact with each other while forming an interface.

The inorganic light absorbing layer may be a semiconductor layer having a p-n junction formed thereon or a metal chalcogen compound layer.

As an example of the inorganic light absorbing layer of the semiconductor layer on which the p-n junction is formed, the inorganic light absorbing layer of the second structure may include a semiconductor substrate in which an emitter layer and a back surface field (BSF) layer forming a back electric field are formed. Here, the second electrode may be electrically connected to the BSF layer of the semiconductor substrate, and the bonding layer may be positioned on the emitter layer. Further, the second structure may further include a second charge transport structure positioned on the bonding layer.

In detail, the laminate for manufacturing a solar cell having a tandem structure may include a first structure and a second structure, the first structure including a first substrate that is a transparent substrate, a front electrode (first electrode) that is a transparent electrode positioned on the first substrate, a first charge transport structure positioned on the front electrode (first electrode) and providing a photocurrent movement path, and a first surface layer positioned on the first charge transport structure, and the second structure including a semiconductor substrate in which an emitter layer and a back surface field (BSF) layer forming a back electric field are formed, a rear electrode (second electrode) electrically connected to the BSF layer of the semiconductor substrate, a bonding layer positioned on the emitter layer, a second charge transport structure positioned on the bonding layer and providing a photocurrent movement path, and a second surface layer positioned on the second charge transport structure, wherein the laminate may be a laminate in which the first structure and the second structure are stacked so that the first surface layer of the first structure and the second surface layer of the second structure are in contact with each other.

In detail, the first structure of the laminate for manufacturing a solar cell having a tandem structure may include a first substrate which is a transparent substrate, a front electrode (first electrode) which is a transparent electrode positioned on the first substrate, a first charge transport structure positioned on the front electrode (first electrode) and providing a hole movement path, and a first surface layer positioned on the first charge transport structure. In addition, the second structure may include an n-type semiconductor substrate in which a p-type emitter layer is formed by doping the p-type impurity on the surface, and an n-type BSF layer is formed by doping the n-type impurity on a surface facing the surface on which the p-type emitter layer is formed, a rear electrode electrically connected to the BSF layer of the n-type semiconductor substrate, a bonding layer positioned on the p-type emitter layer, a second charge transport structure (electron transport structure) positioned on the bonding layer and providing an electron movement path, and a second surface layer positioned on the second charge transport structure.

More specifically, the first structure of the laminate for manufacturing a solar cell having a tandem structure may include a first substrate which is a transparent substrate, a front electrode (first electrode) which is a transparent electrode positioned on the first substrate, a first charge transport structure (electron transport structure) positioned on the front electrode (first electrode) and providing a electron movement path, and a first surface layer positioned on the first charge transport structure. In addition, the second structure may include a p-type semiconductor substrate in which an n-type emitter layer is formed by doping the n-type impurity on the surface, and a p-type BSF layer is formed by doping the p-type impurity on a surface facing the surface on which the n-type emitter layer is formed, a rear electrode electrically connected to the BSF layer of the p-type semiconductor substrate, a bonding layer positioned on the n-type emitter layer, a second charge transport structure (hole transport structure) positioned on the bonding layer and providing a hole movement path, and a second surface layer positioned on the second charge transport structure.

As an example of the inorganic light absorbing layer of the metal chalcogen compound, the inorganic light absorbing layer of the second structure may include a metal chalcogen compound. Further, the second structure may further include a second substrate, a buffer layer positioned on the inorganic light absorbing layer, and a second charge transport structure. The second substrate, the second electrode, the inorganic light absorbing layer, the buffer layer, the bonding layer, the second charge transport structure, and the second surface layer may be sequentially formed.

In detail, the laminate for manufacturing a solar cell having a tandem structure may include a first structure and a second structure, the first structure including a first substrate that is a transparent substrate, a front electrode (first electrode) that is a transparent electrode positioned on the first substrate, a first charge transport structure positioned on the front electrode (first electrode) and providing a photocurrent movement path, and a first surface layer positioned on the first charge transport structure, and the second structure including a second substrate, a second electrode positioned on the second substrate, an inorganic light absorbing layer of the metal chalcogen compound positioned on the second electrode, a buffer layer positioned on the inorganic light absorbing layer, a bonding layer positioned on the buffer layer, a second charge transport structure positioned on the bonding layer, and a second surface layer positioned on the second charge transport structure, and the laminate may be a laminate in which the first structure and the second structure are stacked so that the first surface layer of the first structure and the second surface layer of the second structure are in contact with each other. Further, the second structure may further include a window layer between the buffer layer and the bonding layer.

The present invention includes a solar cell manufactured by the manufacturing method as described above.

The solar cell according to an exemplary embodiment of the prevent invention may include a first substrate and a second substrate facing each other, a first electrode, a first charge transport structure, an inorganic/organic hybrid perovskite compound layer, a second charge transport structure, and a second electrode sequentially stacked between the first substrate and the second substrate. The first substrate and the second substrate facing each other are configurations deduced by bonding the first structure and the second structure that are independent structures, with each other to thereby form a solar cell, which is a structural feature of the solar cell manufactured using the manufacturing method provided in the present invention.

Further, in the solar cell according to an exemplary embodiment of the present invention, the first electrode may be directly in contact with and bonded to the first substrate, and the second electrode may be directly in contact with and bonded to the second substrate. This is a configuration deduced by bonding the first structure including the first substrate on which the first electrode is formed and the second structure including the second substrate on which the second electrode is formed with each other to thereby form a solar cell.

At least one of the first charge transport structure and the second charge transport structure may be a porous charge transport structure, and the inorganic/organic hybrid perovskite compound layer may fill pores of the porous charge transport structure and cover the porous charge transport structure.

In detail, the solar cell according to an exemplary embodiment of the present invention may include a first substrate, a first electrode positioned on the first substrate, a porous electron transport structure positioned on the first electrode; a light absorbing layer including an inorganic/organic hybrid perovskite compound layer which is a dense film which fills the pores of the porous electron transport structures and covers the porous electron transport structures; a second electrode positioned on the light absorbing layer; and a second substrate positioned on the second electrode.

The solar cell according to an exemplary embodiment of the present invention may not include the hole transport structure between the second electrode and the light absorbing layer, and the second electrode may be directly in contact with the light absorbing layer. When the second electrode is directly in contact with the light absorbing layer, the dense film of the light absorbing layer simultaneously performs the function of the hole transport structure, and thus, the dense film may have a thickness of 1 nm to 10 µm, and preferably 1 µm to 10 µm.

Independently, the solar cell according to an exemplary embodiment of the present invention may include the hole transport structure positioned between the light absorbing layer and the second electrode.

The hole transport structure may be an organic hole transport structure or an inorganic hole transport structure, and the hole transport structure may be a dense film, a porous film, or a stacked film of the porous film and the dense film. In this case, the inorganic hole transport structure may be a hole transport structure of the porous film and/or a hole transport structure of the dense film, and the organic hole transport structure may be a hole transport structure of the dense film.

When the hole transport structure includes the inorganic hole transport structure of the porous film, the inorganic/organic hybrid perovskite compound of the light absorbing layer may fill the pores of the porous hole transport structure.

That is, the solar cell according to an exemplary embodiment of the present invention may include a first substrate; a first electrode positioned on the first substrate; a porous electron transport structure positioned on the first electrode; a light absorbing layer; a porous hole transport structure positioned on the light absorbing layer; a second electrode; and a second substrate positioned on the second electrode, wherein the light absorbing layer may include an inorganic/organic hybrid perovskite compound which is a dense film filling both pores of the porous electron transport structure and pores of the porous hole transport structure, and positioned between the porous electron transport structure and the porous hole transport structure. This structure may be interpreted as a structure in which the dense film of the inorganic/organic hybrid perovskite compound is provided between the hole transport structure and the electron transport structure, wherein the perovskite compound film penetrates into the pores of the hole transport structure to fill the pores and penetrates into the pores of the electron transport structure to fill the pores. Such a structure is preferable since it expands a contact area between the electron transport structure and the light absorber, a contact area between the hole transport structure and the light absorber.

The present invention includes a solar cell having a tandem structure manufactured by the manufacturing method as described above.

The solar cell having a 4-terminal tandem structure according to an exemplary embodiment of the present invention may include the perovskite compound-based solar cell and the inorganic light absorbing layer-based solar cell described above, wherein these two solar cells are stacked so that the perovskite compound-based solar cell receives light and the received light is introduced into the inorganic light absorbing layer-based solar cell through the perovskite compound-based solar cell.

Here, in the perovskite compound-based solar cell provided in the solar cell having a 4-terminal tandem structure, the first substrate and the second substrate are transparent substrates, respectively, the first electrode and the second electrode are preferably transparent electrodes, respectively, and the perovskite compound-based solar cell may transmit light having a wavelength band of 800 nm or more among the incident light to deliver the light to the inorganic light absorbing layer-based solar cell.

In detail, the perovskite compound-based solar cell provided in the solar cell having a 4-terminal tandem structure may include a first substrate and a second substrate which are transparent substrates facing each other, a first electrode which is a transparent electrode, a first charge transport structure, an inorganic/organic hybrid perovskite compound layer, a second charge transport structure, and a second electrode which is a transparent electrode that are sequentially stacked between the first substrate and the second substrate. Detailed structures, materials, and manufacturing methods of the perovskite compound-based solar cell may be understood with reference to the above-described contents.

The inorganic light absorbing layer-based solar cell provided in the 4-terminal tandem structure solar cell may be any conventional solar cell as long as it absorbs light in a wavelength band of 800 nm or more and generates photoelectrons and photoholes, and may be composited with the perovskite compound-based solar cell.

For example, the inorganic light absorbing layer-based solar cell may be a single crystal silicon solar cell, a polycrystalline silicon solar cell, an amorphous silicon solar cell, a thin film silicon solar cell, a compound semiconductor solar cell (CIGS, CIS, CdTe, CdS, AnS, GaAs, GaAlAs, GaInAs, InP, GaP, GaAs/Ge, GaAs/Ge/Si, GaAlAs/Si, GaInP$_2$/GaAs, InGaP/InGaAs/Ge solar cell, etc.), a dye sensitized solar cell, a quantum dot sensitive solar cell, an inorganic-organic hybrid solar cell, etc. However, the present invention is not limited by the detailed type of the inorganic light absorbing layer-based solar cell.

The solar cell having a two-terminal tandem structure according to an exemplary embodiment of the present invention may include a second electrode, an inorganic light absorbing layer positioned on the second electrode and absorbing light of 800 nm or more to generate electrons and holes, a bonding layer positioned on the inorganic light absorbing layer, a perovskite-based light absorbing layer positioned on the bonding layer and including a perovskite compound layer, a charge transport structure positioned on the perovskite-based light absorbing layer, a first electrode which is a transparent electrode positioned on the charge transport structure, and a first substrate that is a transparent substrate positioned on the first electrode.

In detail, the solar cell having a two-terminal tandem structure according to an exemplary embodiment of the present invention may include a semiconductor substrate on which an emitter layer and a back surface field (BSF) layer forming a back electric field are formed, a second electrode electrically connected to the BSF layer of the semiconductor substrate, a bonding layer positioned on the emitter layer, a second charge transport structure positioned on the bonding layer, a perovskite-based light absorbing layer positioned on the second charge transport structure and including a perovskite compound layer, a first charge transport structure positioned on the perovskite-based light absorbing layer, a first electrode which is a transparent electrode positioned on the first charge transport structure, and a first substrate that is a transparent substrate positioned on the first electrode.

In detail, the solar cell having a two-terminal tandem structure according to an exemplary embodiment of the present invention may include an n-type semiconductor substrate on which a p-type emitter layer and an n-type back surface field (BSF) layer forming a back electric field are formed, a second electrode electrically connected to the n-type BSF layer of the semiconductor substrate, a bonding layer positioned on the p-type emitter layer, an electron transport structure positioned on the bonding layer, a perovskite-based light absorbing layer positioned on the electron transport structure and including a perovskite compound layer, a hole transport structure positioned on the perovskite-based light absorbing layer, a first electrode which is a transparent electrode positioned on the hole transport structure, and a first substrate that is a transparent substrate positioned on the first electrode.

In detail, the solar cell having a two-terminal tandem structure according to an exemplary embodiment of the present invention may include a p-type semiconductor substrate on which an n-type emitter layer and a p-type back surface field (BSF) layer forming a p-type back electric field are formed, a second electrode electrically connected to the p-type BSF layer of the semiconductor substrate, a bonding layer positioned on the n-type emitter layer, a hole transport structure positioned on the bonding layer, a perovskite-based light absorbing layer positioned on the hole transport structure and including a perovskite compound layer, an electron transport structure positioned on the perovskite-based light absorbing layer, a first electrode which is a transparent electrode positioned on the electron transport structure, and a first substrate that is a transparent substrate positioned on the first electrode.

A solar cell having a two-terminal tandem structure according to an exemplary embodiment of the present invention may include a second substrate, a second electrode positioned on the second substrate, an inorganic light absorbing layer positioned on the second electrode and including a metal chalcogen compound, a buffer layer positioned on the inorganic light absorbing layer, a bonding layer positioned on the buffer layer, a perovskite-based light absorbing layer positioned on the bonding layer and including a perovskite compound layer, a charge transport structure positioned on the perovskite-based light absorbing layer, a first electrode which is a transparent electrode positioned on the charge transport structure, and a first substrate that is a transparent substrate positioned on the first electrode.

In detail, the solar cell having a two-terminal tandem structure may include a second substrate, a second electrode positioned on the second substrate, an inorganic light absorbing layer positioned on the second electrode and including a metal chalcogen compound, a buffer layer positioned on the inorganic light absorbing layer, a bonding layer positioned on the buffer layer, a second charge transport structure positioned on the bonding layer, a perovskite-based light absorbing layer positioned on the second charge transport structure and including a perovskite compound layer, a first charge transport structure positioned on the perovskite-based light absorbing layer, a first electrode which is a transparent electrode positioned on the first charge transport structure, and a first substrate that is a transparent substrate positioned on the first electrode.

In detail, the solar cell having a two-terminal tandem structure may include a second substrate, a second electrode positioned on the second substrate, an inorganic light absorbing layer positioned on the second electrode and including a metal chalcogen compound, a buffer layer positioned on the inorganic light absorbing layer, a bonding layer positioned on the buffer layer, a second charge transport structure positioned on the bonding layer, a perovskite-based light absorbing layer positioned on the second charge transport structure and including a perovskite compound layer, a first charge transport structure positioned on the perovskite-based light absorbing layer, a first electrode which is a transparent electrode positioned on the first charge transport structure, and a first substrate which is a transparent substrate positioned on the first electrode. Here, the first charge transport structure may be an electron transport structure and the second charge transport structure may be a hole transport structure. Further, the solar cell having a two-terminal tandem structure may further include a window layer positioned between the buffer layer and the bonding layer.

The solar cell having a two-terminal tandem structure may be manufactured by applying heat and physical force to the above-described laminate to convert the first surface layer and the second surface layer to a single perovskite compound layer. Accordingly, in the solar cell having a two-terminal tandem structure, detailed configurations of the substrate, the electrode, the inorganic light absorbing layer, the charge transport structure (first charge transport structure, second charge transport structure), the perovskite-based light absorbing layer, the buffer layer, the window layer, the semiconductor substrate on which the emitter layer and the BSF layer are formed, etc., may be understood with reference to the above-described contents described in the manufacturing method and the laminate, and may include all of these contents described above.

PREPARATION EXAMPLE 1

Preparation of Organic Metal Halide Solution

A 0.8 M $CH_3NH_3PbI_3$ solution was prepared by using a mixed solvent in which gamma-butyrolactone and dimethylsulfoxide were mixed at a volume ratio of 7:3, and dissolving $CH_3NH_3I$ and $PbI_2$ in the mixed solution at a molar ratio of 1:1.

EXAMPLE 1

Perovskite Bonding

The $CH_3NH_3PbI_3$ solution prepared in Preparation Example 1 was applied (injected) at one time to a rotation center of a glass substrate (FTO: F-doped $SnO_2$, 8 ohms/$cm^2$, Pilkington, hereinafter referred to as FTO substrate) coated with fluorine-containing tin oxide having a size of 25×25 mm, and spin-coated at 3000 rpm. After the spin coating was performed for 50 seconds, 1 mL of toluene, non-solvent, was applied (injected) at one time to the rotation center of the FTO substrate during spinning, and then, the spin coating was further performed for 5 seconds. After the spin coating was performed, the first surface layer, which was a perovskite compound film, was formed by processing at a temperature of 100 under normal pressure for 30 minutes. During the formation of the first surface layer, an ambient environment was maintained to a temperature of 25□ and a relative humidity of 25%.

A second surface layer was formed on another FTO substrate in the same manner as described above.

The FTO substrate on which the first surface layer was formed and the FTO substrate on which the second surface layer was formed were stacked so that the first surface layer and the second surface layer were in contact with each other, and the laminate was bonded for 10 minutes by applying a pressure of 50 MPa in a hot-press heated to 150□. In order to observe a bonding state of one bonded film which was coated and bonded on the two FTO substrates, the one FTO substrate was detached by applying external force, and cut, and then, a fracture surface was observed with a scanning electron microscope. Here, the bonded substrates were strongly bonded to each other, and thus, it was required to apply a considerably large external force to detach the one substrate.

Figure 2:
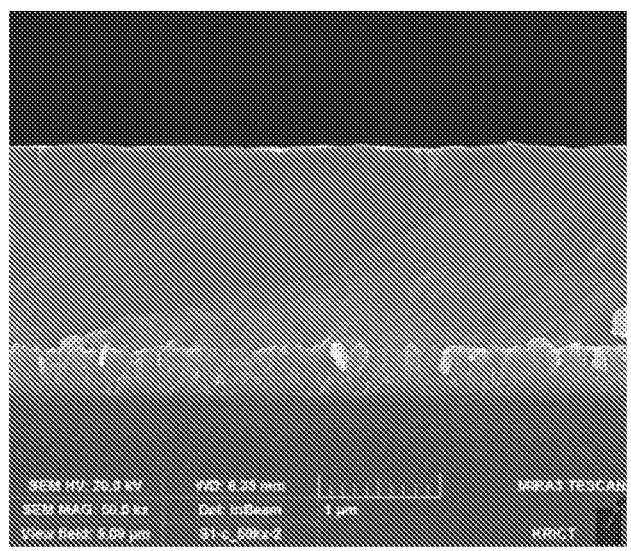
FIG. 2 is a scanning electron microscope (SEM) image of a cross section of a perovskite compound film converted from the surface layer in Example 1.

FIG. 1 is a scanning electron microscope (SEM) image of a cross section of a perovskite compound surface layer formed on the FTO substrate before hot-pressing, and FIG. 2 is a scanning electron microscope (SEM) image of a cross section of the bonded film after the hot-pressing.

It could be appreciated that the perovskite compound film (first surface layer or second surface layer) before the hot-pressing had a thickness of about 800 nm, and a grain boundary was also observed on the cross-sectional image. However, it could be appreciated from the cross-sectional image after the bonding process using the hot-pressing that the bonded film had a thickness of 1.7 μm, which showed that the two films were bonded to have a thickness of about two times thicker than the thickness of one substrate (surface layer), and further, since it was observed that the bonding surface of the two films was not observed at an intermediate position, material transfer between the two films was sufficiently performed. Further, it was also observed that the grain boundary observed before the bonding was not observed, and thus, it could be appreciated that the compound was grown to a large crystal grain due to active material transfer.

PREPARATION EXAMPLE 2

Manufacture of Porous TiO$_2$ Thin Film Substrate

A glass substrate coated with fluorine-containing tin oxide (FTO: F-doped SnO$_2$, 8 ohms/cm$_2$, Pilkington, hereinafter referred to as a FTO substrate (first electrode)) was cut into a size of 25×25 mm, and ends thereof were etched to partially remove the FTO.

A TiO$_2$ dense film having a thickness of 50 nm as a metal oxide thin film was manufactured on the cut and partially etched FTO substrate by a spray pyrolysis method. The spray pyrolysis was performed by using a solution of TAA (titanium acetylacetonate):EtOH (1:9 v/v %), and the thickness was controlled by repeating a method of spraying the solution on the FTO substrate placed on a hot plate maintained at 450□ for 3 seconds, followed by stopping the spraying for 10 seconds.

An ethyl cellulose solution in which 10% by weight of ethyl cellulose was dissolved in ethyl alcohol, was added to TiO$_2$ powder having an average grain size (diameter) of 50 nm (prepared by hydrothermal treatment of a titanium peroxocomplex aqueous solution having an amount of 1 wt % based on TiO$_2$ at 250□ for 12 hours), wherein an added amount of the ethyl cellulose solution was 5 ml per 1 g of TiO$_2$ powder, and then, terpinol (5 g per 1 g of TiO$_2$ powder) was added and mixed. Then, ethyl alcohol was removed by vacuum distillation to prepare a TiO$_2$ paste.

Ethanol was added to the prepared TiO$_2$ powder paste (a weight ratio of TiO$_2$ powder paste:ethanol was 1:5), thereby preparing a TiO$_2$ slurry for spin coating. The TiO$_2$ thin film of the FTO substrate was coated with the TiO$_2$ slurry for spin coating by a spin coating method (3000 rpm), and heat-treated at 500□ for 60 minutes. Then, the heat-treated substrate was immersed in a 30 mM TiCl$_4$ aqueous solution at 60□, and left for 30 minutes. Next, the substrate was washed with deionized water and ethanol, dried, and then, heat-treated at 500□ for 30 minutes to prepare a porous TiO$_2$ thin film (porous electron transport structure). Here, the porous TiO$_2$ thin film (porous electron transport structure) had a thickness of 100 nm, and the prepared porous electron transport structure had a specific surface area of 33 m$^2$/g, and a porosity (apparent porosity) of 50%.

PREPARATION EXAMPLE 3

Manufacture of NiO Layer

A glass substrate coated with fluorine-containing tin oxide (FTO: F-doped SnO$_2$, 8 ohms/cm$_2$, Pilkington, hereinafter referred to as a FTO substrate (first electrode)) was cut into a size of 25×25 mm, and then, the remaining FTO except for portions where four rectangular electrodes each having a size of 4 mm×20 mm were disposed was removed so that the four rectangular electrodes were disposed.

A NiO dense film having a thickness of 50 nm as a metal oxide thin film was manufactured on the cut and partially etched FTO substrate. The NiO dense film was manufactured by spin coating a NiO solution on the FTO substrate, followed by heat treatment. The NiO solution was prepared by adding 0.0589 g of nickel nitrate hexahydrate and 12.5 μl of monoethanolamine to 2 ml of ethanol and stirring at 70□ for 4 hours. This solution was coated on the FTO substrate prepared above at 3000 rpm, and then heat-treated at 250□ for 30 minutes.

EXAMPLE 2

Manufacture of Solar Cell

A CH$_3$NH$_3$PbI$_3$ solution was prepared in the same manner as in Preparation Example 1 except that the solution had a concentration of 0.5 M.

The prepared perovskite solution was applied (injected) at one time to the rotation center of the porous TiO$_2$ film manufactured in Preparation Example 2, and spin-coated at 3000 rpm. After the spin coating was performed for 50 seconds, 1 mL of toluene, non-solvent, was applied (injected) at one time to the rotation center of the FTO substrate during spinning, and then, the spin coating was further performed for 5 seconds. After the spin coating was performed, the first surface layer, which was a perovskite compound film, was formed by processing at a temperature of 100□ under normal pressure for 30 minutes. During the formation of the first surface layer, an ambient environment was maintained to a temperature of 25□ and a relative humidity of 25%.

A second surface layer was manufactured on the FTO substrate coated with the NiO film manufactured in Preparation Example 3 in the same manner as the above-described method.

The TiO$_2$/FTO substrate on which the first surface layer was formed and the NiO/FTO substrate on which the second surface layer was formed, were stacked so that the first surface layer and the second surface layer were in contact with each other, wherein a 5 mm non-bonded portion was left so that the electrodes could be connected to the respective substrates without bonding an entire surface. The laminate of the TiO$_2$/FTO substrate on which the first surface layer was formed and the NiO/FTO substrate on which the second surface layer was formed, was bonded for 10 minutes by applying a pressure of 50 MPa in a hot-press where both upper and lower surfaces were heated to 180□.

Photoelectric conversion parameters (AM 1.5G light irradiation condition) of the perovskite solar cell manufactured by the bonding as described above showed 23.2 mA/cm$^2$ of $J_{sc}$, 1.05 V of $V_{oc}$, 63.8% of FF, i.e., a high photoelectric conversion efficiency of 15.5%. It was also characterized that the thus-formed pressed perovskite solar cell had a high transmittance of 50% or more in a long wavelength region of 800 nm or more, which could be appreciated that it was effectively usable for tandem with a crystalline silicon-based solar cell or a metal chalcogen compound-based solar cell.

Further, the perovskite solar cell manufactured in the present Example having a structure in which both surfaces were formed of glass showed high stability in which an efficiency of 80% or more was maintained even after 1,000 hours under the AM 1.5G light irradiation condition wherein the NiO side was used as a light receiving surface. Thus, it is expected that the perovskite solar cell manufactured in the present invention is applicable to a high stability solar cell structure for commercialization of perovskite. Further, it is possible to adjust a bandgap of the perovskite compound to control the color, and the visible light transmittance may be controlled by the thickness and the band gap, and thus, it is expected to be suitable for building integrated photovoltaics (BIPV) or automobiles.

EXAMPLE 3

Manufacture a Dense Film from a Non-Dense Film

The perovskite solution has a disadvantage in that it is difficult to manufacture a dense film at the time of coating with a single solution. Accordingly, one or two steps are required to be added to manufacture the dense film. The present Example was intended to show that non-dense surface layers manufactured by simple single solution coating could be converted to a dense perovskite film, which was the advantageous effect of the present invention.

Figure 3:
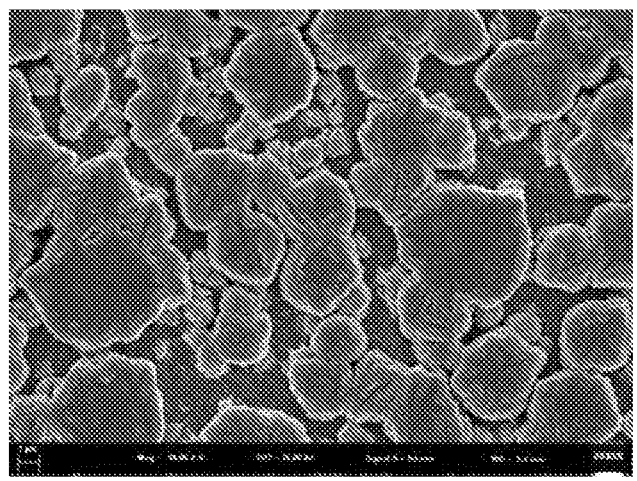
FIG. 3 is a scanning electron microscope (SEM) image of a surface layer manufactured in Example 3.

$CH_3NH_3I$ and $PbI_2$ were dissolved in a single solvent of gamma-butyrolactone at a molar ratio of 1:1 to prepare a 0.8M $CH_3NH_3PbI_3$ solution. This solution was spin-coated on an electron transport structure manufactured in Preparation Example 2 and a hole transport structure manufactured in Preparation Example 3, respectively, at 3000 rpm, thereby forming surface layers. FIG. 3 is a scanning electron microscope (SEM) image of the surface layer formed on the electron transport structure. As shown in FIG. 3, it could be appreciated that the perovskite compound material did not form a dense film, but was present in an irregular island shape (protruding structure, pillared structure) at the time of coating with the single solvent. The thus-formed two surface layers were superimposed on each other so that the surface layers were in contact with each other, and bonded for 10 minutes by applying a pressure of 50 MPa in a hot-press where both upper and lower surfaces were heated to 180□. In order to observe a bonding state of one bonded perovskite, the one substrate was detached by applying external force again, and cut, and then, a fracture surface was observed with a scanning electron microscope. Here, the two bonded substrates were strongly bonded to each other, and thus, it was required to apply a considerably large external force to detach the one substrate. The observed scanning electron microscope image was shown in FIG. 4.

Figure 4:
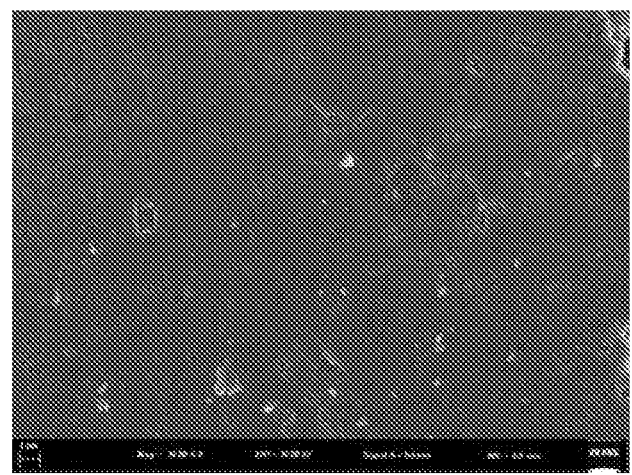
FIG. 4 is a scanning electron microscope (SEM) image of a cross section of a perovskite compound film converted from the surface layer in Example 3.

As appreciated from the scanning electron microscopic image of FIG. 4, it could be appreciated that the film which was not dense before the pressing was converted to a dense film after the pressing. It was confirmed that even though a low-quality surface layer was manufactured using a simple solution coating method, when the method provided in the present invention was used, a high-quality dense perovskite compound layer was manufactured, and thus, it could be appreciated that the present invention had significantly high commerciality and processability.

EXAMPLE 4

Manufacture of Dense Film Using Perovskite Powder

At the time of forming the perovskite compound film, a method in which a perovskite compound solution in which all of a perovskite compound was dissolved in a solvent, was applied on the substrate, and the perovskite compound was spontaneously crystallized upon evaporation of the solvent, is mainly used. However, perovskite powder may be prepared first and a solution or slurry in which the powder is dispersed may be prepared to form a perovskite powder layer. Since this powder layer is not dense, there is a problem in utilization as a perovskite solar cell. However, a method for manufacturing a perovskite powder layer by preparing the solution or slurry in which the perovskite powder is dispersed is more suitable for being industrially used due to processability. Therefore, a technique for forming the non-dense powder layer into a dense film has great significance in the commercialization of the perovskite solar cell. The present Example was provided to show that the non-dense powder layer could be converted to the dense film.

$CH_3NH_3I$ and $PbI_2$ were dissolved in a single solvent of gamma-butyrolactone at a molar ratio of 1:1 to prepare a 1.0M $CH_3NH_3PbI_3$ solution. Toluene was added to this solution to precipitate $CH_3NH_3PbI_3$ grains, followed by filtering and drying to prepare $CH_3NH_3PbI_3$ powder. The thus-prepared perovskite powder was again dispersed in toluene, and the dispersion liquid was spin-coated on the FTO substrate at 1000 rpm. A scanning electron microscope image of the spin-coated powder layer was shown in FIG. 5.

Figure 5:
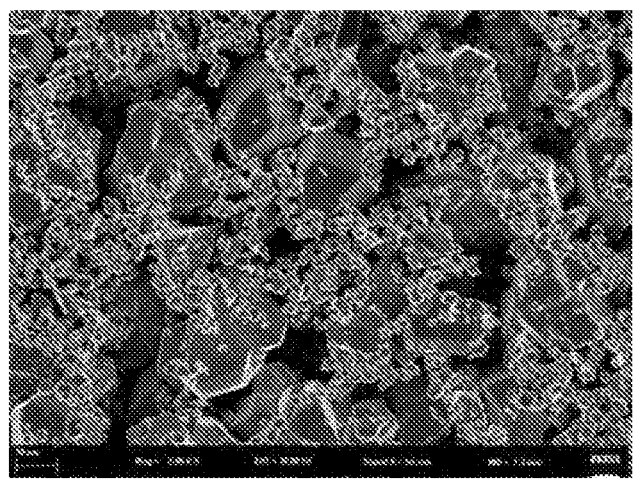
FIG. 5 is a scanning electron microscope (SEM) image of a surface layer manufactured in Example 4.

As appreciated in FIG. 5, the surface layer had a non-dense film shape, and the powder was simply dispersed and applied on the substrate as expected. The FTO substrates on which the two surface layers were formed, respectively, were stacked so that the two surface layers were in contact with each other, and bonded for 10 minutes by applying a pressure of 50 MPa in a hot-press where both upper and lower sides were heated to 180□. In order to observe a bonding state of the bonded perovskite compound film, the one substrate was detached by applying external force again, and cut, and then, a fracture surface was observed with a scanning electron microscope. Here, the bonded two substrates were strongly bonded to each other, and thus, it was required to apply a considerably large external force to detach the one substrate. The observed scanning electron microscope image was shown in FIG. 6.

Figure 6:
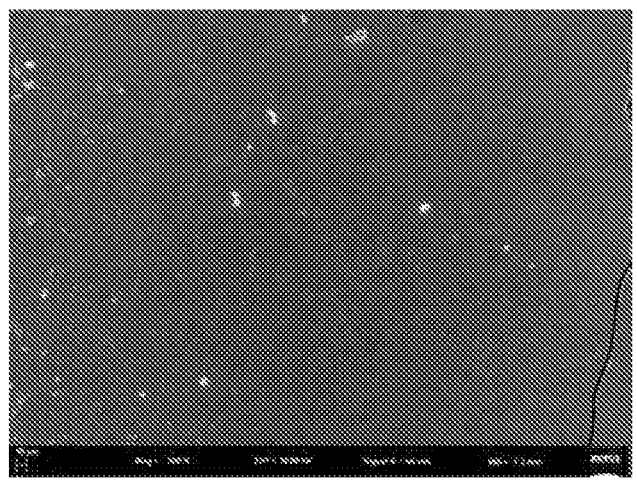
FIG. 6 is a scanning electron microscope (SEM) image of a cross section of a perovskite compound film converted from the surface layer in Example 4.

As shown in FIG. 6, it could be appreciated that a perovskite compound film having a dense film form was manufactured, which was distinctly different from that before the pressing. It indicated that it was possible to easily form the dense perovskite compound film by preparing perovskite compound powder, coating a solution, an ink, and slurry in which the perovskite compound powder was dispersed using a simple coating process, followed by hot-pressing. As a result, it is expected to facilitate large-area and mass production at the time of manufacturing the perovskite solar cell.

EXAMPLE 5

Bonding Between Metal Halide and Organic Halide and Manufacture of Solar Cell $CH_3NH_3I$ powder was dissolved in an isopropanol solvent at a concentration of 0.25M, thereby preparing a CH$_3$NH$_3$I solution. The prepared CH$_3$NH$_3$I solution was applied (injected) to the rotation center on the porous TiO$_2$ film prepared in Preparation Example 2, spin-coated at 3000 rpm, and heat-treated at 100□ for 1 minute, thereby forming a first surface layer which is an organic halide film. During the formation of the first surface layer, an ambient environment was maintained to a temperature of 25 and a relative humidity of 25%.

In order to form a metal halide film as the second surface layer, PbI$_2$ powder was dissolved in a solvent of dimethylformamide (DMF) at a concentration of 1.0M, thereby preparing a PbI$_2$ solution. The prepared PbI$_2$ solution was applied (injected) to the rotation center on the FTO film including the NiO film formed thereon prepared in Preparation Example 3, spin-coated at 2000 rpm, and heat-treated at 100□ for 20 minutes, thereby forming a second surface layer which is a metal halide film. During the formation of the second surface layer, an ambient environment was maintained to a temperature of 25□ and a relative humidity of 25%.

A TiO$_2$/FTO substrate on which the first surface layer was formed and an NiO/FTO substrate on which the second surface layer was formed, were stacked so that the first surface layer and the second surface layer were in contact with each other. Here, a 5 mm non-bonded portion was left so that the electrodes could be connected to the respective substrates without bonding an entire surface. The laminate was bonded for 10 minutes by applying a pressure of 50 MPa in a hot-press where both upper and lower surfaces were heated to 180□. It could be observed that before the bonding, the first surface layer was white, and the second surface layer was yellow, but after the bonding, it was changed to a black perovskite phase. Photoelectric conversion parameters of the perovskite solar cell manufactured by the bonding as described above showed 21.8 mA/cm$^2$ of J$_{sc}$, 1.02 V of V$_{oc}$, 72.1% of FF, i.e., a high photoelectric conversion efficiency of 16.0%.

EXAMPLE 6

Infrared Transmittance

In order to evaluate the infrared region transmittance of the substrate/perovskite compound film/substrate sandwiched structure, a SiO$_2$ glass substrate (fused silica) on which a perovskite compound surface layer was formed or a polyethylene terephthalate (PET) substrate on which a perovskite compound surface layer was formed, was used to perform bonding.

A perovskite film was prepared in the same manner as in Example 2 except that a glass (fused silica) substrate was used instead of the porous TiO$_2$ substrate. Both the first surface layer and the second surface layer were manufactured on the fused silica substrate, and the substrates were stacked so that two surface layers were in contact with each other, followed by hot-pressing. The two surface layers were bonded for 10 minutes by applying a pressure of 50 MPa in a hot-press where both upper and lower surfaces were heated to 140□, thereby manufacturing a glass-perovskite compound film-glass specimen. Further, a PET/perovskite compound film/PET specimen was manufactured by the same method using a PET substrate instead of the glass substrate. Results of the measurement of the transmittance of the thus-manufactured two specimens were shown in FIG. 7.

Figure 7:
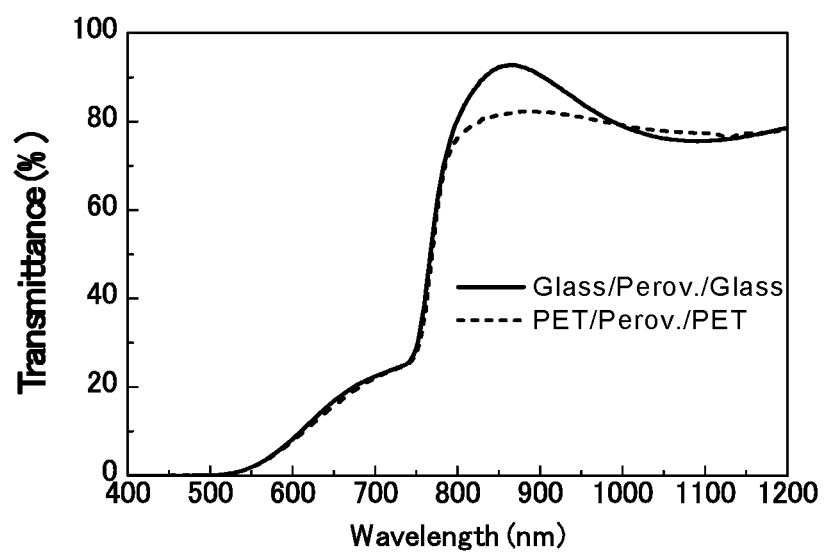
FIG. 7 shows transmittance of a sample of glass-perovskite compound film-glass and PET-perovskite compound film-PET manufactured in Example 6.

As shown in FIG. 7, it could be appreciated that the CH$_3$NH$_3$PbI$_3$ film having a thickness of about 700 nm manufactured through the bonding could transmit about 80% of the infrared region of 800 nm or more. It was considered that this transmittance was able to be further improved by controlling the thickness of the perovskite film. It could be appreciated that it is very advantageous for tandem with the conventional solar cell using the inorganic light absorbing layer that absorbs light of 800 nm or more (for example, a Si solar cell 23 or a metal chalcogen compound-based solar cell).

EXAMPLE 7

Manufacture of Surface Layer Using Perovskite Compound Precursor

CH$_3$NH$_3$I and PbI$_2$ powder at a stoichiometric ratio of 1:1 was added to a dimethyl sulfoxide (DMSO) solvent and stirred at 60 for 2 hours to prepare a 0.8 M CH$_3$NH$_3$IOPbI$_2$-DMSO solution. Precipitate powder formed by drop-wise adding this solution to toluene was separated and recovered by a filter paper, and dried at room temperature for 1 hour.

Figure 8:
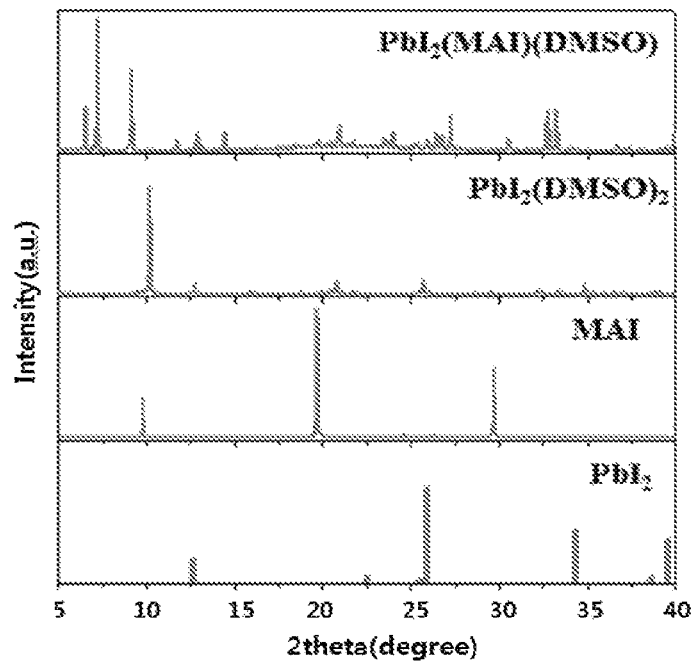
FIG. 8 shows X-ray diffraction patterns of a perovskite compound precursor prepared in Example 7 and also shows X-ray diffraction patterns of $PbI_2(DMSO)_2$, MAI ($CH_3NH_3I$), $PbI_2$.

The X-ray diffraction analysis results of the prepared powder showed that the CH$_3$NH$_3$I and PbI$_2$ were not detected, and diffraction peaks different from PbI$_2$(DMSO)$_2$ were observed (see FIG. 8). It could be appreciated that the manufactured powder (shown as PbI$_2$(MAI) (DMSO) in FIG. 8) exhibited strong diffraction peaks at diffraction angles 2θ, 6.2 to 6.8°, 7 to 7.5° and 8.9 to 9.5°. In addition, it could be appreciated that the prepared powder had the highest diffraction intensity at a peak positioned at 7 to 7.5° in a region where 2θ was 5 to 40°.

As a result of Fourier transform infrared spectroscopy (FTIR) measurement of the prepared powder, it could be appreciated that absorption due to the S—O bond, the C—H bond, and the N—H bond occurred. It means that the prepared powder includes both CH$_3$NH$_3$I and DMSO. Further, it could be appreciated that absorption due to C=C bond did not occur, which indicated that toluene used as the non-solvent was not included in the powder. It could be appreciated from the XRD and FTIR results that the prepared powder was a mixed crystal of CH$_3$NH$_3$I—PbI$_2$-DMSO. Elemental analysis was performed for accurate composition analysis. As the analysis result, mass ratio of each element was estimated to be H=1.6%, C=4.6%, N=2.0%, O=2.2% and S=3.7%, and the mass ratio of the remaining elements was estimated to be 85.9%. It could be appreciated that when assuming that mixed crystal of CH$_3$NH$_3$I (hereinafter referred to as MAI), PbI$_2$, and C$_2$H$_6$SO (DMSO) was reacted with each other at a ratio of 1:1:1, H=1.7%, C=5.2%, N=2.0%, O=2.3%, S=4.6%, Pb=29.7%, and I=54.5%, which was similar to that of the elemental analysis.

Accordingly, it could be appreciated that the prepared powder was a crystal formed by reacting MAI—PbI$_2$-DMSO at a ratio of 1:1:1, i.e., CH$_3$NH$_3$Pb(C$_2$H$_6$SO)I$_3$ (=C$_3$H$_{12}$NSOPbI$_3$). This could be regarded as an example where in AM(GM)$_n$X$_3$ represented by Chemical Formula 7, GM is DMSO, and n is 1.

The CH$_3$NH$_3$I and PbI$_2$ powder was put into a mixed solvent in which dimethyl sulfoxide (DMSO) and gamma-butyrolactone (GBL) (GBL:DMSO=7:3 by volume) were mixed at a stoichiometric ratio of 1:1, and stirred at 60 for 2 hours, thereby preparing a 0.8 M CH$_3$NH$_3$I—Pb$_2$-mixed solvent solution.

The prepared CH$_3$NH$_3$I—PbI$_2$-mixed solvent solution (total 1 ml) was applied (injected) at one time on the rotation center of the fused silica substrate, and spin-coated at 5000 rpm. After the spin coating was performed for 50 seconds, 1 mL of toluene, non-solvent, was injected at one time to the rotation center of the substrate during spinning, and then, the spin coating was further performed for 5 seconds. After the spin-coating was completed, drying was performed at room temperature for 1 hour. As a result, it was confirmed that the same perovskite compound precursor layer as $CH_3NH_3Pb(C_2H_6SO)I_3$, which was the material prepared in a powder form, was formed on the fused silica substrate.

Subsequently, the substrate on which the perovskite compound precursor layer was formed was heat-treated at a temperature of 100□ and normal pressure for 30 minutes. From X-ray diffraction analysis after the heat treatment, it was confirmed that the perovskite compound precursor was converted to the pure perovskite compound.

EXAMPLE 8

Figure 9:
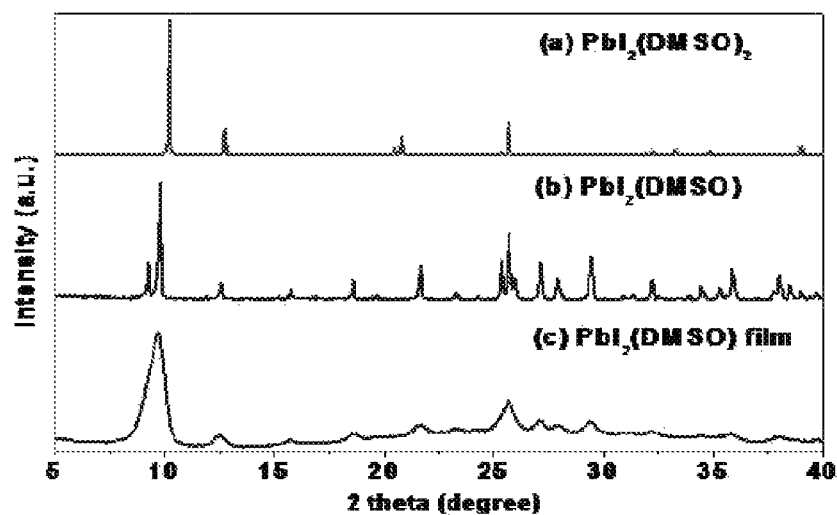
FIG. 9 shows X-ray diffraction patterns of powder and a thin film of a metal halide precursor prepared in Example 8.

Manufacture of Surface Layer Using Metal Halide Precursor $Pb_2$ powder (lead iodide, 99%) purchased from SIGMA-ALDRICH Co., was stirred in a dimethylsulfoxide (hereinafter, referred to as DMSO) solvent at 60□ for 2 hours to prepare a 0.8 M $PbI_2$-DMSO solution. Precipitate powder formed by adding drop-wise this solution to toluene was separated and recovered by a filter paper, and dried in a room-temperature vacuum oven for 6 hours. FIG. 9(a) shows an X-ray diffraction analysis result of the produced powder, and it could be appreciated that the obtained powder was $PbI_2(DMSO)_2$ that was reported by H. Miyamae (Chemistry Lett., 9, 663, 1980).

The prepared $PbI_2(DMSO)_2$ material was dried in a vacuum oven at 60 for 24 hours to obtain powder. The X-ray diffraction analysis result of this powder was shown in FIG. 9(b). It may be appreciated from FIG. 9 that X-ray diffraction pattern of $PbI_2(DMSO)$ powder was completely different from that of the $PbI_2(DMSO)_2$ precursor material, which indicated that this material is a material having a new crystal structure. It was confirmed from elemental analysis that this material was $PbI_2(DMSO)$ in which C and H were reduced by half as compared to $PbI_2(DMSO)_2$.

The prepared $PbI_2(DMSO)$ precursor material was dissolved in a solvent of N,N-dimethylformamide (DMF) to prepare an adduct solution of $PbI_2(DMSO)$ at a concentration of 1.5 M at room temperature.

The prepared 1.5 M concentration of $PbI_2(DMSO)$ adduct solution was injected at one time to the rotation center on the FTO substrate (a glass substrate coated with fluorine-containing tin oxide) (FTO: F-doped $SnO_2$, 8 ohms/$cm^2$, Pilkington), and spin-coated at 3000 rpm for 30 seconds. X-ray diffraction analysis results of the thus-manufactured thin film were shown in FIG. 9(c). As a result, a diffraction peak was observed in the vicinity of $2\theta=10°$, and thus, it could be appreciated that the $PbI_2(DMSO)$ film was well formed on the substrate.

A 250 mM concentration of $CH(NH_2)_2I$ isopropanol solution was injected at one time to the rotation center on the manufactured $PbI_2(DMSO)$ film, and spin-coated at 3000 rpm for 30 seconds.

Figure 10:
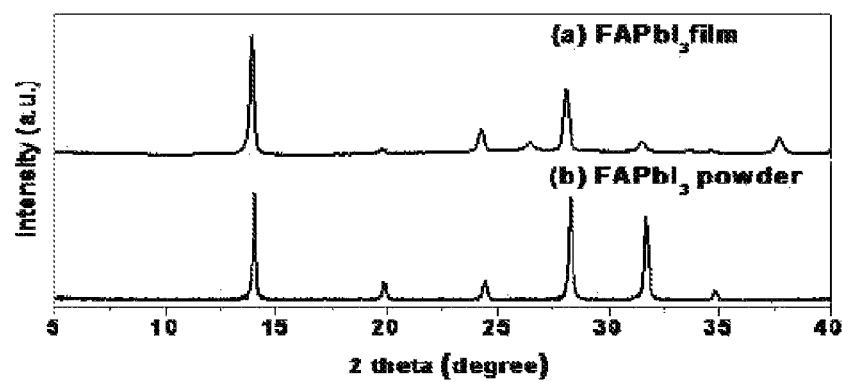
FIG. 10 shows X-ray diffraction patterns of a perovskite compound layer manufactured in Example 8, and also shows X-ray diffraction patterns of conventionally known $FAPbI_3$ powder.

The X-ray diffraction analysis result of the film formed after the spin-coating (shown as a $FAPbI_3$ film in FIG. 10) was shown in FIG. 10(a). For comparison, the X-ray diffraction analysis result of $CH(NH_2)_2PbI_3$ powder (shown as a $FAPbI_3$ powder in FIG. 10) was shown in FIG. 10(b). It could be appreciated from FIG. 10 that the specific diffraction peak of the $PbI_2(DMSO)$ thin film disappeared, and diffraction peaks corresponding to the $CH(NH_2)_2PbI_3$ ($FAPbI_3$) perovskite compound were generated.

It indicated that only by applying the organic halide solution to the metal halide precursor film at room temperature, $CH(NH_2)_2I$ was reacted with $PbI_2$ while simultaneously removing the guest molecule (GM') of the precursor film, thereby achieving successful conversion to the perovskite compound.

Hereinabove, although the present invention is described by specific matters, limited exemplary embodiments, and drawings, they are provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described exemplary embodiments, and the following claims as well as all modified equally or equivalently to the claims are intended to fall within the scopes and spirits of the invention.

The invention claimed is:

1. A method for manufacturing a device including an inorganic/organic hybrid perovskite compound film comprising:
    a) stacking a first structure including a first surface layer containing at least one of materials i) to v) below, and a second structure including a second surface layer containing, independently from the first surface layer, at least one of the materials i) to v) below so that the first surface layer and the second surface layer are in contact with each other, and
    b) applying heat and physical force to a laminate in which the first structure and the second structure are stacked, wherein the first surface layer and the second surface layer are each independently formed of a coating film on which a particulate of at least one of the materials i) to v) is coated, a porous film of at least one of the materials i) to v), a dense film of at least one of the materials i) to v), or a combination thereof of
    i) an inorganic/organic hybrid perovskite compound,
    ii) an organic halide,
    iii) a metal halide,
    iv) an inorganic/organic hybrid perovskite compound precursor, and
    v) a metal halide precursor.

2. The method of claim 1, wherein the first surface layer and the second surface layer are converted into a single inorganic/organic hybrid perovskite compound film by applying heat and physical force in b).

3. The method of claim 1, wherein a pair of the material contained in the first surface layer and the material contained in the second surface layer is one of 1) to 5) below:
    1) inorganic/organic hybrid perovskite compound-inorganic/organic hybrid perovskite compound,
    2) inorganic/organic hybrid perovskite compound-inorganic/organic hybrid perovskite compound precursor,
    3) inorganic/organic hybrid perovskite compound precursor-inorganic/organic hybrid perovskite compound precursor,
    4) metal halide precursor-organic halide, and
    5) metal halide-organic halide.

4. The method of claim 1, wherein the first surface layer and the second surface layer are patterned in a shape that the first surface layer and the second surface layer correspond to each other.

5. The method of claim 1, wherein the first surface layer and the second surface layer are each independently formed by printing, coating or vapor deposition.

6. The method of claim 5, wherein the first surface layer and the second surface layer are each independently formed by using a solution in which at least one of the materials i) and v) is dissolved or a slurry or an ink in which at least one of the materials i) and v) is dispersed.

7. The method of claim 1, wherein i) the inorganic/organic hybrid perovskite compound satisfies Chemical Formula 1, 2 or 3 below:

$$AMX_3 \quad \text{(Chemical Formula 1)}$$

in Chemical Formula 1, A is a monovalent cation, A is an organic ammonium ion, an amidinium group ion or an organic ammonium ion and an amidinium group ion, M is a divalent metal ion, and X is a halogen ion, $$A(M_{1-a}N_a)X_3 \quad \text{(Chemical Formula 2)}$$

in Chemical Formula 2, A is a monovalent cation, A is an organic ammonium ion, an amidinium group ion or an organic ammonium ion and an amidinium group ion, M is a divalent metal ion, N is at least one doping metal ion selected from a monovalent metal ion and a trivalent metal ion, a is a real number of 0<a≤0.1, and X is a halogen ion, $$A(N^1_{1-b}N^2_b)X_3 \quad \text{(Chemical Formula 3)}$$

in Chemical Formula 3, A is a monovalent cation, A is an organic ammonium ion, an amidinium group ion or an organic ammonium ion and an amidinium group ion, $N^1$ is a monovalent metal ion, $N^2$ is a trivalent metal ion, b is a real number of 0.4≤b≤0.6, and X is a halogen ion.

8. The method of claim 7, wherein in Chemical Formula 1, 2 or 3, A is $A^a_{(1-x)}A^b_xA^a$ is an amidinium group ion, $A^b$ is an organic ammonium ion, and x is a real number of 0.3 to 0.05.

9. The method of claim 7, wherein in Chemical Formula 1, 2 or 3, X includes two different halogen ions.

10. The method of claim 1, wherein iv) the organic halide satisfies Chemical Formula 4 below:

$$AX \quad \text{(Chemical Formula 4)}$$

in Chemical Formula 4, A is a monovalent cation, A is an organic ammonium ion, an amidinium group ion or an organic ammonium ion and an amidinium group ion, and X is a halogen ion.

11. The method of claim 1, wherein v) the metal halide satisfies Chemical Formula 5, Chemical Formula 6 or Chemical Formula 7 below:

$$MX_2 \quad \text{(Chemical Formula 5)}$$

in Chemical Formula 5, M is a divalent metal ion, and X is a halogen ion, $$(M_{1-a}N_a)X_2 \quad \text{(Chemical Formula 6)}$$

in Chemical Formula 6, M is a divalent metal ion, N is at least one doping metal ion selected from a monovalent metal ion and a trivalent metal ion, a is a real number of 0<a≤0.1, and X is a halogen ion, $$(N^1_{1-b}N^2_b)X_2 \quad \text{(Chemical Formula 7)}$$

in Chemical Formula 7, $N^1$ is a monovalent metal ion, $N^2$ is a trivalent metal ion, b is a real number of 0.4≤b ≤0.6, and X is a halogen ion.

12. The method of claim 1, wherein the applying of heat and physical force in b) is performed by hot pressing.

13. The method of claim 12, wherein the hot pressing is performed at a temperature of 50 to 250° C. and a pressure of 1 to 100 MPa.

14. The method of claim 1, wherein the first structure further includes a first substrate and a first electrode positioned on the first substrate, and the second structure further includes a second substrate and a second electrode positioned on the second substrate.

15. The method of claim 14, wherein the first structure further includes an electron transport structure positioned on the first electrode.

16. The method of claim 14, wherein the second structure further includes a hole transport structure positioned on the second electrode.

17. The method of claim 14, wherein the first substrate and the second substrate are flexible substrates.

18. The method of claim 14, wherein at least one of the first substrate and the second substrate is a transparent substrate, and at least one of the first electrode and the second electrode is a transparent electrode.

19. The method of claim 1, wherein the device is a light emitting device, a memory device, a photovoltaic device, or a thermoelectric device.

20. A laminate for manufacturing a solar cell having a tandem structure comprising:
  a first structure including a first substrate which is a transparent substrate, a first electrode which is a transparent electrode positioned on the first substrate, a charge transport structure positioned on the first electrode, and a first surface layer containing at least one of materials i) to v) below, and
  a second structure including a second electrode, an inorganic light absorbing layer that is positioned on the second electrode and absorbs light of 800 nm or more to generate electrons and holes, a bonding layer positioned on the inorganic light absorbing layer, and a second surface layer containing, independently from the first surface layer, at least one of the materials i) to v) below,
  wherein the laminate is a laminate in which the first structure and the second structure are stacked so that the first surface layer of the first structure and the second surface layer of the second structure are in contact with each other,
  wherein the first surface layer and the second surface layer are each independently formed of a coating film on which a particulate of at least one of the materials i) to v) is coated, a porous film of at least one of the materials i) to v), a dense film of at least one of the materials i) to v), or a combination thereof of
  i) an inorganic/organic hybrid perovskite compound,
  ii) an organic halide,
  iii) a metal halide,
  iv) an inorganic/organic hybrid perovskite compound precursor, and
  v) a metal halide precursor.

* * * * *